US012696453B2

(12) United States Patent
Lee et al.

(10) Patent No.: US 12,696,453 B2
(45) Date of Patent: Jul. 28, 2026

(54) SEMICONDUCTOR MEMORY DEVICE HAVING HORIZONTALLY SPACED SELECTION STRUCTURES AND ELECTRONIC SYSTEM INCLUDING THE SAME

(71) Applicant: Samsung Electronics Co., Ltd., Suwon-si (KR)

(72) Inventors: Sangdon Lee, Hwaseong-si (KR); Joonsung Kim, Suwon-si (KR); Jiwon Kim, Hwaseong-si (KR); Jaeho Kim, Suwon-si (KR); Sukkang Sung, Seongnam-si (KR); Jong-Min Lee, Yongin-si (KR); Euntaek Jung, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1028 days.

(21) Appl. No.: 17/858,388

(22) Filed: Jul. 6, 2022

(65) Prior Publication Data

US 2023/0024655 A1      Jan. 26, 2023

(30) Foreign Application Priority Data

Jul. 19, 2021    (KR) ........................ 10-2021-0094229

(51) Int. Cl.
H10B 43/35 (2023.01)
H10B 41/27 (2023.01)
(Continued)

(52) U.S. Cl.
CPC ............. H10B 43/35 (2023.02); H10B 41/27 (2023.02); H10B 41/35 (2023.02); H10B 41/41 (2023.02); H10B 43/27 (2023.02); H10B 43/40 (2023.02)

(58) Field of Classification Search
CPC ........ H10B 43/27; H10B 43/35; H10B 41/35; H10B 43/20
See application file for complete search history.

(56) References Cited

U.S. PATENT DOCUMENTS 9,721,965 B2    8/2017  Yun
9,831,265 B2    11/2017  Kim et al.
(Continued)

FOREIGN PATENT DOCUMENTS

JP      2020/107673 A    7/2020
JP      2020/126888 A    8/2020
(Continued)

*Primary Examiner* — William B Partridge
*Assistant Examiner* — Mehek Ahmed
(74) *Attorney, Agent, or Firm* — Fish & Richardson P.C.

(57) ABSTRACT

Disclosed are semiconductor devices and electronic systems including the same. The semiconductor device may include a stack structure extending in a first direction and including gate electrodes vertically stacked on a substrate, selection structures horizontally spaced apart on the stack structure, an upper isolation structure between the selection structure and extending in the first direction on the stack structure, and vertical structures penetrating the stack structure and the selection structures. The vertical structures include first vertical structures arranged along the first direction and penetrating portions of the upper isolation structure. Each selection structure includes a selection gate electrode and a horizontal dielectric pattern that surrounds top, bottom, and sidewall surfaces of the selection gate electrode. Each selection gate electrode includes a line part extending in the first direction, and an electrode part vertically protruding from the line part and surrounding at least a portion of each first vertical structure.

20 Claims, 49 Drawing Sheets

(51) Int. Cl.
    *H10B 41/35*       (2023.01)
    *H10B 41/41*       (2023.01)
    *H10B 43/27*       (2023.01)
    *H10B 43/40*       (2023.01)

(56) References Cited

U.S. PATENT DOCUMENTS

| | | |
|---|---|---|
| 9,859,293 B2 | 1/2018 | Lee |
| 10,192,878 B1 | 1/2019 | Tsutsumi et al. |
| 10,236,300 B2 | 3/2019 | Zhang et al. |
| 10,290,650 B1 | 5/2019 | Iwai |
| 10,381,450 B1 | 8/2019 | Yada et al. |
| 10,403,639 B2 | 9/2019 | Orimoto et al. |
| 10,431,594 B2 | 10/2019 | Kim |
| 10,629,611 B2 | 4/2020 | Cui et al. |
| 10,741,576 B2 | 8/2020 | Nishikawa et al. |
| 10,749,042 B2 | 8/2020 | Kim et al. |
| 10,777,575 B1 | 9/2020 | Cui et al. |
| 10,930,670 B2 | 2/2021 | Shin et al. |
| 10,937,803 B2 | 3/2021 | Kashima et al. |
| 2019/0312050 A1 | 10/2019 | Lai et al. |
| 2020/0185403 A1 | 6/2020 | Nyui et al. |
| 2020/0212059 A1 | 7/2020 | Nishikawa |
| 2020/0251489 A1* | 8/2020 | Tsutsumi ............... H10B 41/35 |
| 2020/0286910 A1 | 9/2020 | Kashima |

FOREIGN PATENT DOCUMENTS

| | | |
|---|---|---|
| JP | 2020145218 A | 9/2020 |
| KR | 20160139119 A | 12/2016 |
| KR | 10-2019-0132834 A | 11/2019 |
| KR | 10-2019-0143691 A | 12/2019 |
| KR | 10-2179168 B1 | 11/2020 |

* cited by examiner

SEMICONDUCTOR MEMORY DEVICE HAVING HORIZONTALLY SPACED SELECTION STRUCTURES AND ELECTRONIC SYSTEM INCLUDING THE SAME

CROSS-REFERENCE TO RELATED APPLICATION

This U.S. nonprovisional application claims priority under 35 U.S.C § 119 to Korean Patent Application No. 10-2021-0094229 filed on Jul. 19, 2021 in the Korean Intellectual Property Office, the disclosure of which is hereby incorporated by reference in its entirety.

BACKGROUND

Inventive concepts relate to a semiconductor device and an electronic system including the same.

It may be necessary to have a semiconductor device capable of storing a large amount of data in an electronic system that may require data storage. Therefore, studies have been conducted to increase data storage capacity of the semiconductor device. For example, as an approach to increase data storage capacity of the semiconductor device, a semiconductor device including three-dimensionally arranged memory cells instead of two-dimensionally arranged memory cells has been suggested.

SUMMARY

Some embodiments of inventive concepts provide a semiconductor device with improved reliability and/or increased integration.

Some embodiments of inventive concepts provide an electronic system including the semiconductor device.

Aspects of embodiments inventive concepts are not limited to the mentioned above, and other aspects that have not been mentioned above will be clearly understood to those skilled in the art from the following description.

According to some embodiments of inventive concepts, a semiconductor device may include a stack structure extending in a first direction and including a plurality of gate electrodes vertically stacked on a substrate; a plurality of selection structures horizontally spaced apart from each other on the stack structure; an upper isolation structure extending in the first direction on the stack structure between the plurality of selection structures; and a plurality of vertical structures penetrating the stack structure and the plurality of selection structures. The plurality of vertical structures may include a plurality of first vertical structures penetrating portions of the upper isolation structure and arranged along the first direction. Each of the plurality of selection structures may include a selection gate electrode and a horizontal dielectric pattern. In each of the plurality of selection structures, the horizontal dielectric pattern may surround a top surface of the selection gate electrode, a bottom surface of the selection gate electrode, and a sidewall surface of the selection gate electrode. The selection gate electrode may include a line part and an electrode part. The line part may extend in the first direction. The electrode part may protrude vertically from the line part and may surround at least a portion of each of the plurality of first vertical structures.

According to some embodiments of inventive concepts, a semiconductor device may include a peripheral circuit structure that includes a plurality of peripheral circuits integrated on a semiconductor substrate; a semiconductor layer on the peripheral circuit structure; a stack structure extending in a first direction and including a plurality of gate electrodes vertically stacked on the semiconductor layer; a plurality of lower vertical structures that penetrate the stack structure; a plurality of selection structures on the stack structure and horizontally spaced apart from each other; an upper isolation structure extending in the first direction on the stack structure between the plurality of selection structures; and a plurality of upper vertical structures penetrating the plurality of selection structures and connecting with the plurality of lower vertical structures. The plurality of upper vertical structures may include a plurality of first upper vertical structures that may penetrate portions of the upper isolation structure and may be arranged along the first direction. Each of the plurality of selection structures may include a selection gate electrode and a horizontal dielectric pattern. In each of the plurality of selection structures, the horizontal dielectric pattern may surround a top surface of the selection gate electrode, a bottom surface of the selection gate electrode, and sidewall surfaces of the selection gate electrode. The horizontal dielectric pattern may include a first sidewall part and a second sidewall part. The first sidewall part may be between the upper isolation structure and the electrode part of the selection gate electrode. The second sidewall part may be between the upper isolation structure and the line part of the selection gate electrode. The selection gate electrode may include a line part and an electrode part. The line part may extend in the first direction. The electrode part may protrude vertically from the line part and may surround at least a portion of each of the plurality of first upper vertical structures.

According to some embodiments of inventive concepts, an electronic system may include a semiconductor device that includes a cell array and an input/output pad electrically connected to a peripheral circuit around the cell array, and a controller electrically connected through the input/output pad to the semiconductor device. The controller may be configured to control the semiconductor device. The cell array may include a stack structure extending in a first direction and may include a plurality of gate electrodes vertically stacked on a substrate, a plurality of selection structures horizontally spaced apart from each other on the stack structure, an upper isolation structure extending in the first direction on the stack structure between the plurality of selection structures, and a plurality of vertical structures penetrating the stack structure and the plurality of selection structures. The plurality of vertical structures may include a plurality of first vertical structures penetrating portions of the upper isolation structure. Each of the plurality of selection structures may include a selection gate electrode and a horizontal dielectric pattern. In each of the plurality of selection structures, the horizontal dielectric pattern may surround a top surface, a bottom surface, and a sidewall surface of the selection gate electrode. The selection gate electrode may include a line part and an electrode part. The line part may extend in the first direction. The electrode part may protrude vertically from the line part and may surround at least a portion of each of the plurality of first vertical structures.

Details of other example embodiments are included in the description and drawings.

BRIEF DESCRIPTION OF THE DRAWINGS

FIGS. 3 and 4 illustrate simplified cross-sectional views showing a semiconductor package according to some embodiments of inventive concepts.

DETAILED DESCRIPTION OF EMBODIMENTS

The following will now describe some embodiments of inventive concepts in conjunction with the accompanying drawings.

Figure 1:
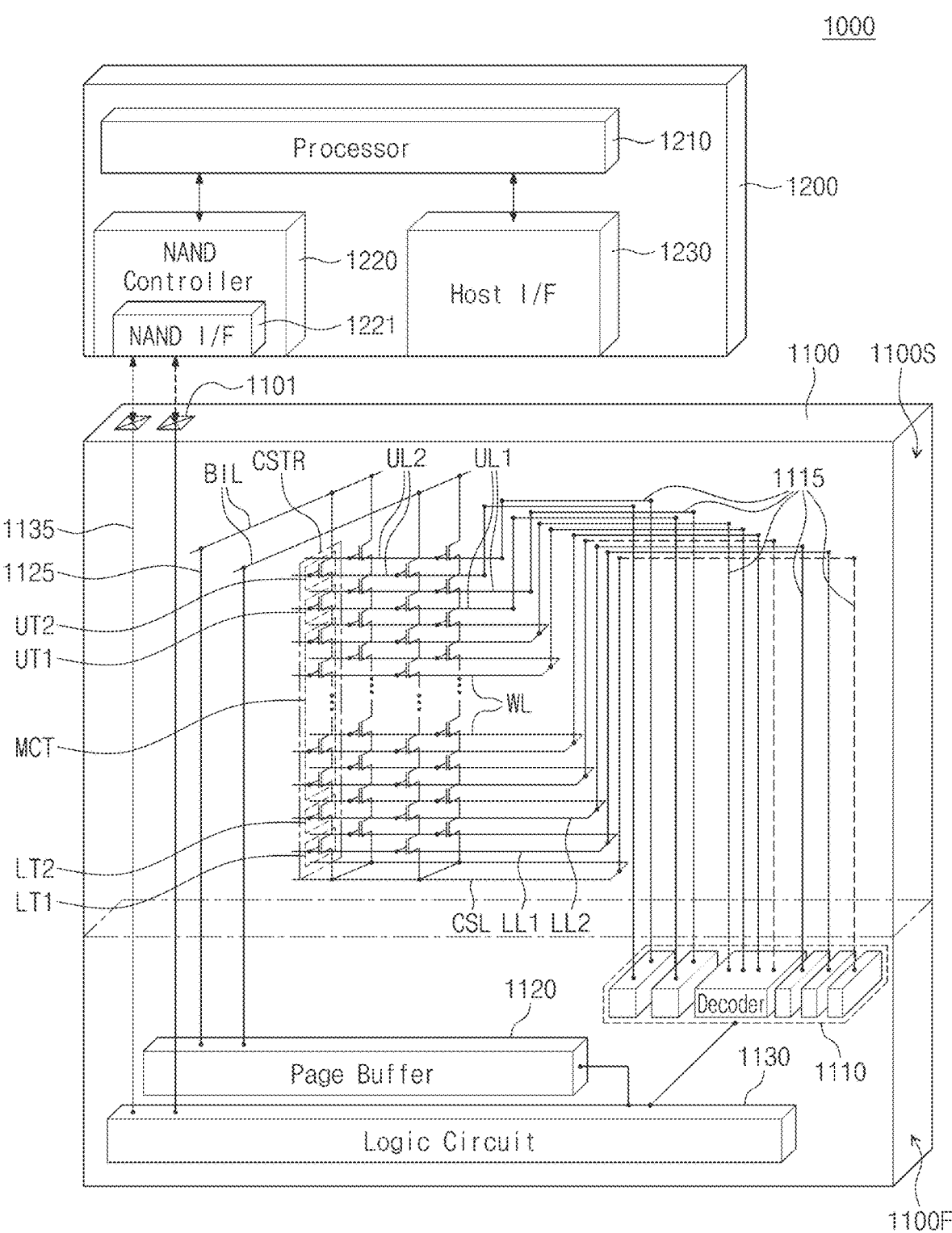
FIG. 1 illustrates a simplified schematic diagram showing an electronic system that includes a semiconductor device according to some embodiments of inventive concepts.

FIG. 1 illustrates a simplified schematic diagram showing an electronic system that includes a semiconductor device according to some embodiments of inventive concepts.

Referring to FIG. 1, an electronic system 1000 according to some embodiments of inventive concepts may include a semiconductor device 1100 and a controller 1200 electrically connected to the semiconductor device 1100. The electronic system 1000 may be a storage device that includes a single or a plurality of semiconductor devices 1100, or may be an electronic device that includes the storage device. For example, the electronic system 1000 may be a solid state drive (SSD) device, a universal serial bus (USB), a computing system, a medical apparatus, or a communication apparatus, each of which includes a single or a plurality of semiconductor devices 1100.

The semiconductor device 1100 may be a nonvolatile memory device, such as a NAND Flash memory device. The semiconductor device 1100 may include a first structure 1100F and a second structure 1100S on the first structure 1100F. In some embodiments, the first structure 1100F may be disposed on a side of the second structure 1100S.

The first structure 1100F may be a peripheral circuit structure that includes a decoder circuit 1110, a page buffer 1120, and a logic circuit 1130. The second structure 1100S may be a memory cell structure including bit lines BIL, a common source line CSL, word lines WL, first and second gate upper lines UL1 and UL2, first and second gate lower lines LL1 and LL2, and memory cell strings CSTR between the bit line BIL and the common source line CSL.

For the second structure 1100S, each of the memory cell strings CSTR may include lower transistors LT1 and LT2 adjacent to the common source line CSL, upper transistors UT1 and UT2 adjacent to the bit line BIL, and a plurality of memory cell transistors MCT between the lower transistors LT1 and LT2 and the upper transistors UT1 and UT2. The number of the lower transistors LT1 and LT2 and of the upper transistors UT1 and UT2 may be variously changed in accordance with embodiments.

In some embodiments, the upper transistors UT1 and UT2 may include a string selection transistor, and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In some embodiments, the lower transistors LT1 and LT2 may include a lower erase control transistor LT1 and a ground selection transistor LT2 that are connected in series. The upper transistors UT1 and UT2 may include a string selection transistor UT1 and an upper erase control transistor UT2 that are connected in series. One or both of the lower and upper erase control transistors LT1 and UT1 may be employed to perform an erase operation in which a gate induced drain leakage (GIDL) phenomenon is used to erase data stored in the memory cell transistors MCT.

The common source line CSL, the first and second gate lower lines LL1 and LL2, the word lines WL, and the first and second gate upper lines UL1 and UL2 may be electrically connected to the decoder circuit 1110 through first connection lines 1115 that extend from the first structure 1100F toward the second structure 1100S. The bit lines BIL may be electrically connected to the page buffer 1120 through second connection lines 1125 that extend from the first structure 1100F toward the second structure 1100S.

For the first structure 1100F, the decoder circuit 1110 and the page buffer 1120 may perform a control operation to at least one selection memory cell transistor among the plurality of memory cell transistors MCT. The logic circuit 1130 may control the decoder circuit 1110 and the page buffer 1120. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first structure 1100F toward the second structure 1100S.

Although not shown, the first structure 1100F may include a voltage generator. The voltage generator may produce program voltages, read voltages, pass voltages, and verification voltages that are required for operating the memory cell strings CSTR. The program voltage may be relatively higher (e.g., about 20 V to about 40 V) than the read voltage, the pass voltage, and the verification voltage.

In some embodiments, the first structure 1100F may include high-voltage transistors and low-voltage transistors. The decoder circuit 1110 may include pass transistors connected to the word lines WL of the memory cell strings CSTR. The pass transistors may include high-voltage transistors capable of withstanding high voltages such as program voltages applied to the word lines WL in a program operation. The page buffer 1120 may also include high-voltage transistors capable of withstanding high voltages.

The controller 1200 may include a processor 1210, a NAND controller 1220, and a host interface 1230. In some embodiments, the electronic system 1000 may include a plurality of semiconductor devices 1100, and in this case, the controller 1200 may control the plurality of semiconductor devices 1100.

The processor 1210 may control an overall operation of the electronic system 1000 that includes the controller 1200. The processor 1210 may operate based on desired or alternatively predetermined firmware, and may control the NAND controller 1220 to access the semiconductor device 1100. The NAND controller 1220 may include a NAND interface 1221 that processes communication with the semiconductor device 1100. The NAND interface 1221 may be used to transfer therethrough a control command to control the semiconductor device 1100, data which is intended to be written on the memory cell transistors MCT of the semiconductor device 1100, and/or data which is intended to be read from the memory cell transistors MCT of the semiconductor device 1100. The host interface 1230 may provide the electronic system 1000 with communication with an external host. When a control command is received through the host interface 1230 from an external host, the semiconductor device 1100 may be controlled by the processor 1210 in response to the control command.

Figure 2:
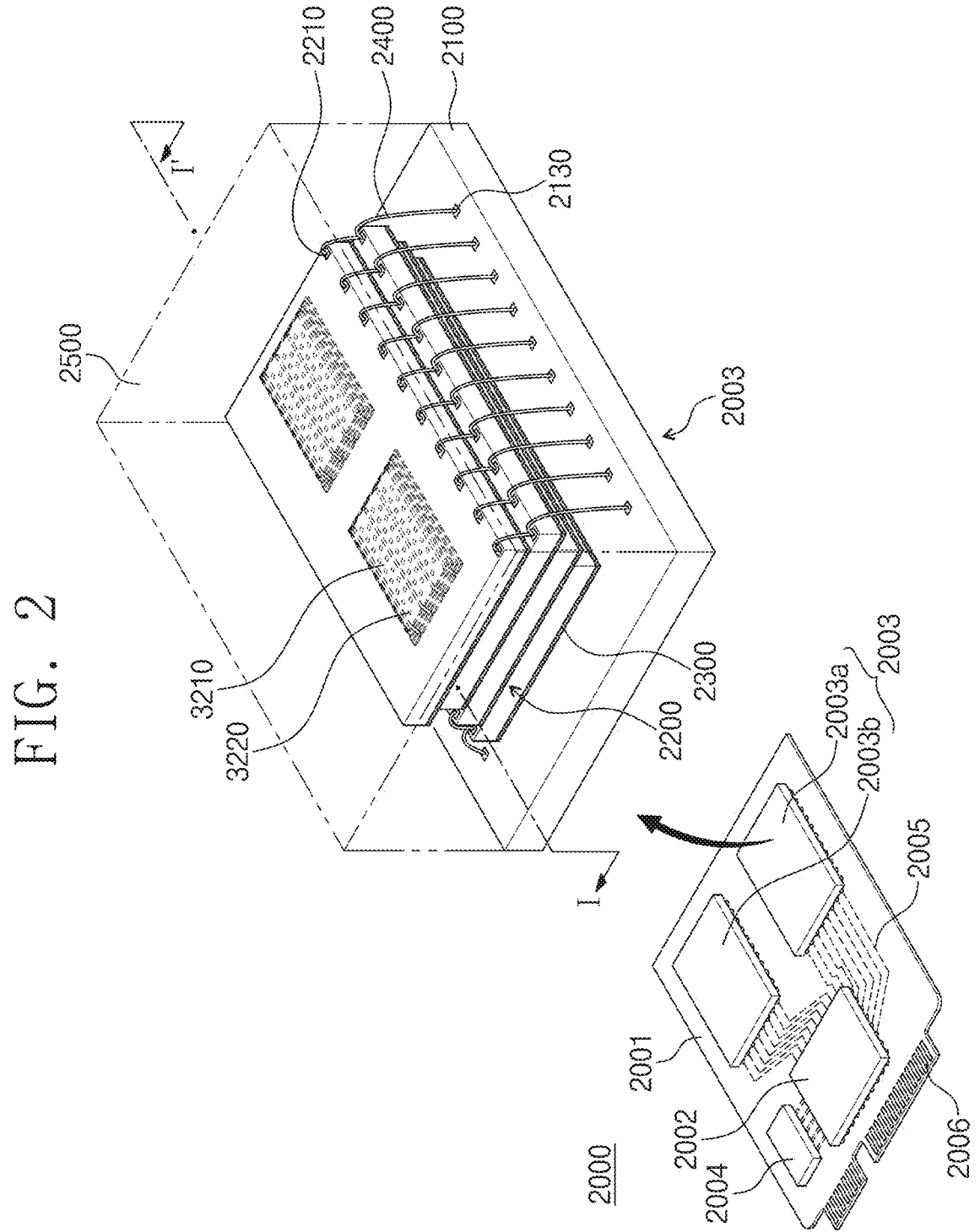
FIG. 2 illustrates a simplified perspective view showing an electronic system that includes a semiconductor device according to some embodiments of inventive concepts.

FIG. 2 illustrates a simplified perspective view showing an electronic system that includes a semiconductor device according to some embodiments of inventive concepts.

Referring to FIG. 2, an electronic system 2000 according to some embodiments of inventive concepts may include a main board 2001, and may also include a controller 2002, at least one semiconductor package 2003, and a dynamic random access memory (DRAM) 2004 that are mounted on the main board 2001. The semiconductor package 2003 and the DRAM 2004 may be connected to the controller 2002 through wiring patterns 2005 formed on the main board 2001.

The main board 2001 may include a connector 2006 including a plurality of pins that are provided to have connection with an external host. The number and arrangement of the plurality of pins on the connector 2006 may be changed based on a communication interface between the electronic system 2000 and the external host. In some embodiments, the electronic system 2000 may communicate with the external host through one or more interfaces, for example, universal serial bus (USB), peripheral component interconnect express (PIC-Express), serial advanced technology attachment (SATA), and/or M-PHY for universal flash storage (UFS). In some embodiments, the electronic system 2000 may operate with power supplied through the connector 2006 from the external host. The electronic system 2000 may further include a power management integrated circuit (PMIC) by which the power supplied from the external host is distributed to the controller 2002 and the semiconductor package 2003.

The controller 2002 may write data to the semiconductor package 2003, may read data from the semiconductor package 2003, or may increase an operating speed of the electronic system 2000.

The DRAM 2004 may be a buffer memory that reduces a difference in speed between an external host and the semiconductor package 2003 that serves as a data storage space. The DRAM 2004 included in the electronic system 2000 may operate as a kind of cache memory, and may provide a space for temporary data storage in a control operation of the semiconductor package 2003. When the DRAM 2004 is included in the electronic system 2000, the controller 2002 may include not only a NAND controller for controlling the semiconductor package 2003, but a DRAM controller for controlling the DRAM 2004.

The semiconductor package 2003 may include first and second semiconductor packages 2003a and 2003b that are spaced apart from each other. Each of the first and second semiconductor packages 2003a and 2003b may include a plurality of semiconductor chips 2200. Each of the first and second semiconductor packages 2003a and 2003b may include a package substrate 2100, semiconductor chips 2200 on the package substrate 2100, adhesion layers 2300 disposed on bottom surfaces of the semiconductor chips 2200, connection structures 2400 that electrically connect the semiconductor chips 2200 to the package substrate 2100, and a molding layer 2500 that lies on the package substrate 2100 and covers the semiconductor chips 2200 and the connection structures 2400.

The package substrate 2100 may be an integrated circuit board including upper pads 2130. Each of the semiconductor chips 2200 may include one or more input/output pads 2210. The input/output pad 2210 may correspond to the input/output pad 1101 of FIG. 1. Each of the semiconductor chips 2200 may include stack structures 3210 and vertical structures 3220. Each of the semiconductor chips 2200 may include a semiconductor device according to some embodiments of inventive concepts which will be discussed below.

In some embodiments, the connection structures 2400 may be bonding wires that electrically connect the input/output pads 2210 to the upper pads 2130. Therefore, on each of the first and second semiconductor packages 2003a and 2003b, the semiconductor chips 2200 may be electrically connected to each other in a wire bonding manner, and may be electrically connected to the upper pads 2130 of the package substrate 2100. In some embodiments, on each of the first and second semiconductor packages 2003a and 2003b, the semiconductor chips 2200 may be electrically connected to each other through connection structures such as through silicon vias (TSV) instead of the connection structures 2400 shaped like bonding wires.

In some embodiments, the controller 2002 and the semiconductor chips 2200 may be included in a single package. For example, the controller 2002 and the semiconductor chips 2200 may be mounted on an interposer substrate other than the main board 2001, and may be connected to each other through wiring lines formed on the interposer substrate.

Figure 3:
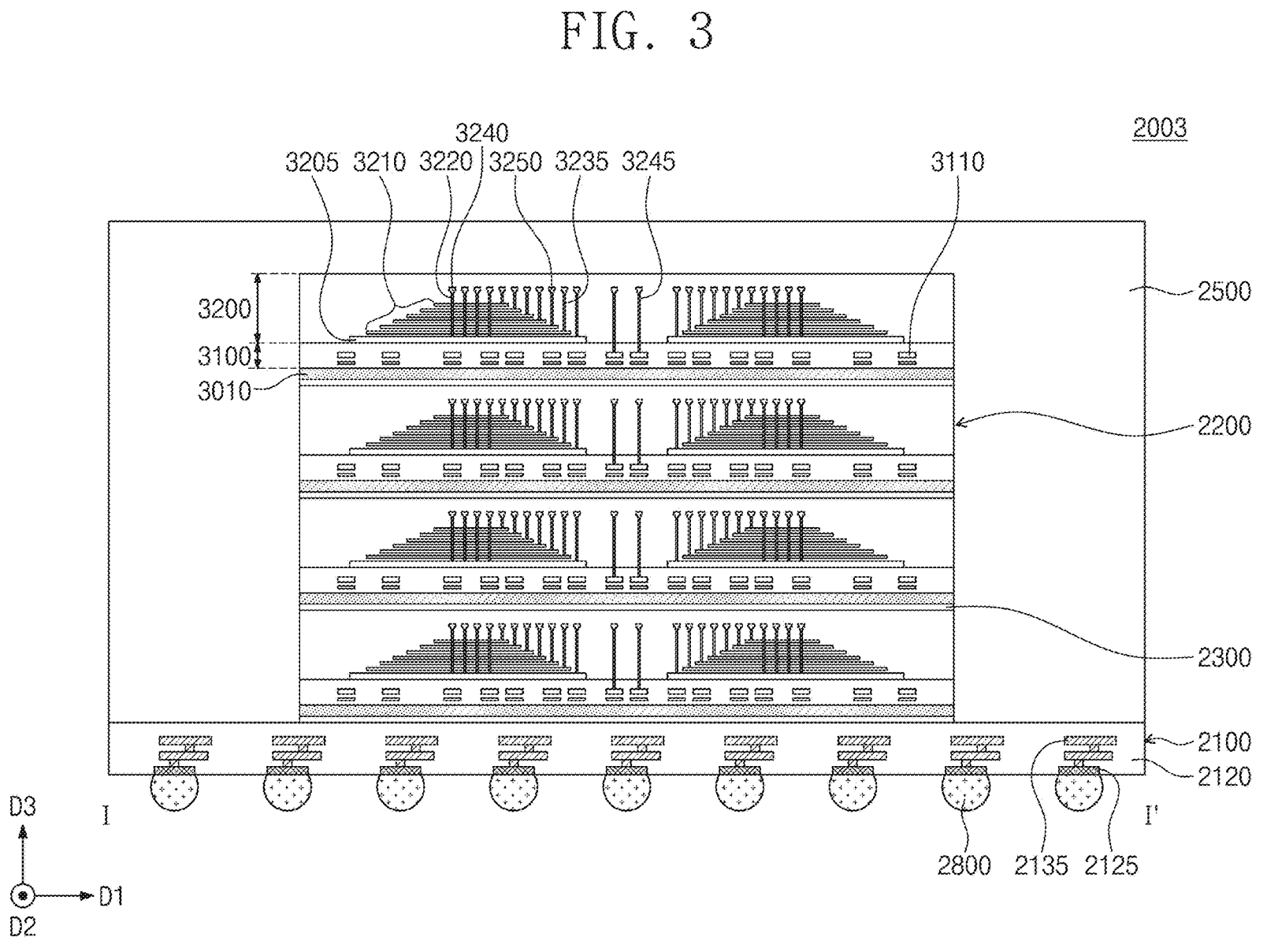
Figure 4:
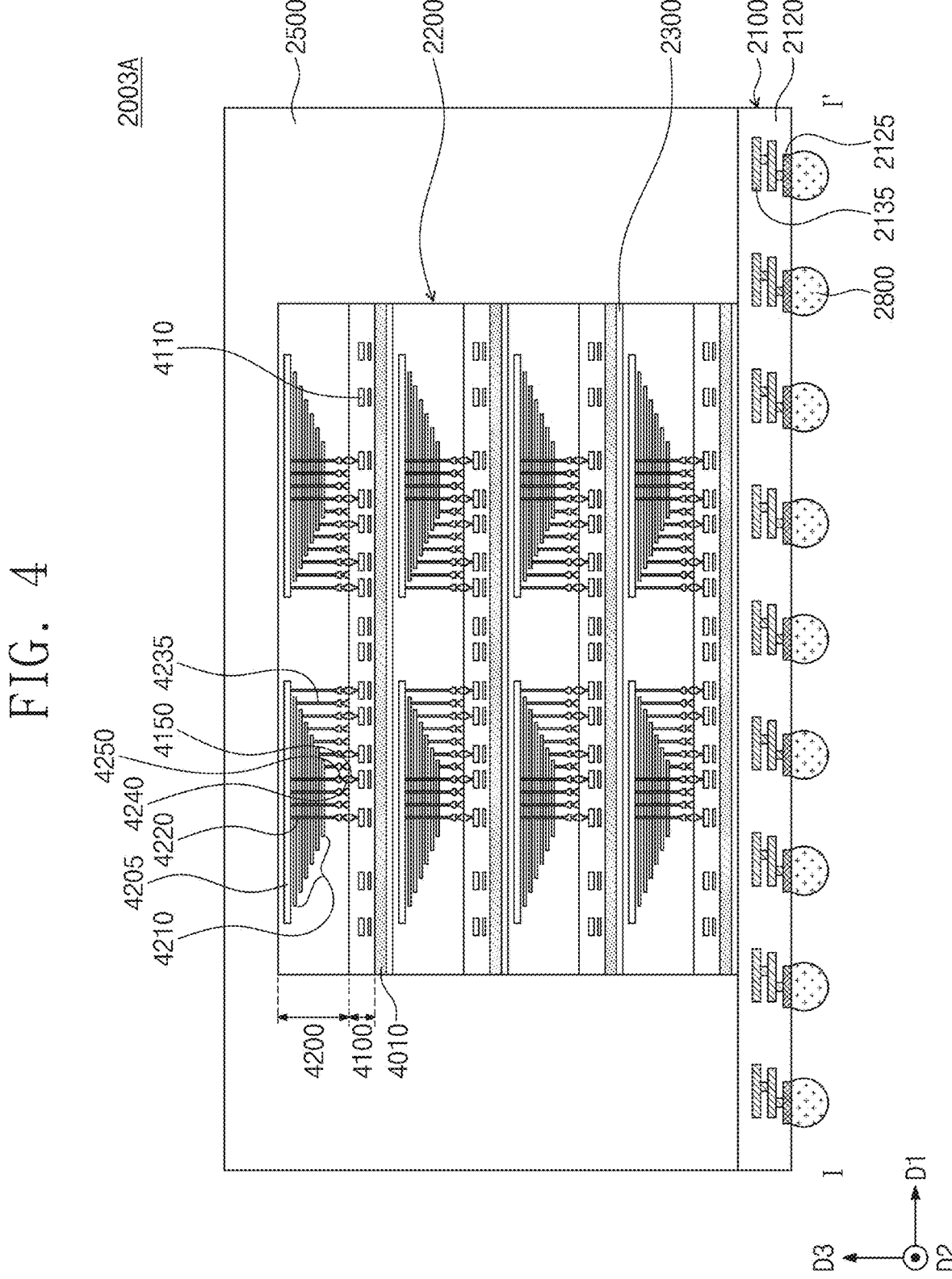

FIGS. 3 and 4 illustrate simplified cross-sectional views showing a semiconductor package according to some embodiments of inventive concepts. FIGS. 3 and 4 each depicts an example of the semiconductor package illustrated in FIG. 2, conceptually showing a section taken along line I-I' of the semiconductor package illustrated in FIG. 2.

Referring to FIG. 3, a printed circuit board may be used as the package substrate 2100 of the semiconductor package 2003. The package substrate 2100 may include a package substrate body 2120, upper pads (see 2130 of FIG. 2) disposed on a top surface of the package substrate body 2120, lower pads 2125 disposed or exposed on a bottom surface of the package substrate body 2120, and internal lines 2135 that lie in the package substrate body 2120 and electrically connect the upper pads 2130 to the lower pads 2125. The upper pads 2130 may be electrically connected to the connection structures 2400. The lower pads 2125 may be connected through conductive connectors 2800 to the wiring patterns 2005 of the main board 2001 in the electronic system 2000, as shown in FIG. 2.

Each of the semiconductor chips 2200 may include a semiconductor substrate 3010, and may also include a first structure 3100 and a second structure 3200 that are sequentially stacked on the semiconductor substrate 3010. The first structure 3100 may include a peripheral circuit region including peripheral wiring lines 3110. The second structure 3200 may include a source structure 3205, a stack structure 3210 on the source structure 3205, vertical structures 3220 and separation structures 3230 that penetrate the stack structure 3210, bit lines 3240 electrically connected to the vertical structures 3220, and cell contact plugs 3235 electrically connected to the word lines (see WL of FIG. 1) of the stack structure 3210. The cell contact plugs 3235 may be connected to wiring lines 3250. Each of the first structure 3100, the second structure 3200, and the semiconductor chips 2200 may further include separation structures which will be discussed below.

Each of the semiconductor chips 2200 may include one or more through lines 3245 that electrically connect with the peripheral wiring lines 3110 of the first structure 3100 and extend into the second structure 3200. The through line 3245 may be disposed outside the stack structure 3210 and may further be disposed to penetrate the stack structure 3210. Each of the semiconductor chips 2200 may further include one or more input/output pads (see 2210 of FIG. 2) electrically connected to the peripheral wiring lines 3110 of the first structure 3100.

Referring to FIG. 4, a semiconductor package 2003A may be configured such that each of semiconductor chips 2200a may include a semiconductor substrate 4010, a first structure 4100 on the semiconductor substrate 4010, and a second structure 4200 disposed on and wafer-bonded to the first structure 4100.

The first structure 4100 may include a peripheral circuit region including peripheral wiring lines 4110 and first bonding structures 4150. The second structure 4200 may include a source structure 4205, a stack structure 4210 between the source structure 4205 and the first structure 4100, vertical structures 4220 and a separation structure 4230 that penetrate the stack structure 4210, and second bonding structures 4250 electrically connected to the vertical structures 4220 and word lines (see WL of FIG. 1) of the stack structure 4210. For example, the second bonding structures 4250 may be electrically connected to the vertical structures 4220 through bit lines 4240 electrically connected to the vertical structures 4220, and may also be electrically connected to the word lines (see WL of FIG. 1) through cell contact plugs 4235 electrically connected to the word lines (see WL of FIG. 1). The first bonding structures 4150 of the first structure 4100 and the second bonding structures 4250 of the second structure 4200 may be coupled to each other while being in contact with each other. The first and second bonding structures 4150 and 4250 may have their bonding portions formed of, for example, copper (Cu).

Each of the first structure 4100, the second structure 4200, and the semiconductor chip 2200a may further include a source structure which will be discussed below. Each of the semiconductor chips 2200a may further include one or more input/output pads (see 2210 of FIG. 2) electrically connected to the peripheral wiring lines 4110.

The semiconductor chips 2200 of FIG. 3 may be electrically connected to each other through the connection structures (see 2400 of FIG. 2) shaped like bonding wires, and this may also be applicable to the semiconductor chips 2200a of FIG. 4. In some embodiments, semiconductor chips, such as the semiconductor chips 2200 of FIG. 3 or the semiconductor chips 2200a of FIG. 4, in a single semiconductor package may be electrically connected to each other through one or more connection structures that include through electrodes such as TSV (through silicon via).

The first structure 3100 of FIG. 3 and the first structure 4100 of FIG. 4 may correspond to a peripheral circuit structure which will be discussed below, and the second structure 3200 of FIG. 3 and the second structure 4200 of FIG. 4 may correspond to a cell array structure which will be discussed below.

Figure 5:
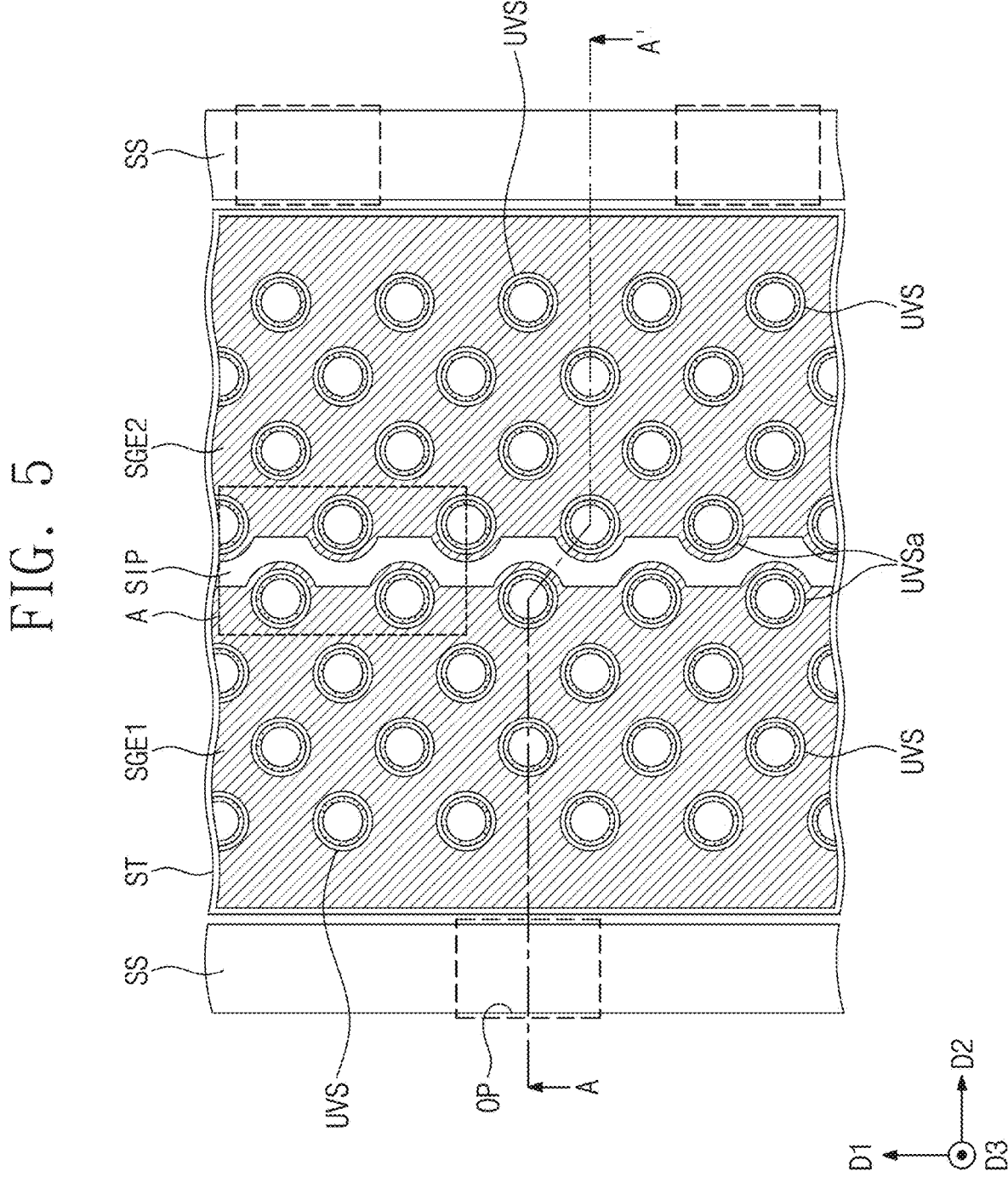
FIG. 5 illustrates a plan view showing a semiconductor device according to some embodiments of inventive concepts.
Figure 6:
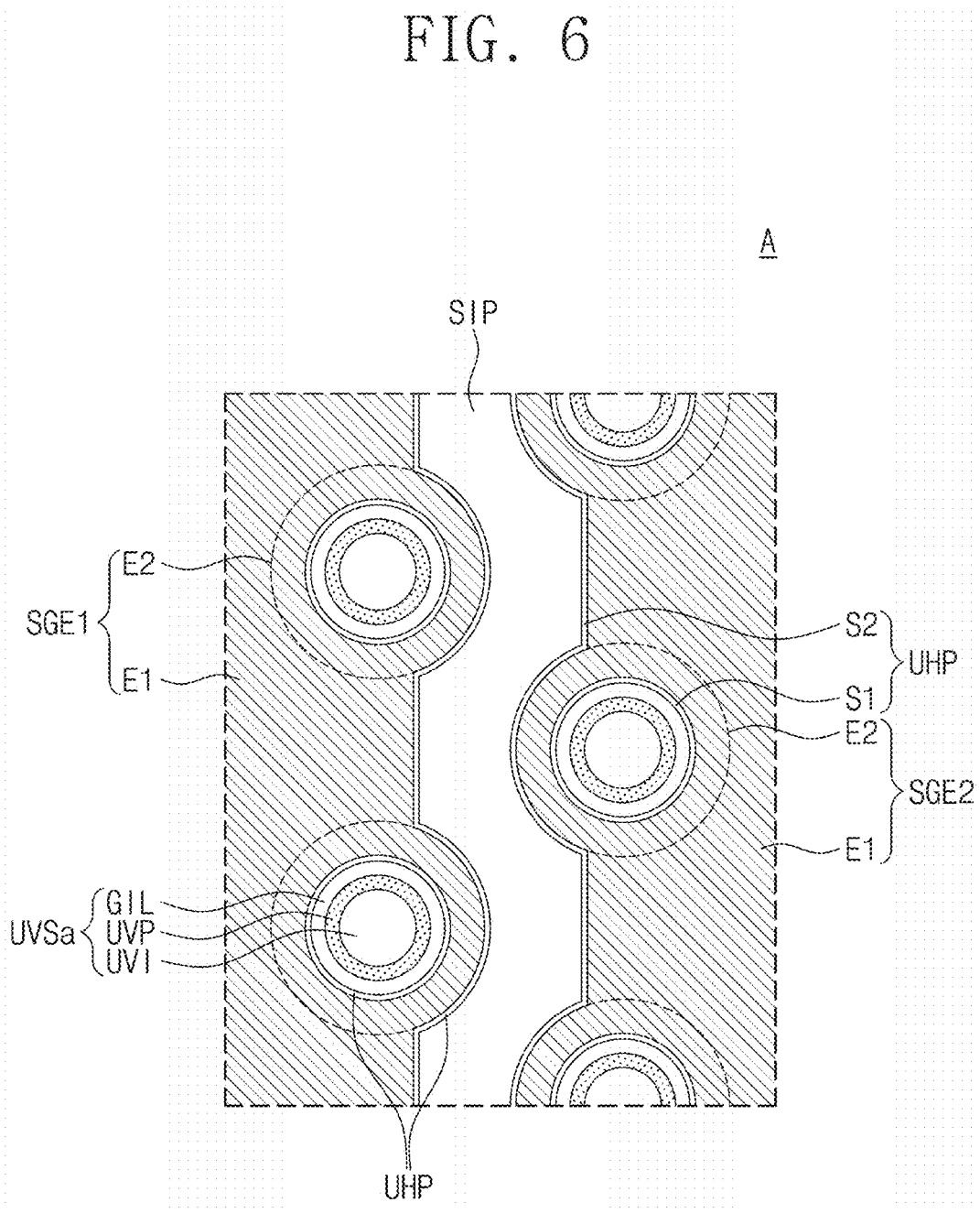
FIG. 6 illustrates an enlarged view showing section A of FIG. 5.
Figure 7:
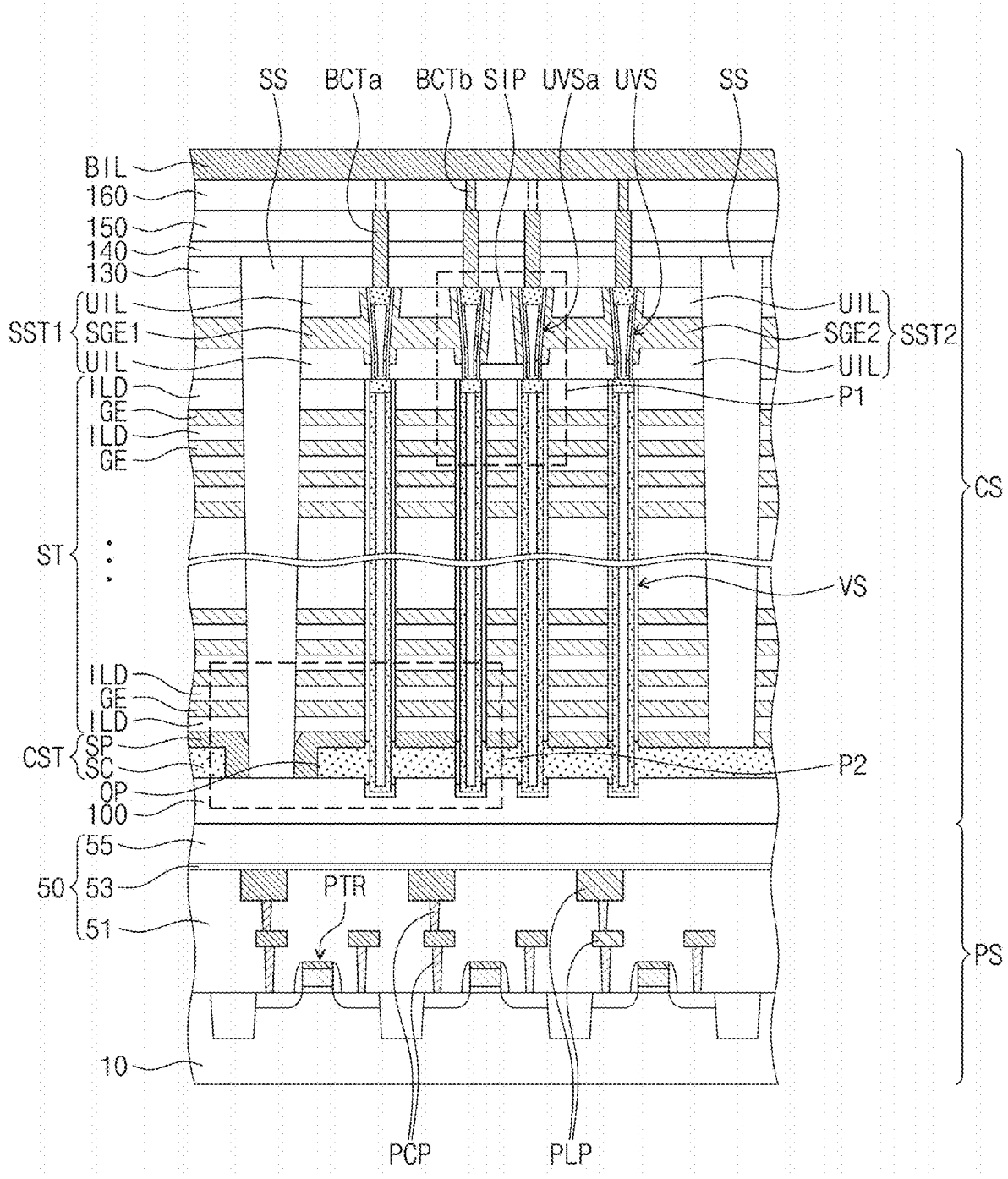
FIG. 7 illustrates a cross-sectional view taken along line A-A' of FIG. 5, showing a semiconductor device according to some embodiments of inventive concepts.

FIG. 5 illustrates a plan view showing a semiconductor device according to some embodiments of inventive concepts. FIG. 6 illustrates an enlarged view showing section A of FIG. 5. FIG. 7 illustrates a cross-sectional view taken along line A-A' of FIG. 5. FIGS. 8A to 8E illustrate enlarged views showing section P1 of FIG. 7. FIG. 9 illustrates an enlarged view showing section P2 of FIG. 7.

Referring to FIGS. 5 and 7, a semiconductor device according to some embodiments of inventive concepts may include a peripheral circuit structure PS and a cell array structure CS on the peripheral circuit structure PS.

The peripheral circuit structure PS may include peripheral circuits PTR integrated on an entire surface of a semiconductor substrate 10 and a lower interlayer dielectric layer 50 that covers the peripheral circuits PTR. The semiconductor substrate 10 may be a silicon substrate.

The peripheral circuits PTR may be row and column decoders, a page buffer, and a control circuit. For example, the peripheral circuits PTR may include NMOS and PMOS transistors. Peripheral circuit lines PLP may be electrically connected to the peripheral circuits PTR through peripheral contact plugs PCP.

The lower interlayer dielectric layer 50 may be provided on the entire surface of the semiconductor substrate 10. On the semiconductor substrate 10, the lower interlayer dielectric layer 50 may cover the peripheral circuits PTR, the peripheral contact plugs PCP, and the peripheral circuit lines PLP. The peripheral contact plugs PCP and the peripheral circuit lines PLP may be electrically connected to the peripheral circuits PTR.

The lower interlayer dielectric layer 50 may include a plurality of stacked dielectric layers. For example, the lower interlayer dielectric layer 50 may include one or more of a silicon oxide layer, a silicon nitride layer, a silicon oxynitride layer, and a low-k dielectric layer. For example, the lower interlayer dielectric layer 50 may include a first lower dielectric layer 51, a second lower dielectric layer 55, and an etch stop layer 53 between the first and second lower dielectric layers 51 and 55. The etch stop layer 53 may include a dielectric material different from that of the first and second lower dielectric layers 51 and 55, and may cover top surfaces of uppermost peripheral circuit lines PLP.

The cell array structure CS may be disposed on the lower interlayer dielectric layer 50. The cell array structure CS may include a semiconductor layer 100, a stack structure ST, lower vertical structures VS, selection structures SST1 and SST2, upper vertical structures UVS, and bit lines BIL. In addition, the cell array structure CS may further include a source structure CST between the semiconductor layer 100 and the stack structure ST. According to some embodiments, the memory cell strings (see CSTR of FIG. 1) depicted in FIG. 1 may be integrated on the semiconductor layer 100.

The semiconductor layer 100 may be located on a top surface of the lower interlayer dielectric layer 50. The semiconductor layer 100 may be formed of a semiconductor material, a dielectric material, or a conductive material. The semiconductor layer 100 may include one or more of a semiconductor doped with impurities having a first conductivity type (e.g., n-type) and an intrinsic semiconductor doped with no impurities.

The source structure CST may include a source semiconductor pattern SC and a support semiconductor pattern SP on the source semiconductor pattern SC. The source structure CST may be parallel to a top surface of the semiconductor layer 100 and may extend in a first direction D1 along the stack structure ST.

The source semiconductor pattern SC may be disposed between the semiconductor layer 100 and the stack structures ST. The source semiconductor pattern SC may have openings OP. The openings OP may be spaced apart from each other and may have a circular or bar shape. The source semiconductor pattern SC may be formed of a semiconductor material doped with impurities (e.g., phosphorus (P) or arsenic (As)) having the first conductivity type. For example, the source semiconductor pattern SC may be formed of a polysilicon layer doped with n-type impurities.

The support semiconductor pattern SP may cover a top surface of the source semiconductor pattern SC and may contact the semiconductor layer 100 in the openings OP of the source semiconductor pattern SC. The support semiconductor pattern SP may include one or more of a semiconductor doped with impurities having the first conductivity type (e.g., n-type) and an intrinsic semiconductor doped with no impurities. A concentration of n-type impurities may be less in the support semiconductor pattern SP than in the source semiconductor pattern SC.

The stack structure ST may be disposed on the source structure CST. The stack structure ST may extend along the first direction D1. The stack structures ST may include gate electrodes GE and dielectric layers ILD that are alternately stacked along a third direction D3 (or a vertical direction) perpendicular to the first and second directions D1 and D2. The gate electrodes GE may include, for example, at least one selected from doped semiconductor (e.g., doped silicon), metal (e.g., tungsten, copper, or aluminum), conductive metal nitride (e.g., titanium nitride or tantalum nitride), and transition metal (e.g., titanium or tantalum). The dielectric layers ILD may include one or more of a silicon oxide layer and a low-k dielectric layer. According to some embodiments, the semiconductor device may be a vertical NAND Flash memory device, and in this case, the gate electrodes GE of the stack structure ST may be used as the gate lower lines LL1 and LL2 and the word lines WL that are discussed with reference to FIG. 1.

On the semiconductor layer 100, the lower vertical structures VS may penetrate the stack structure ST and the source structure CST. When viewed in plan, the lower vertical structures VS may be arranged in a zigzag shape along the first direction D1.

According to some embodiments, the stack structure ST may include the lower vertical structures VS that constitute an even number of columns (e.g., eight columns, twelve columns, etc.). For example, the lower vertical structures VS may be two-dimensionally arranged along the first direction D1 and the second direction D2, and the first to eighth columns may be disposed spaced apart from each other along the second direction D2. The lower vertical structures VS that constitute the first to eighth columns may be arranged along the first direction D1. The lower vertical structures VS in neighboring columns may be spaced apart from each other in a diagonal direction.

Figure 8A:
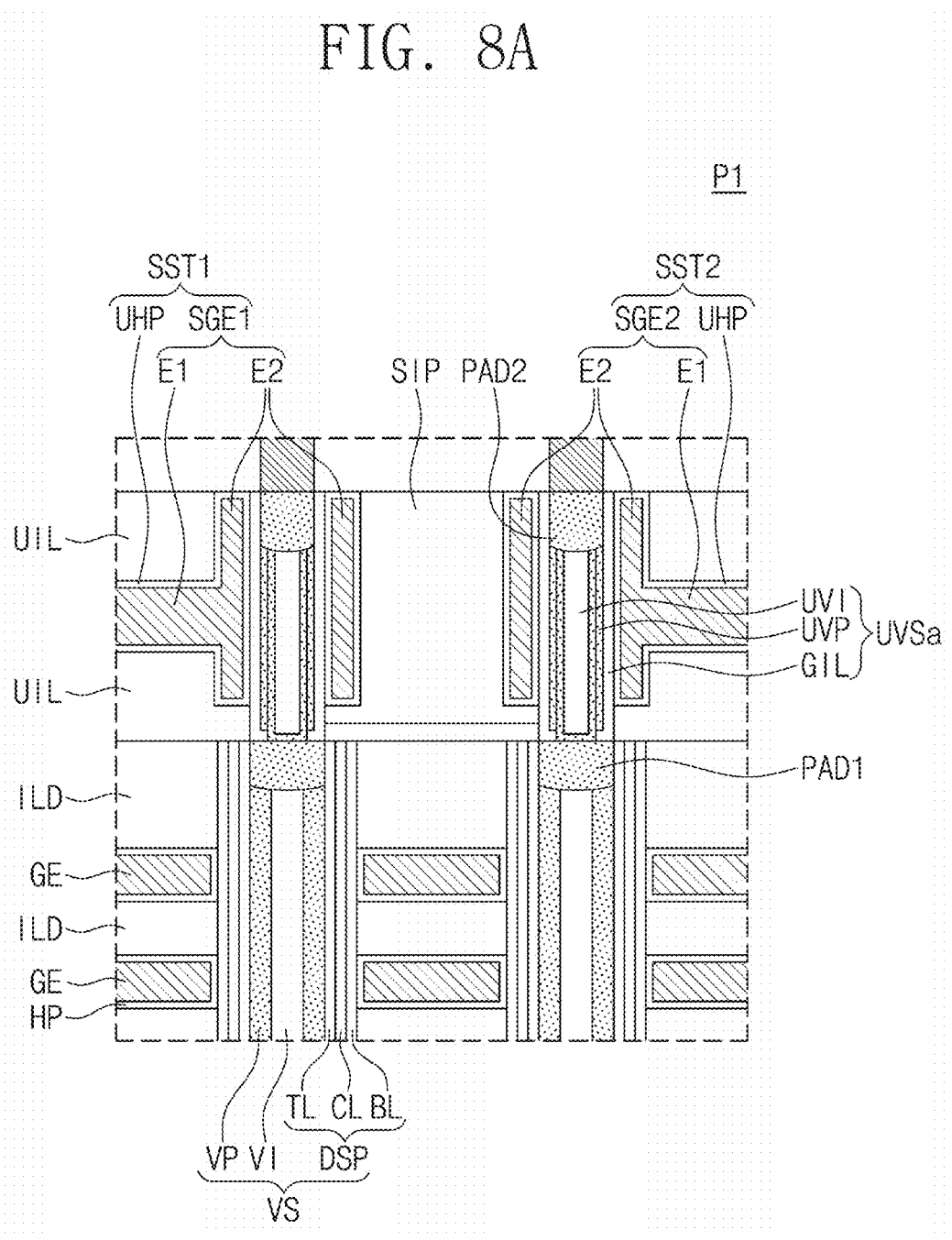
FIGS. 8A to 8E illustrate enlarged views of section P1 depicted in FIG. 7, showing a semiconductor device according to some embodiments of inventive concepts.
Figure 9:
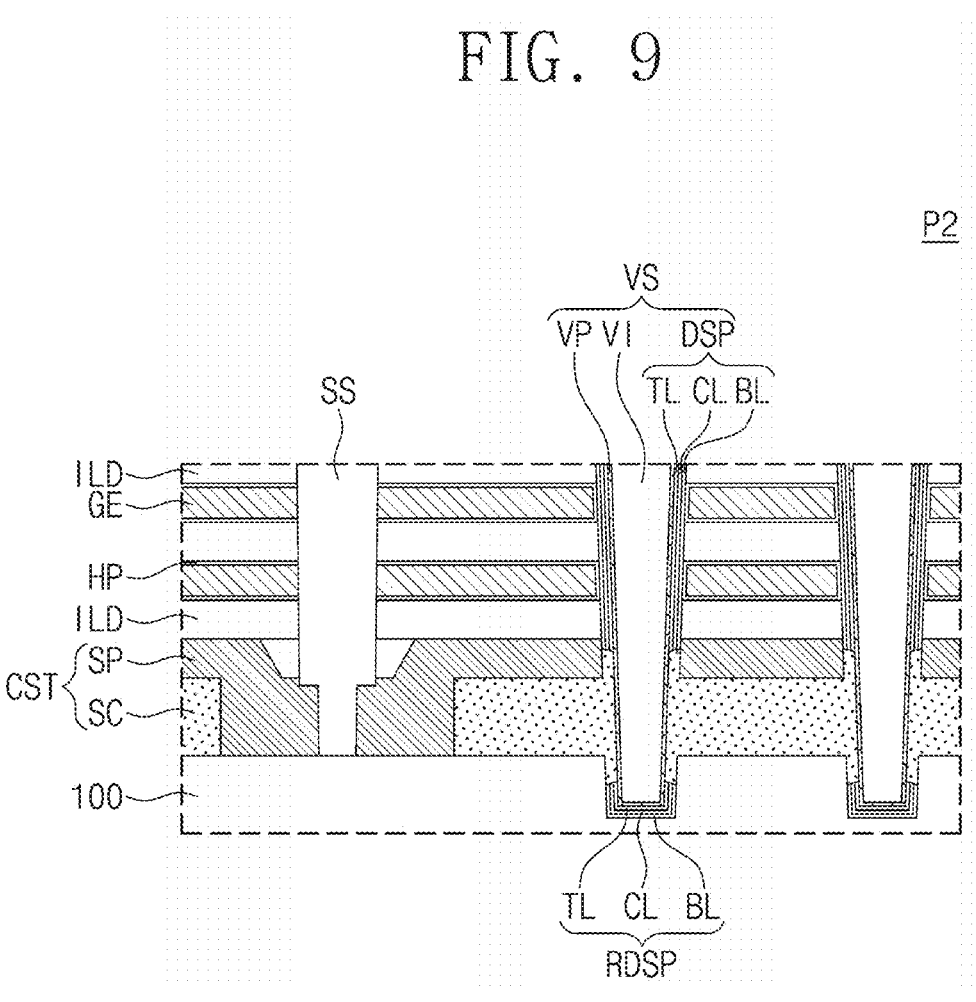
FIG. 9 illustrates an enlarged view showing section P2 of FIG. 7.

As shown in FIGS. 8A and 9, each of the lower vertical structures VS may include a lower channel pattern VP, a data storage pattern DSP, and a buried dielectric pattern VI.

The lower channel pattern VP may include a semiconductor material, such as silicon (Si), germanium (Ge), or a mixture thereof. The lower channel pattern VP including the semiconductor material may be used as channels of the memory cell transistors MCT and of the lower transistors LT1 and LT2, all of which transistors are discussed with reference to FIG. 1.

The lower channel pattern VP may have a macaroni shape or a pipe shape whose bottom end is closed. The buried dielectric pattern VI may fill an inside of the lower channel pattern VP shaped as discussed above. The lower channel patterns VP may have first conductive pads PAD1 formed on top ends thereof. The first conductive pads PAD1 may be impurity-doped regions or may be formed of a conductive material.

Referring to FIG. 9, the lower channel pattern VP of each lower vertical structure VS may have a sidewall a portion of which is in contact with the source semiconductor pattern SC.

The data storage pattern DSP may extend in the third direction D3 and may surround the sidewall of each lower channel pattern VP. The data storage pattern DSP may have a macaroni shape or a pipe shape whose top and bottom ends are opened. The data storage pattern DSP may have a bottom surface located at a level between those of top and bottom surfaces of the support semiconductor pattern SP. In addition, the semiconductor layer 100 may be provided therein with a residual data storage pattern RDSP vertically spaced apart from the data storage pattern DSP.

As shown in FIGS. 8A and 9, the data storage pattern DSP may include a tunnel dielectric layer TL, a charge storage layer CL, and a blocking dielectric layer BL, which layers TL, CL, and BL constitute a data storage layer of a NAND Flash memory device. For example, the charge storage layer CL may be a trap dielectric layer, a floating gate electrode, or a dielectric layer including conductive nano-dots. The tunnel dielectric layer TL and the blocking dielectric layer BL may include one of materials having a bandgap greater than that of the charge storage layer CL. The residual data storage pattern RDSP may have a thin-film structure the same as that of the data storage pattern DSP.

In addition, referring to FIG. 8A, a first horizontal dielectric pattern HP may conformally cover sidewalls, top surfaces, and bottom surfaces of the gate electrodes GE adjacent to the lower vertical structures VS. The first horizontal dielectric pattern HP may include a high-k dielectric layer, such as an aluminum oxide layer or a hafnium oxide layer.

According to some embodiments, on the stack structure ST, the selection structures SST1 and SST2 may be disposed spaced apart from each other in the second direction D2 parallel to a top surface of the semiconductor substrate 10. The selection structures SST1 and SST2 may extend in the first direction D1 along the stack structure ST.

A first selection structure SST1 may include upper dielectric layers UIL and at least one first selection gate electrode SGE1 that are alternately stacked on the stack structure ST. The second selection structure SST2 may include upper dielectric layers UIL and at least one second selection gate electrode SGE2 that are alternately stacked on the stack structure ST.

In some embodiments, the first and second selection gate electrodes SGE1 and SGE2 of the first and second selection structures SST1 and SST2 may be used as the gate upper lines UL1 and UL2 discussed with reference to FIG. 1. The first and second selection gate electrodes SGE1 and SGE2 may include a conductive material the same as that of the gate electrodes GE included in the stack structure ST.

An upper isolation structure SIP may be provided between the first and second selection structures SST1 and SST2. The upper selection structure SIP may extend in the first direction D1 and may be provided between two lower vertical structures VS that are adjacent to each other on a central region of the stack structure ST. For example, the upper isolation structure SIP may be provided between two columns of the lower vertical structures VS provided on the central region of the stack structure ST. The upper isolation structure SIP may be formed of a single layer between the first and second selection structures SST1 and SST2. The upper isolation structure SIP may be formed of the same dielectric material as that of the upper dielectric layers UIL.

The upper isolation structure SIP may have a bottom surface that is vertically spaced apart from a top surface of the stack structure ST or a top surface of an uppermost dielectric layer ILD. Alternatively, the bottom surface of the upper isolation structure SIP may be in contact with the top surface of the uppermost dielectric layer ILD. The upper isolation structure SIP may be in direct contact with sidewalls of the first and second selection gate electrodes SGE1 and SGE2. The upper isolation structure SIP may have their rounded sidewalls in direct contact with the sidewalls of the first and second selection gate electrodes SGE1 and SGE2.

The semiconductor layer 100 may be provided thereon with separation structures SS that penetrate the stack structure ST and the selection structures SST1 and SST2.

The separation structures SS may extend in the first direction D1 along the stack structure ST, and may be spaced apart from each other in the second direction D2 that intersects the first direction D1. The separation structures SS may have their portions that penetrate a portion of the support semiconductor pattern SP that fills the opening OP. The separation structures SS may have a single-layered or multi-layered structure. The separation structures SS may include at least one selected from silicon oxide, silicon nitride, and polysilicon.

The first selection structure SST1 may be disposed between the upper isolation structure SIP and one of the separation structures SS, and the second selection structure SST2 may be disposed between the upper isolation structure SIP and another of the separation structure SS.

According to some embodiments, the upper vertical structures UVS may be provided corresponding to the lower vertical structures VS. The upper vertical structures UVS may penetrate the selection structures SST1 and SST2 and connect with the lower vertical structures VS.

The upper vertical structures UVS may be electrically connected to the bit lines BIL through lower and upper contact plugs BCTa and BCTb. Although FIG. 5 omits the bit lines BIL, the bit lines BIL may extend in the second direction D2, while running across the stack structure ST and the selection structures SST1 and SST2.

The upper vertical structures UVS may constitute first to fourth columns that are sequentially arranged along the second direction D2, and on each of the first to fourth columns, the upper vertical structures UVS may be arranged along the first direction D1. The upper vertical structures UVS of the first to fourth columns may penetrate each of the selection structures SST1 and SST2.

In some embodiments, the upper vertical structures UVS may include first upper vertical structures UVSa adjacent to the upper isolation structure SIP. The first upper vertical structures UVSa may constitute the first column.

The first and second selection structures SST1 and SST2 and the upper vertical structures UVS will be further discussed in detail below with reference to FIGS. 6 and 8A to 8E.

Referring to FIGS. 6 and 8A, each of the first and second selection gate electrodes SGE1 and SGE2 may include a line part E1 that extends in the first direction D1, and may also include electrode parts E2 that connect with the line part E1 and surround the upper vertical structures UVS.

In some embodiments, each of the upper vertical structures UVS may be completely surrounded by the electrode part E2. For each of the first and second selection gate electrodes SGE1 and SGE2, the electrode parts E2 may have their top surfaces located at a higher level than that of a top surface of the line part E1, and may have their bottom surfaces located at a lower level than that of a bottom surface of the line part E1.

As shown in FIG. 6, the line part E1 of each of the first and second selection gate electrodes SGE1 and SGE2 may extend in the first direction D1 while surrounding portions of the first upper vertical structures UVSa. The line part E1 may be in contact with the upper isolation structure SIP between the first upper vertical structures UVSa that are adjacent to each other.

The electrode part E2 of each of the first and second selection gate electrodes SGE1 and SGE2 may vertically protrude from the top and bottom surfaces of the line part E1 and have a regular thickness to surround sidewalls of the first upper vertical structures UVSa. The electrode part E2 may have a cylindrical shape, and when viewed in plan, may have an annular shape.

The electrode parts E2 of the first and second selection gate electrodes SGE1 and SGE2 may have their bottom surfaces that are vertically spaced apart from a top surface of the lower vertical structure VS. The electrode parts E2 may have their bottom surfaces located at a higher level than that of bottom surfaces of the first upper vertical structures UVSa.

The first and second selection structures SST1 and SST2 may each include a second horizontal dielectric pattern UHP that conformally surrounds a surface of a corresponding one of the first and second selection gate electrodes SGE1 and SGE2.

The second horizontal dielectric pattern UHP may include first sidewall parts S1 disposed between the electrode parts E2 and the upper vertical structures UVS, and may also include a second sidewall part S2 disposed between the upper isolation structure SIP and the first and second selection gate electrodes SGE1 and SGE2.

Each of the upper vertical structures UVS may include an upper channel pattern UVP connected to the first conductive pad PAD1, a selection gate dielectric pattern GIL that surrounds the upper channel pattern UVP, and a second conductive pad PAD2 provided at or on a top end of the upper channel pattern UVP. The second conductive pad PAD2 may be an impurity-doped region or may be formed of a conductive material. The upper channel pattern UVP including a semiconductor material may be used as channels of the upper transistors UT1 and UT2 discussed with reference to FIG. 1.

The selection gate dielectric pattern GIL may be formed of a single layer and may include a silicon oxide layer, a silicon oxynitride layer, or a high-k dielectric layer. The upper channel pattern UVP may have a macaroni shape or a pipe shape whose bottom end is closed. The upper channel pattern UVP may have an inside filled with an upper buried dielectric pattern UVI.

Figure 8B:
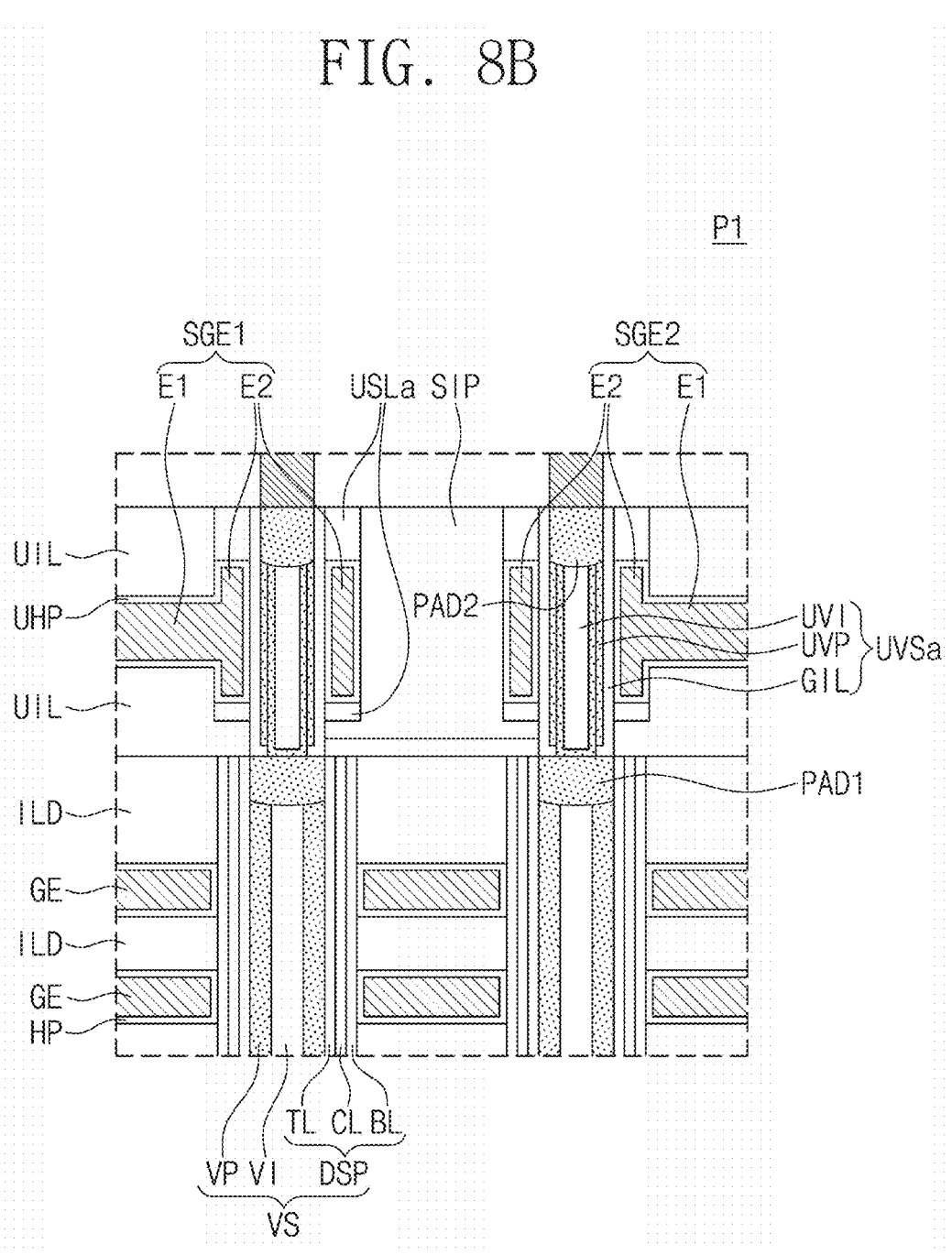

According to the embodiment shown in FIG. 8B, for each of the first and second selection gate electrodes SGE1 and SGE2, the top surface of the electrode part E2 may be located at a lower level than that of a top surface of the first upper vertical structure UVSa. For example, the top surfaces of the electrode parts E2 may be vertically spaced apart from the lower contact plug BCTa.

According to some embodiments, a buffer sacrificial pattern USLa may be provided around the second conductive pad PAD2 of the first upper vertical structure UVSa. The buffer sacrificial pattern USLa may be provided on the top and bottom surfaces of the electrode part E2. The buffer sacrificial pattern USLa may include a dielectric material having an etch selectivity with respect to the upper dielectric layers UIL and the selection gate dielectric pattern GIL.

Figure 8C:
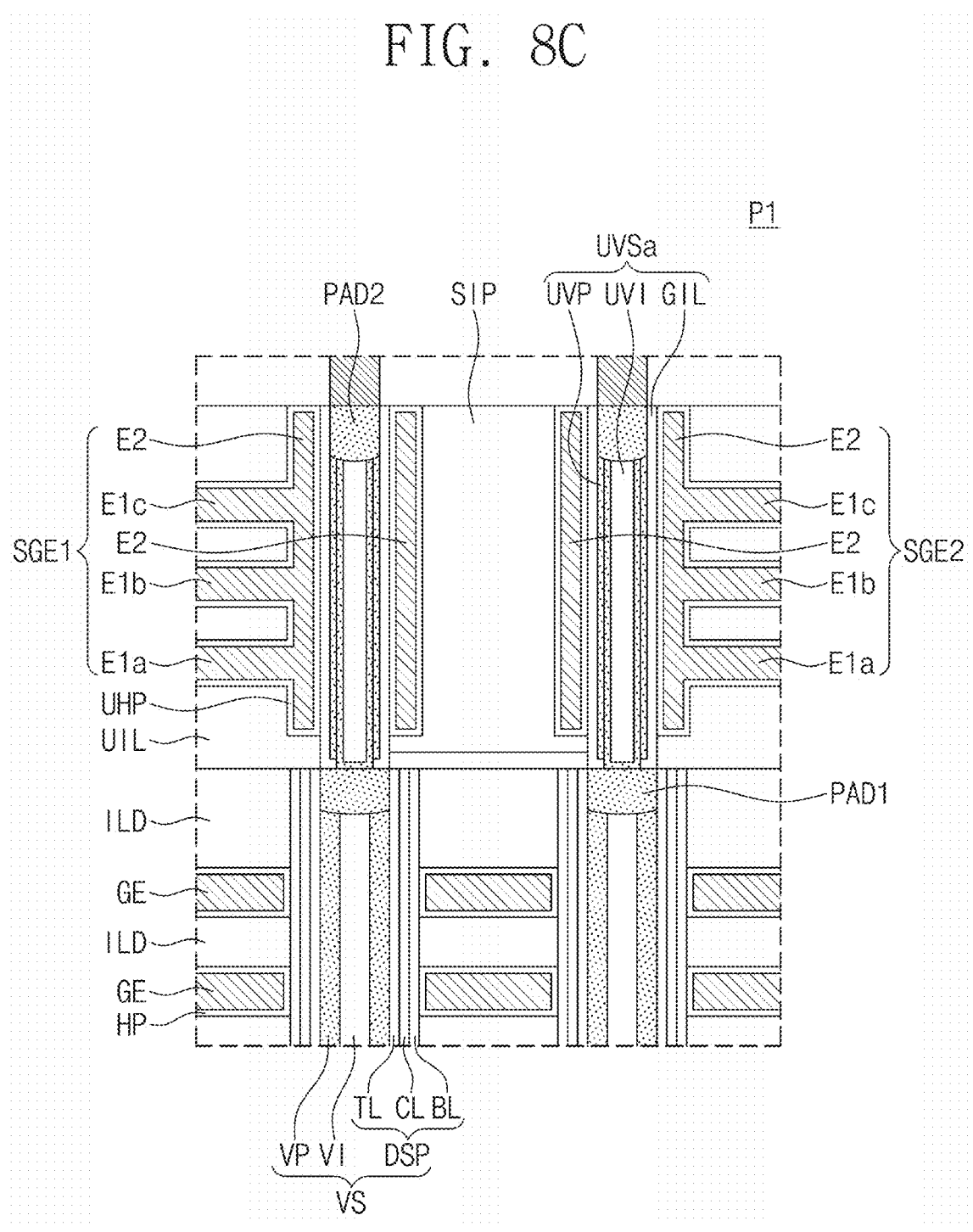

Referring to FIG. 8C, each of the first and second selection gate electrodes SGE1 and SGE2 may include first, second, and third line parts E1a, E1b, and E1c that are vertically stacked with the upper dielectric layers UIL therebetween, and may also include an electrode part E2 that vertically connects to each other the first, second, and third line parts E1a, E1b, and E1c. The electrode part E2 may have a top surface located at a higher level than that of a top surface of the third line part E1c, and may also have a bottom surface located at a lower level than that of a bottom surface of the first line part E1a.

Figure 8D:
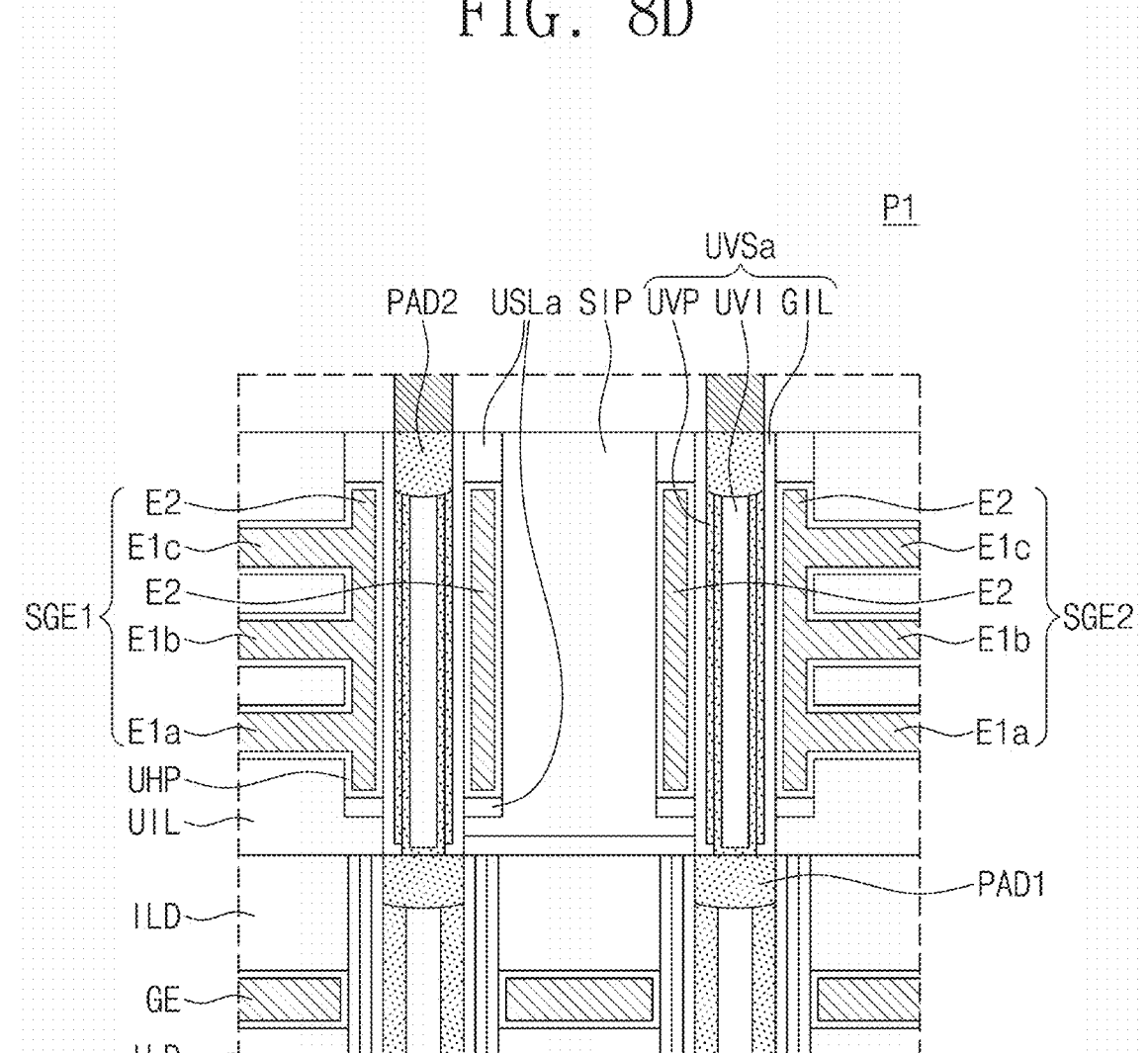

Referring to FIG. 8D, as discussed with reference to FIG. 8C, each of the first and second selection gate electrodes SGE1 and SGE2 may include first, second, and third line parts E1a, E1b, and E1c that are vertically stacked with the upper dielectric layers UIL therebetween, and may also include an electrode part E2 that vertically connects to each other the first, second, and third line parts E1a, E1b, and E1c. The electrode part E2 may have a top surface located at a higher level than that of a top surface of the third line part E1c, and may also have a bottom surface located at a lower level than that of the top surface of the first upper vertical structure UVSa.

Figure 8E:
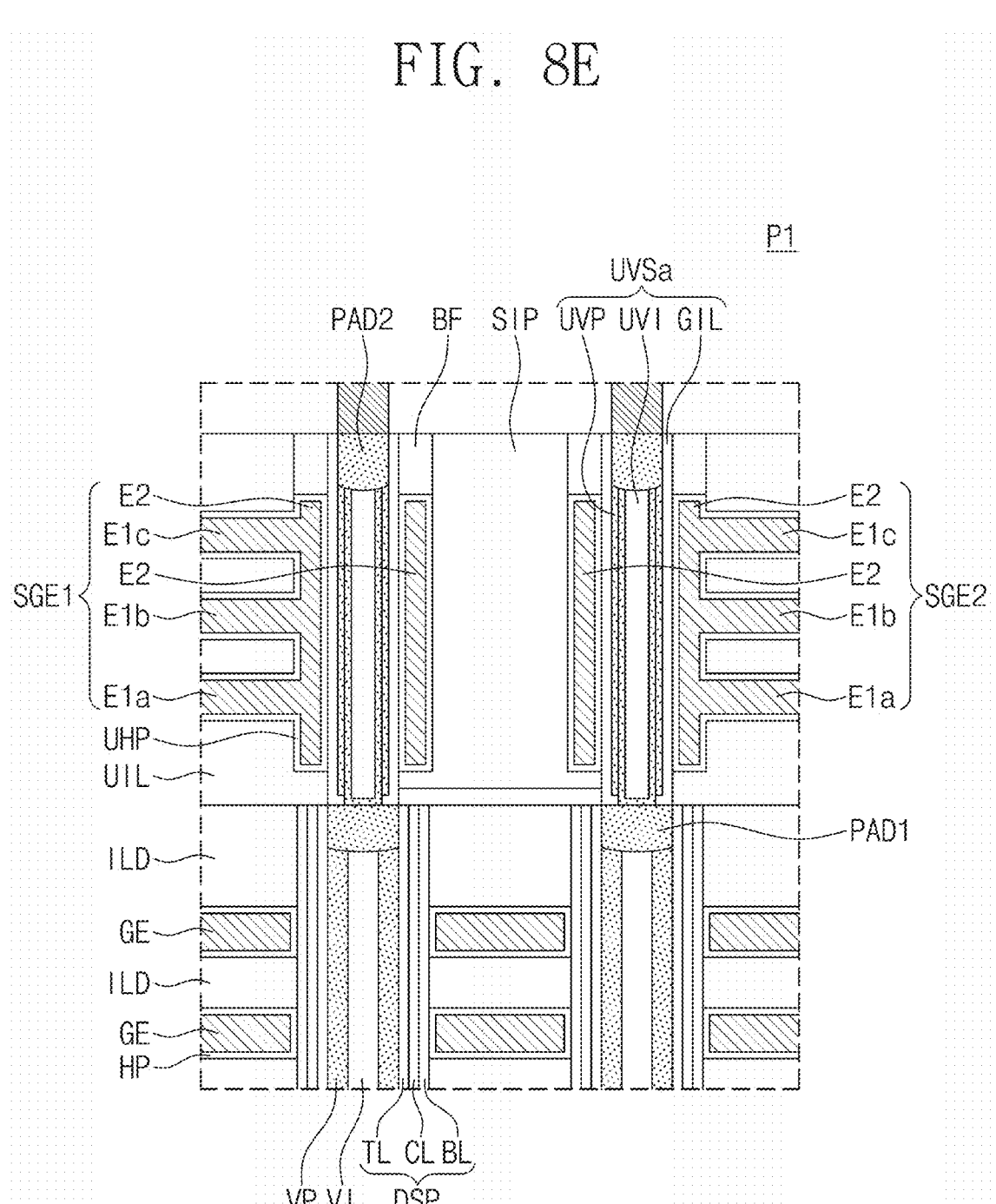

Referring to FIG. 8E, a buffer dielectric pattern BF may be provided around the second conductive pad PAD2 of the first upper vertical structure UVSa. The buffer dielectric pattern BF may be provided on the top surface of the electrode part E2 and may include the same dielectric material as that of the upper dielectric layers UIL.

Figure 10:
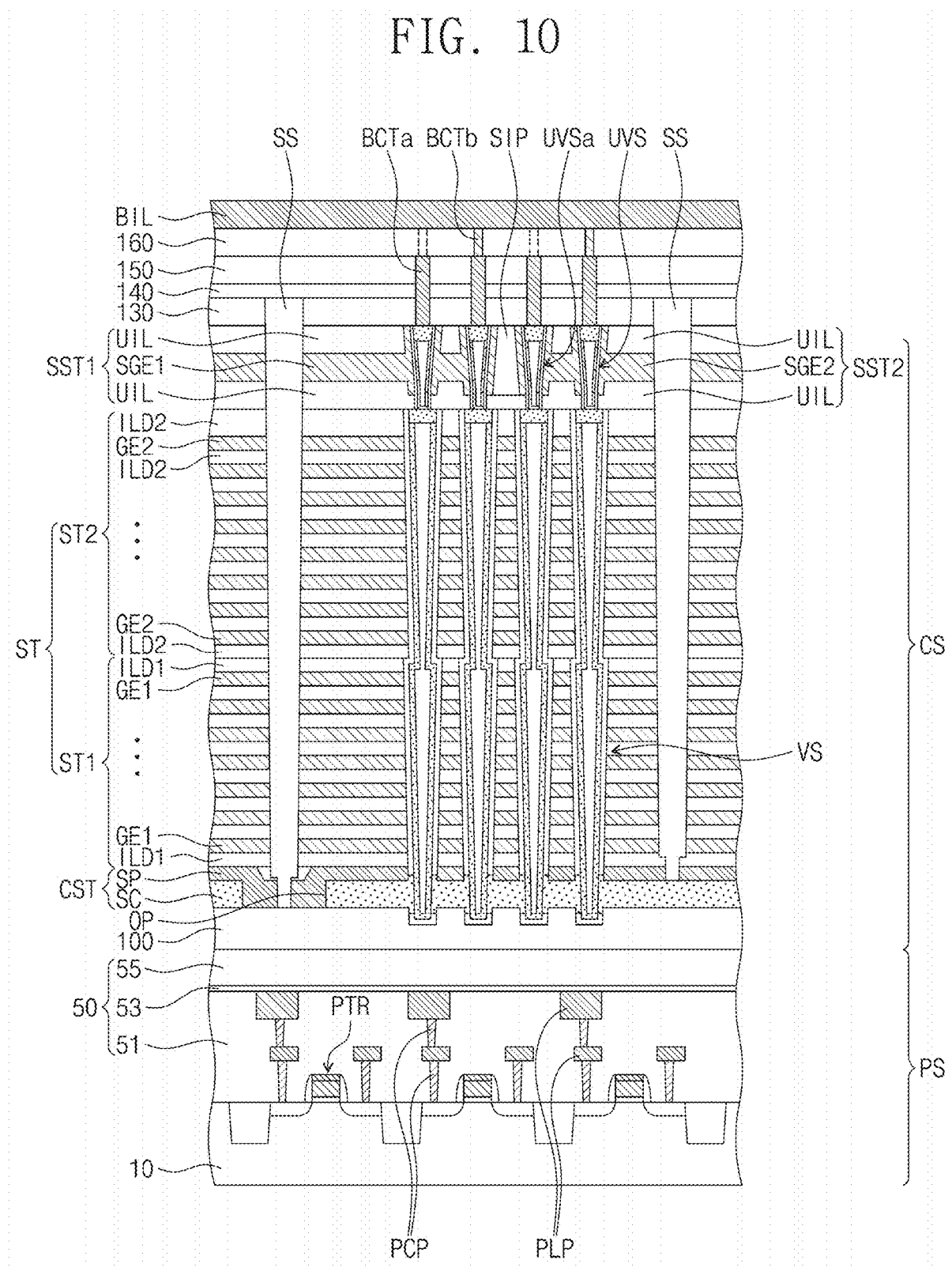
FIGS. 10 and 11 illustrate cross-sectional views taken along line A-A' of FIG. 5, showing a semiconductor device according to some embodiments of inventive concepts.
Figure 11:
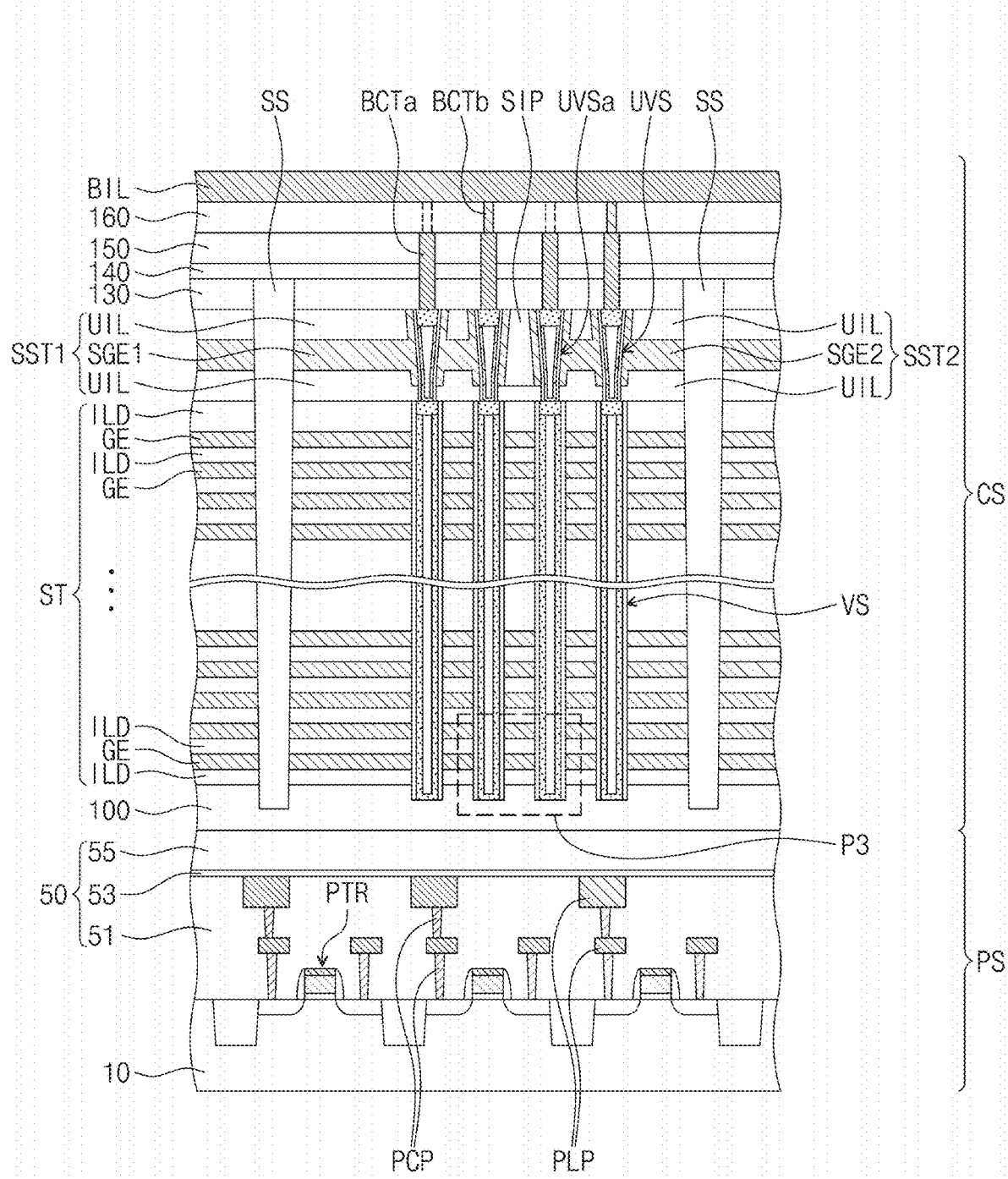
Figure 12:
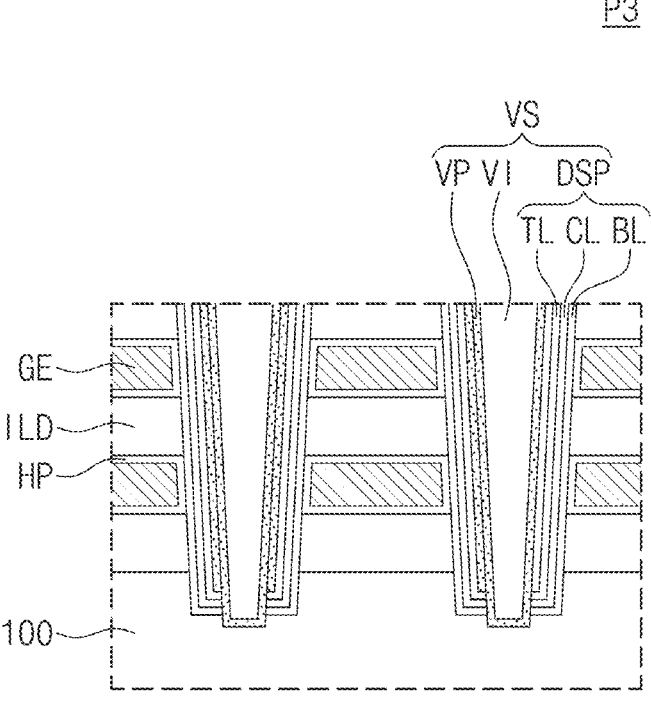
FIG. 12 illustrates an enlarged view showing section P3 of FIG. 11.

FIGS. 10 and 11 illustrate cross-sectional views taken along line A-A' of FIG. 5, showing a semiconductor device according to some embodiments of inventive concepts. FIG. 12 illustrates an enlarged view showing section P3 of FIG. 11.

In the embodiment that follows, a detailed description of technical features repetitive to those discussed above with reference to FIGS. 5, 6, 7, and 8A to 8E will be omitted and a difference thereof will be discussed in detail.

According to the embodiment shown in FIG. 10, the stack structure ST on the semiconductor layer 100 may include a first stack structure ST1 and a second stack structure ST2 on the first stack structure ST1. The first stack structure ST1 may include first gate electrodes GE1 that are stacked in a vertical direction (e.g., the third direction D3) on the semiconductor layer 100. The first stack structure ST1 may further include first dielectric layers ILD1 that separate the stacked first gate electrodes GE1 from each other. The first dielectric layers ILD1 and the first gate electrodes GE1 of the first stack structure ST1 may be stacked alternately with each other in the third direction D3. A second dielectric layer ILD2 may be provided on an uppermost portion of the first stack structure ST1.

The second stack structure ST2 may include second gate electrodes GE2 that are stacked in the third direction D3 on the first stack structure ST1. The second stack structure ST2 may further include second dielectric layers ILD2 that separate the stacked second gate electrodes GE2 from each other. The second dielectric layers ILD2 and the second gate electrodes GE2 of the second stack structure ST2 may be stacked alternately with each other in the third direction D3.

Each of the lower vertical structures VS may include a first vertical extension that penetrates the first stack structure ST1, a second vertical extension that penetrates the second stack structure ST2, and an expansion between the first and second extensions. The expansion may be provided in an uppermost first dielectric layer ILD1. The lower vertical structure VS may have a diameter that abruptly increases at the expansion.

According to the embodiment shown in FIG. 11, the source structure CST may be omitted from the cell array structure CS illustrated in FIG. 7. For example, a lowermost dielectric layer ILD of the stack structure ST may be disposed on the top surface of the semiconductor layer 100. The lower vertical structures VS may penetrate the stack structure ST and connect with the semiconductor layer 100.

For example, referring to FIG. 12, each of the lower vertical structures VS may include a data storage pattern DSP and a lower channel pattern VP. The lower channel pattern VP may be in direct contact with the semiconductor layer 100 and may have a "U" shape or a pipe shape whose bottom end is closed.

The data storage pattern DSP may extend in the third direction D3 and have a macaroni shape or a pipe shape whose top and bottom ends are opened. As discussed above with reference to FIG. 8A, the data storage pattern DSP may include a tunnel dielectric layer TL, a charge storage layer CL, and a blocking dielectric layer BL, which layers TL, CL, and BL constitute a data storage layer of a vertical NAND Flash memory device.

FIGS. 13 to 20 illustrate cross-sectional views taken along line A-A' of FIG. 5, showing a method of fabricating a semiconductor device according to some embodiments of inventive concepts.

Figure 13:
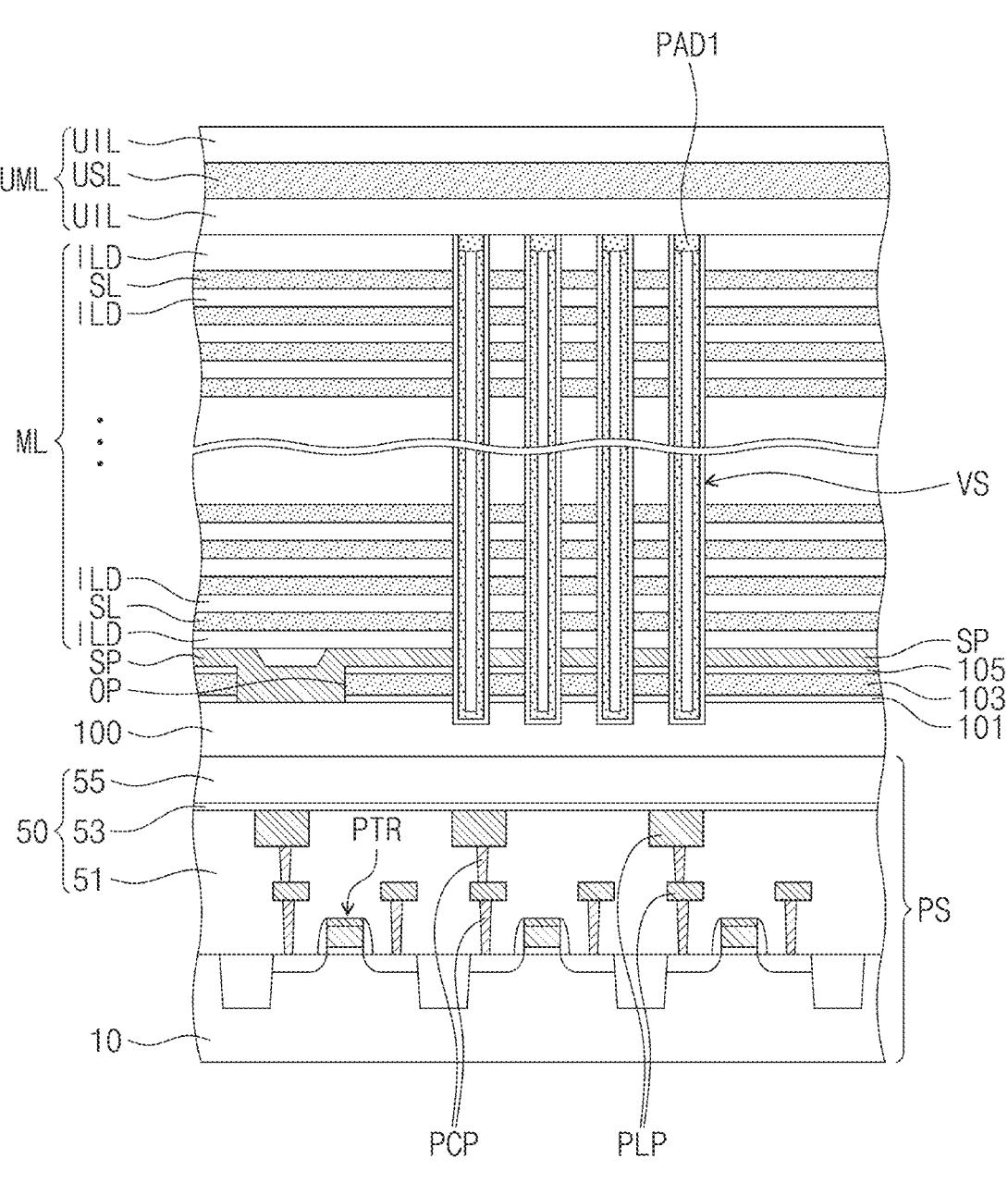
FIGS. 13 to 20 illustrate cross-sectional views taken along line A-A' of FIG. 5, showing a method of fabricating a semiconductor device according to some embodiments of inventive concepts.

Referring to FIGS. 5 and 13, a peripheral circuit structure PS may be formed on a semiconductor substrate 10. The formation of the peripheral circuit structure PS may include forming peripheral circuits PTR on the semiconductor substrate 10, forming peripheral wiring structures PCP and PLP connected to the peripheral circuits PTR, and forming a lower interlayer dielectric layer 50. The peripheral circuits PTR may include metal oxide semiconductor (MOS) transistors each of which uses the semiconductor substrate 10 as a channel.

A semiconductor layer 100 may be formed by deposing a semiconductor material on the lower interlayer dielectric layer 50. The semiconductor layer 100 may be formed of a semiconductor material, and the semiconductor material may include, for example, silicon (Si), germanium (Ge), silicon germanium (SiGe), gallium arsenic (GaAs), indium gallium arsenic (InGaAs), aluminum gallium arsenic (AlGaAs), or a mixture thereof. Additionally, or alternatively, the semiconductor layer 100 may include one or more of an impurity-doped semiconductor and an impurity-undoped intrinsic semiconductor. The semiconductor layer 100 may have at least one selected from a single-crystalline structure, an amorphous structure, and a polycrystalline structure.

A first dielectric layer 101, a second dielectric layer 103, and a third dielectric layer 105 may be sequentially stacked on the semiconductor layer 100.

The first dielectric layer 101 may be formed by thermally oxidizing a surface of the semiconductor layer 100 or by depositing a silicon oxide layer. The second dielectric layer 103 may be formed of a material having an etch selectivity with respect to the first dielectric layer 101 and the third dielectric layer 105. For example, the second dielectric layer 103 may be at least one selected from a silicon nitride layer, a silicon oxynitride layer, and a silicon carbide layer, and a silicon-germanium layer. The third dielectric layer 105 may be formed by depositing a silicon oxide layer.

Afterwards, the first, second, and third dielectric layers 101, 103, and 105 may be patterned to form openings OP that expose portions of the semiconductor layer 100.

After the formation of the openings OP, a support semiconductor pattern SP may be formed to have a regular thickness on the third dielectric layer 105. The support semiconductor pattern SP may fill the openings OP of the first, second, and third dielectric layers 101, 103, and 105. In the openings OP, the support semiconductor pattern SP may be in direct contact with the semiconductor layer 100. The support semiconductor pattern SP may be a polysilicon layer doped with n-type impurities and/or carbon (C).

A mold structure ML may be formed which includes dielectric layers ILD and sacrificial layers SL that are vertically and alternately stacked on the support semiconductor pattern SP.

For the mold structure ML, the sacrificial layers SL may be formed of a material having an etch selectivity with respect to the dielectric layers ILD. For example, the sacrificial layers SL may be formed of a dielectric material different from that of the dielectric layers ILD. The sacrificial layers SL may be formed of the same material as that of the second dielectric layer 103. For example, the sacrificial layers SL may be formed of a silicon nitride layer, and the dielectric layers ILD may be formed of a silicon oxide layer.

After that, lower vertical structures VS may be formed to penetrate the lower mold structure ML. The lower vertical structures VS may be arranged in a zigzag shape along a first direction D1.

The formation of the lower vertical structures VS may include performing an anisotropic etching process in which the mold structure ML, the support semiconductor pattern SP, and the first, second, and third dielectric layers 101, 103, and 105 are anisotropically etched to form vertical holes that penetrate the mold structure ML, the support semiconductor pattern SP, and the first, second, and third dielectric layers 101, 103, and 105, and then sequentially forming a data storage pattern (see DSP of FIG. 8) and a lower channel pattern (see VP of FIG. 8A) in each of the vertical holes. In the anisotropic etching process for forming the vertical holes, the semiconductor layer 100 may be over-etched on its top surface, and lower portions of the lower vertical structures VS may be positioned within the semiconductor layer 100. The data storage pattern DSP may have a regular thickness to conformally cover inner walls of the vertical holes.

The data storage pattern DSP may include a tunnel dielectric layer (see TL of FIG. 8A), a charge storage layer (see CL of FIG. 8A), and a blocking dielectric layer (see BL of FIG. 8A) that are sequentially stacked. The lower channel patterns VP may be formed in the vertical holes in which the data storage pattern DSP is formed, and first conductive pads (see PAD1 of FIG. 8A) may be formed on top ends of the lower channel patterns VP.

After the formation of the first conductive pads PAD1, an upper mold structure UML may be formed. The upper mold structure UML may include upper dielectric layers UIL and at least one upper sacrificial layer USL that are stacked on the mold structure ML. Alternatively, a plurality of upper sacrificial layers USL may be stacked, and an upper dielectric layer UIL may be interposed between the upper sacrificial layers USL.

Figure 14:
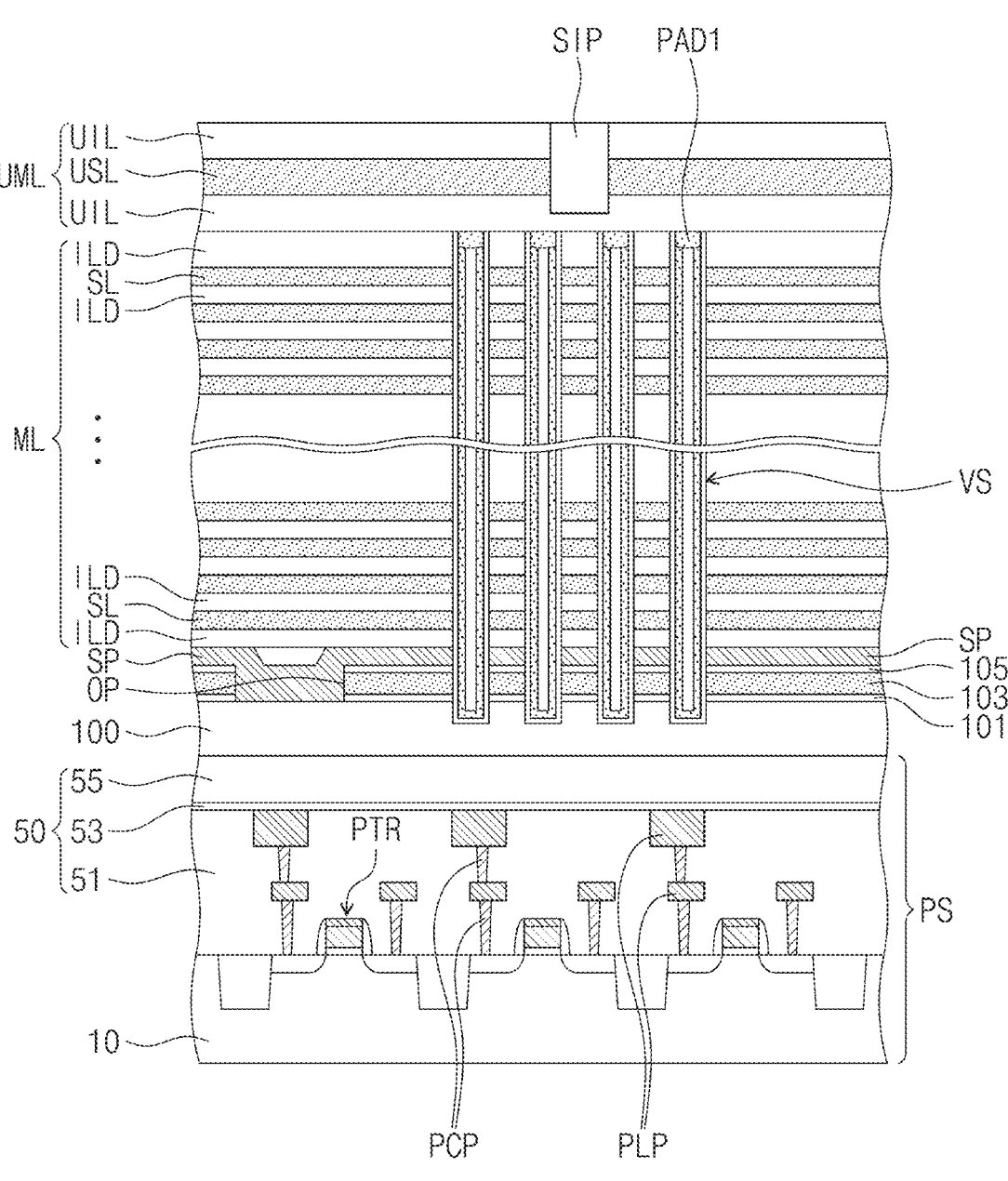

Referring to FIGS. 5 and 14, an upper isolation structure SIP may be formed to penetrate the upper mold structure UML and to extend in the first direction D1. The upper isolation structure SIP may have a linear shape that extends along the first direction D1. The upper isolation structure SIP may be disposed over two lower vertical structures VS that are adjacent to each other on a central region of the mold structure ML.

In some embodiments, the upper isolation structure SIP may be a separation dielectric pattern formed of a single dielectric material. The upper isolation structure SIP may be formed of a dielectric material having an etch selectivity with respect to the upper sacrificial layer USL. The upper isolation structure SIP may include the same dielectric material as that of the upper dielectric layer UIL.

The formation of the upper isolation structure SIP may include forming a mask pattern on an uppermost upper dielectric layer UIL, using the mask pattern to etch the upper dielectric layer UIL and the upper sacrificial layer USL to form a trench, and filling the trench with a dielectric material.

Figure 15:
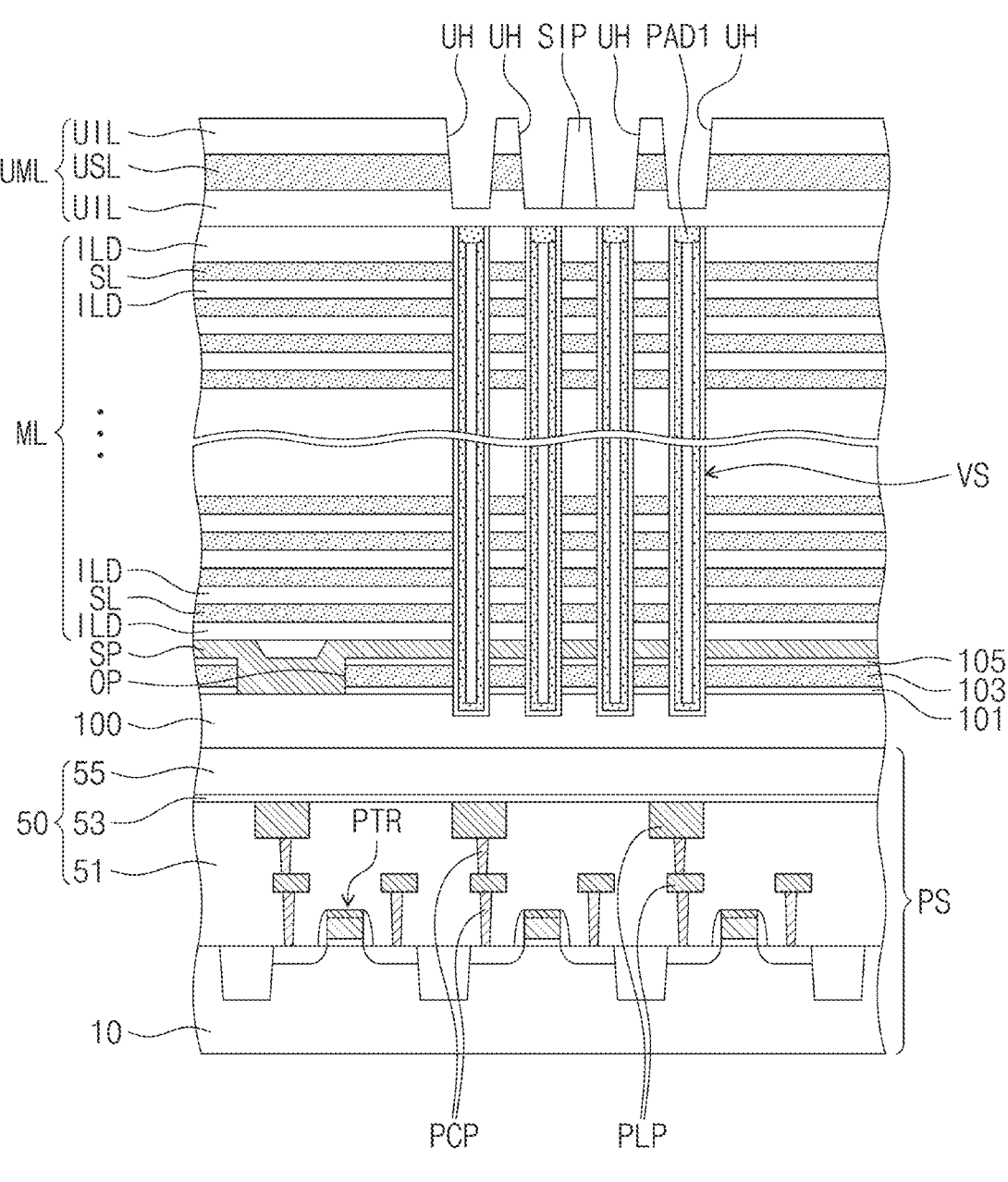

Referring to FIGS. 5 and 15, upper holes UH may be formed to penetrate the upper mold structure UML. The upper holes UH may be formed to respectively correspond to the lower vertical structures VS. The upper holes UH may penetrate the upper sacrificial layer USL and expose an uppermost upper dielectric layer UIL or the lower vertical structures VS.

The upper holes UH may be formed by forming a mask pattern on the upper mold structure UML, and then using the mask pattern as an etching mask to anisotropically etch the upper mold structure UML. When the upper holes UH are formed, portions of the upper holes UH may penetrate a portion of the upper isolation structure SIP.

Figure 16:
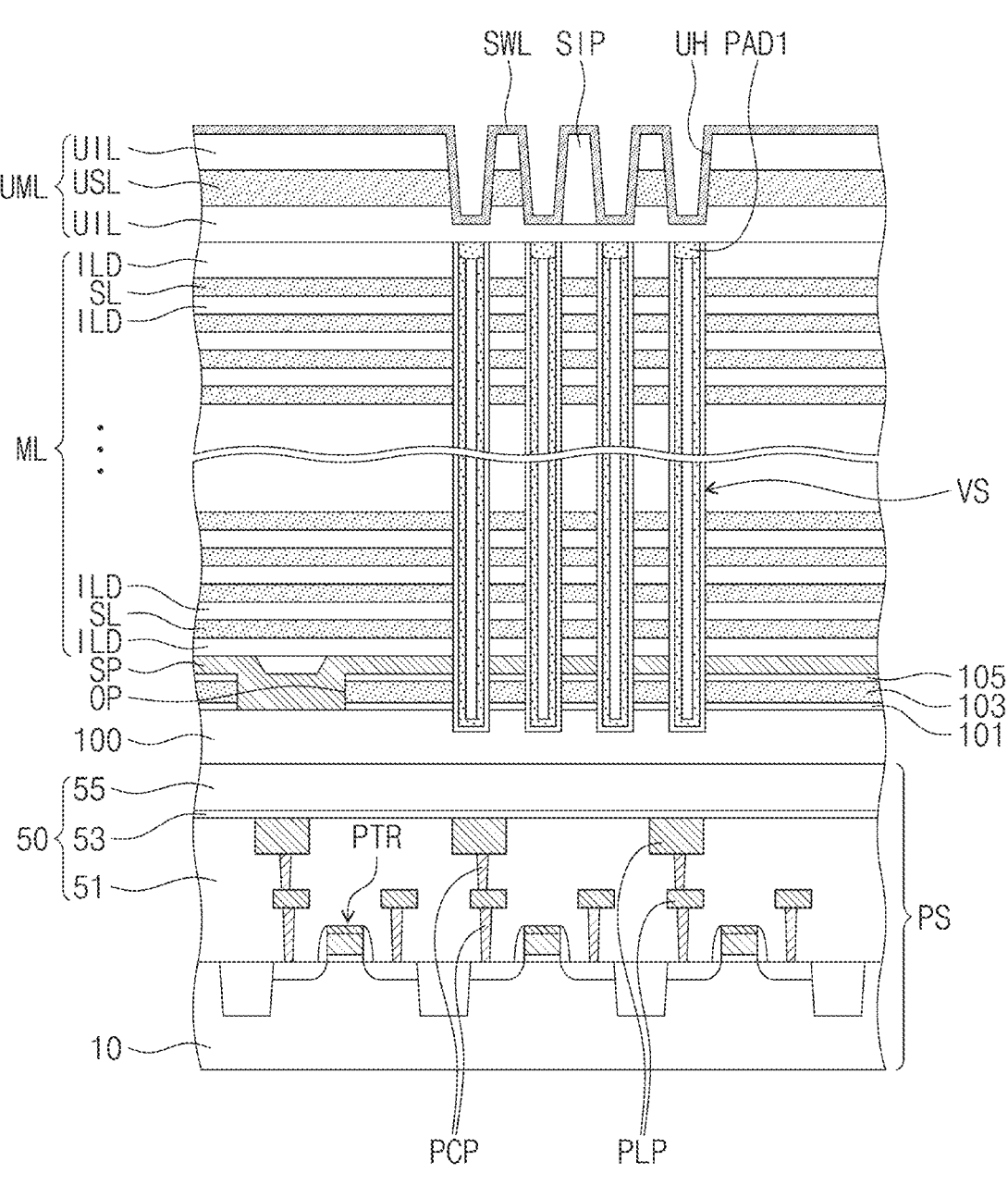

Referring to FIG. 16, a first sidewall sacrificial layer SWL may be formed to conformally cover inner walls of the upper holes UH.

The first sidewall sacrificial layer SWL may have a regular thickness to cover sidewalls and bottom surfaces of the upper holes UH. The first sidewall sacrificial layer SWL may be formed of a material, such as silicon nitride, having an etch selectivity with respect to the upper mold structure UML.

Figure 17:
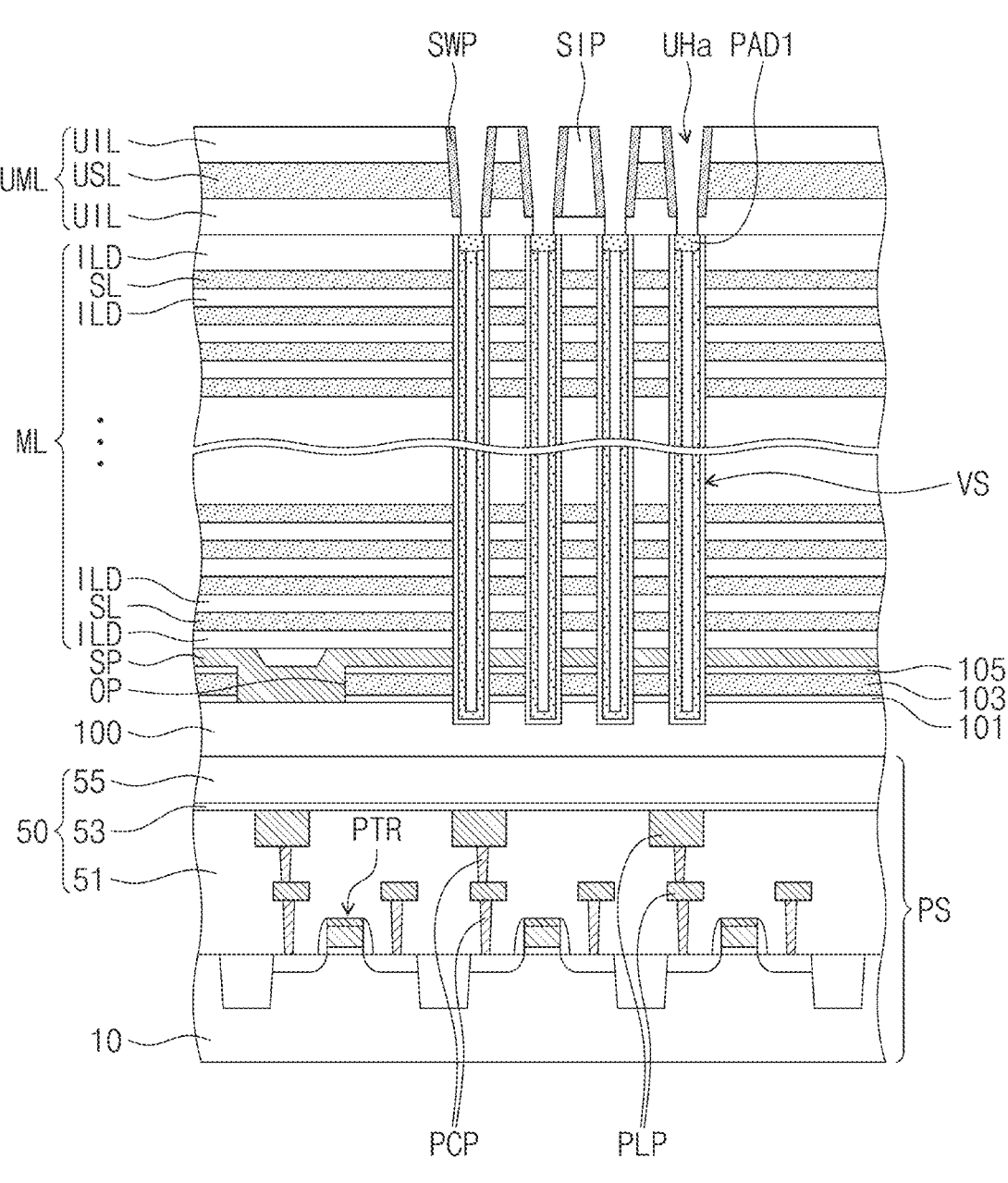

Referring to FIG. 17, an anisotropic etching process may be performed on the first sidewall sacrificial layer SWL. Therefore, first sidewall sacrificial patterns SWP may be formed to cover the sidewalls of the upper holes UH. The formation of the first sidewall sacrificial patterns SWP may expose the first conductive pads PAD1 of the lower vertical structures VS.

Figure 18:
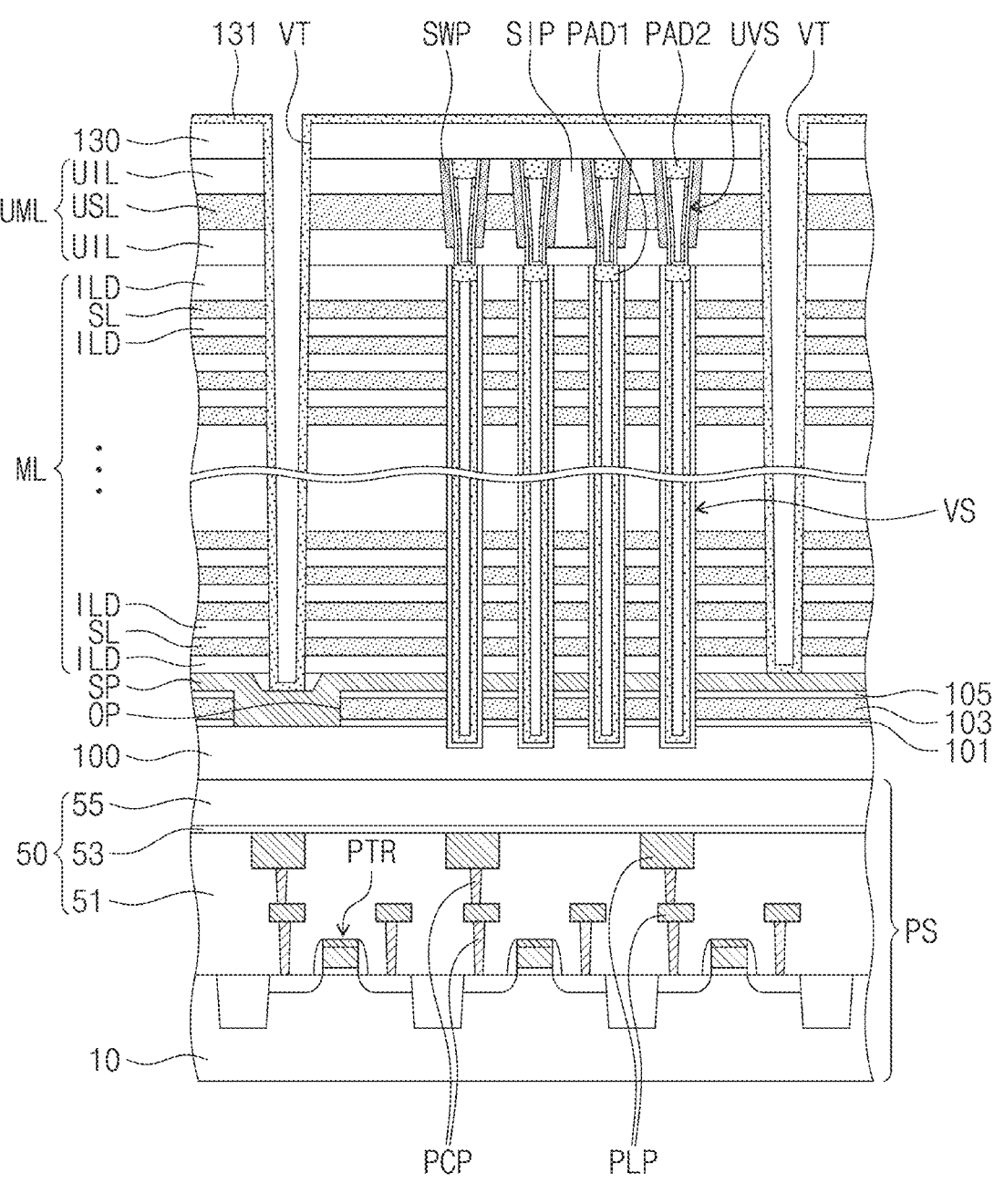

Referring to FIG. 18, after the formation of the first sidewall sacrificial patterns SWP, upper vertical structures UVS may be formed in the upper holes UH.

As discussed with reference to FIG. 8A, the upper vertical structures UVS may each include a selection gate dielectric pattern GIL, an upper channel pattern UVP, and an upper buried dielectric pattern UVI.

The formation of the upper vertical structures UVS may include sequentially forming a vertical dielectric layer and a first upper channel layer in the upper holes UH in which the first sidewall sacrificial patterns SWP are formed. A sum of thicknesses of the vertical dielectric layer and the first upper channel layer may be less than about half a width at an upper portion of the upper hole UH.

A gate dielectric pattern (see GIL of FIG. 8A) and a first upper channel pattern may be formed in the upper holes UH. The gate dielectric pattern and the first upper channel pattern may be formed by performing a blanket anisotropic etching process on a gate dielectric layer and a first upper channel layer. An anisotropic etching process may be performed such that the gate dielectric layer and the first upper channel layer that are positioned on the bottom surface of the upper hole UH are etched to expose the first conductive pad PAD1. The gate dielectric pattern and the first upper channel pattern may have a pipe shape whose opposite ends are opened.

Thereafter, a second upper channel pattern may be formed on the first upper channel pattern. The second upper channel pattern may be formed to have a thickness that conformally covers the upper holes UH without fully filling the upper holes UH. The second upper channel pattern may be coupled to the first conductive pad PAD1. A buried dielectric layer may be formed to fully or partially fill gap regions in which the second upper channel pattern is formed. Alternatively, the buried dielectric layer may be omitted. Herein, the first and second upper channel patterns consist of the upper channel pattern UVP shown in FIG. 8A.

Second conductive pads (see PAD2 of FIG. 8A) may be formed on top ends of the first and second upper semiconductor patterns (e.g., the upper channel pattern UVP of FIG. 8A). The second conductive pads PAD2 may be impurity-doped region or formed of a conductive material.

After the formation of the upper vertical structures UVS, on the upper dielectric layer UIL, a first interlayer dielectric layer 130 may be formed to cover top surfaces of the upper vertical structures UVS.

Separation trenches VT may be formed to penetrate the mold structure ML and to expose the support semiconductor pattern SP. An anisotropic etching process may be performed in which the first interlayer dielectric layer 130, the upper mold structure UML, and the mold structure ML are anisotropically etched to form the separation trenches VT, and in the anisotropic etching process, the support semiconductor pattern SP may be used as an etching stop layer.

Afterwards, a sacrificial spacer layer 131 may be formed to conformally cover inner walls of the separation trenches VT.

The sacrificial spacer layer 131 may have a regular thickness to cover sidewalls and bottom surfaces of the separation trenches VT. The sacrificial spacer layer 131 may be formed of a material, such as polysilicon, having an etch selectivity with respect to the mold structure ML. A chemical vapor deposition (CVD) or atomic layer deposition (ALD) process may be performed such that the sacrificial spacer layer 131 may be deposited to have a regular thickness on the inner walls of the separation trenches VT. The sacrificial spacer layer 131 may be deposited to have a thickness less than about half a width of the separation trench VT. Therefore, the sacrificial spacer layer 131 may define gaps in the separation trenches VT.

Figure 19:
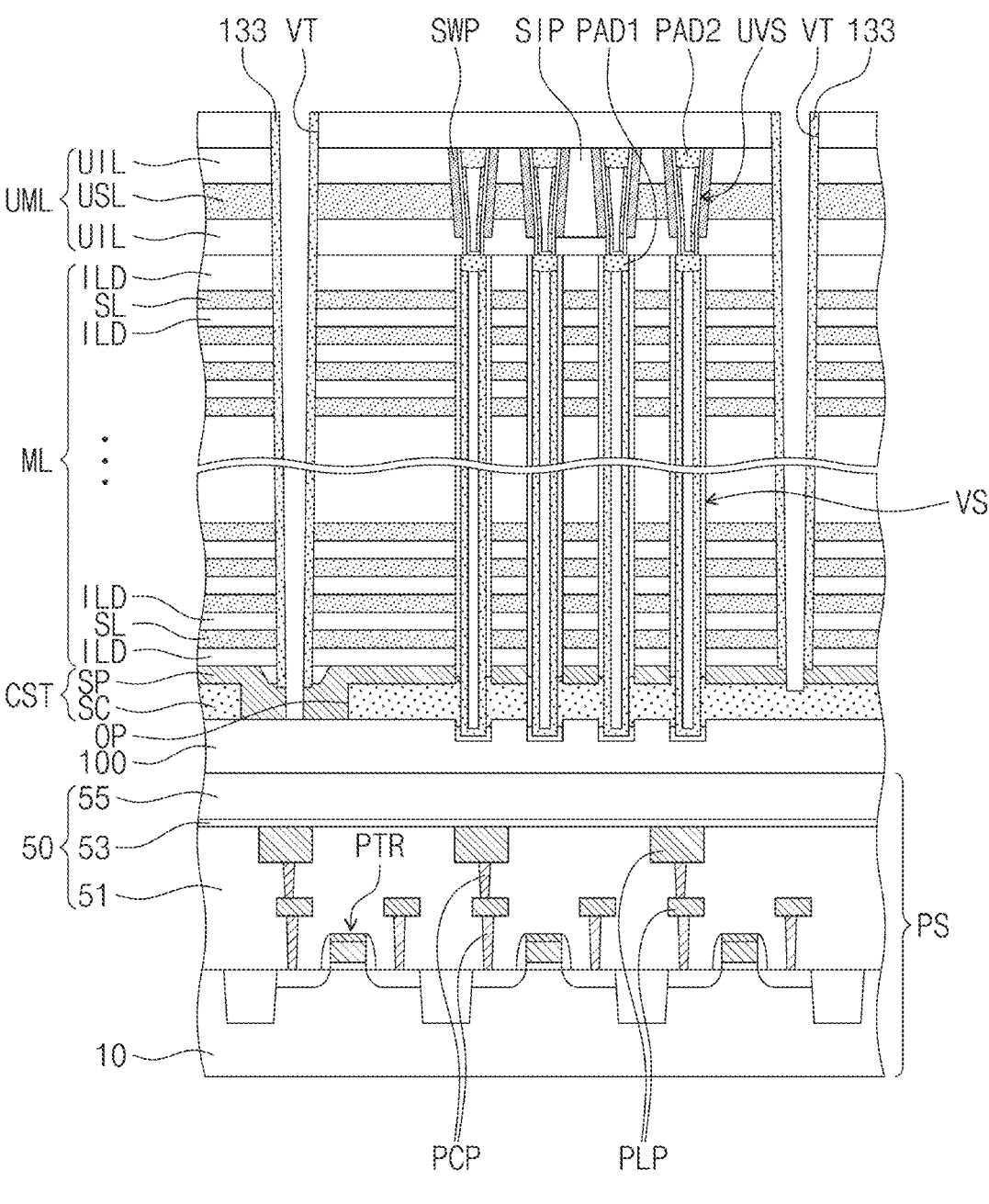

Referring to FIG. 19, the sacrificial spacer layer 131 may undergo an anisotropic etching process to form a sacrificial spacer 133 to cover the sidewalls of the separation trenches VT. The formation of the sacrificial spacer 133 may cause the second dielectric layer 103 to be exposed to the separation trenches VT.

After the formation of the sacrificial spacer 133, a first replacement process may be performed to replace the first, second, and third dielectric layers 101, 103, and 105 with a source semiconductor pattern SC.

For example, the formation of the source semiconductor pattern SC may include performing an isotropic etching process on the first, second, and third dielectric layers 101, 103, and 105 exposed to through holes and portions of a data storage layer.

The isotropic etching of the portions of the data storage layer may expose portions of sidewalls of the lower channel patterns (see VP of FIG. 9) included in the lower vertical structures VS. As the isotropic etching process is performed on the data storage layer, there may be formed a data storage pattern (see DSP of FIG. 9) and a residual data storage pattern (see RDSP of FIG. 9) that are vertically spaced apart from each other.

After the partial exposure of the sidewalls of the lower channel patterns (see VP of FIG. 9) included in the lower vertical structures VS, an impurity-doped polysilicon layer may be deposited to form a source semiconductor pattern SC. Therefore, a source structure CST may be formed between the semiconductor layer 100 and the mold structure ML.

In some embodiments, when the source structure CST is omitted, the first replacement process may be omitted.

After the formation of the source structure CST, an isotropic etching process may be performed to remove the sacrificial spacer 133. Therefore, the separation trenches VT may re-expose sidewalls of the sacrificial layers SL included in the mold structure ML.

Figure 20:
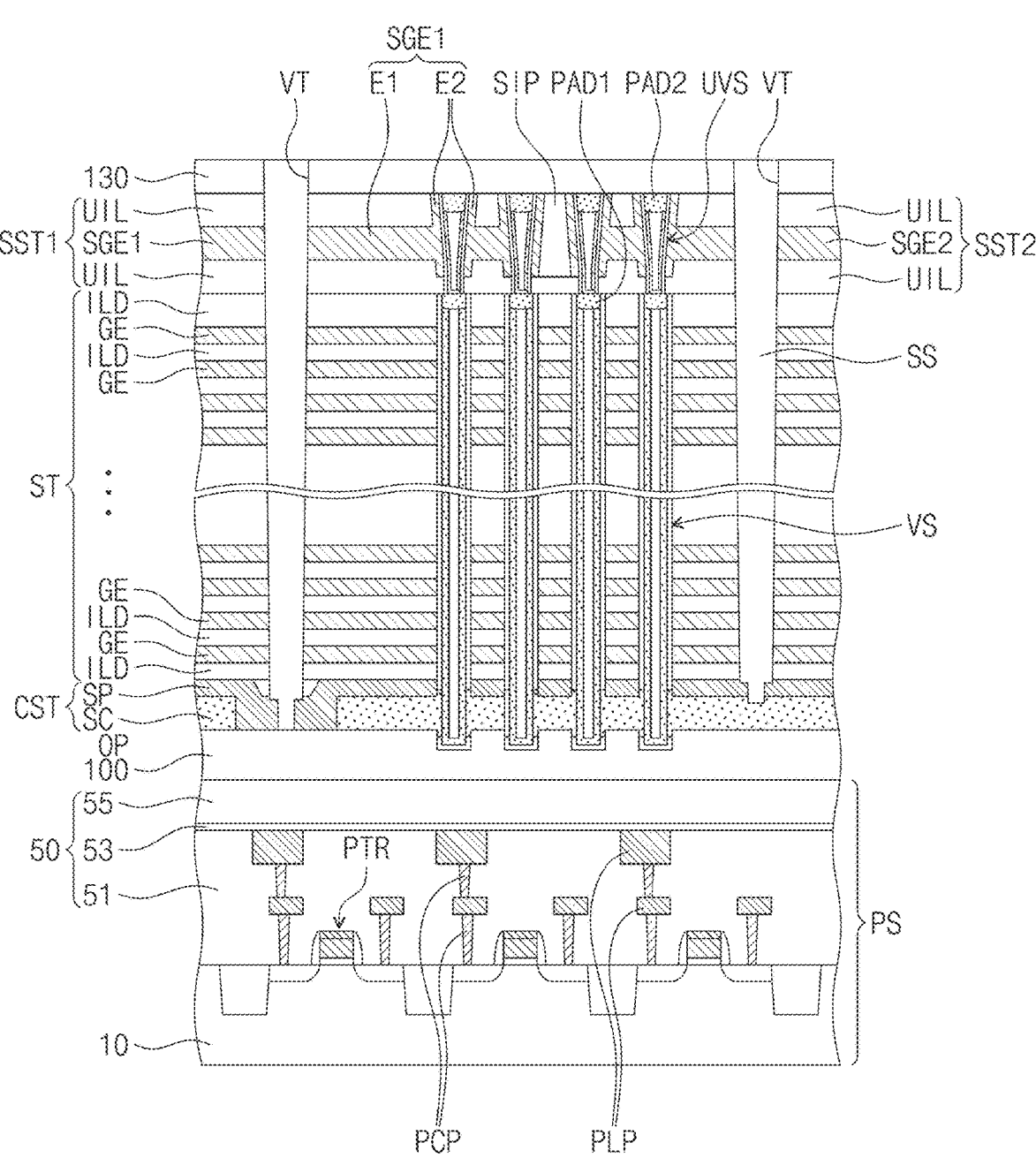

Referring to FIG. 20, a second replacement process may be performed such that the sacrificial layers SL may be replaced with gate electrodes GE, and that the upper sacrificial layers USL may be replaced with selection gate electrodes SGE. The second replacement process may simultaneously form a stack structure ST and selection structures SST1 and SST2 discussed with reference to FIG. 7.

The second replacement process may include forming electrode regions by isotropically etching the sacrificial layers SL, the upper sacrificial layer USL, and the first sacrificial sidewall patterns SWP that are exposed to the separation trenches VT, sequentially forming a horizontal dielectric layer and a gate conductive layer in the electrode region, and removing the gate conductive layer from the separation trench VT to thereby separate a plurality of gate electrodes GE from each other and to also thereby separate a plurality of selection gate electrodes SGE1 and SGE2 from each other.

When the selection gate electrodes SGE1 and SGE2 are formed, the upper sacrificial layer USL and the first sidewall sacrificial patterns SWP exposed to the separation trenches VT may be isotropically etched to form selection gate regions. The selection gate regions may expose portions of a sidewall of the upper isolation structure SIP.

After the stack structure ST is formed, the separation trenches VT may be filled with a dielectric material to form separation structures SS. The separation structures SS may have a single-layered or multi-layered structure. The separation structures SS may include at least one selected from silicon oxide, silicon nitride, and polysilicon.

Afterwards, as shown in FIG. 7, second, third, and fourth interlayer dielectric layers 140, 150, and 160 may be formed on the first interlayer dielectric layer 130, and lower and upper contact plugs BCTa and BCTb may be formed in the third and fourth interlayer dielectric layers 150 and 160. Bit lines BIL may be formed on the fourth interlayer dielectric layer 160.

Figure 21:
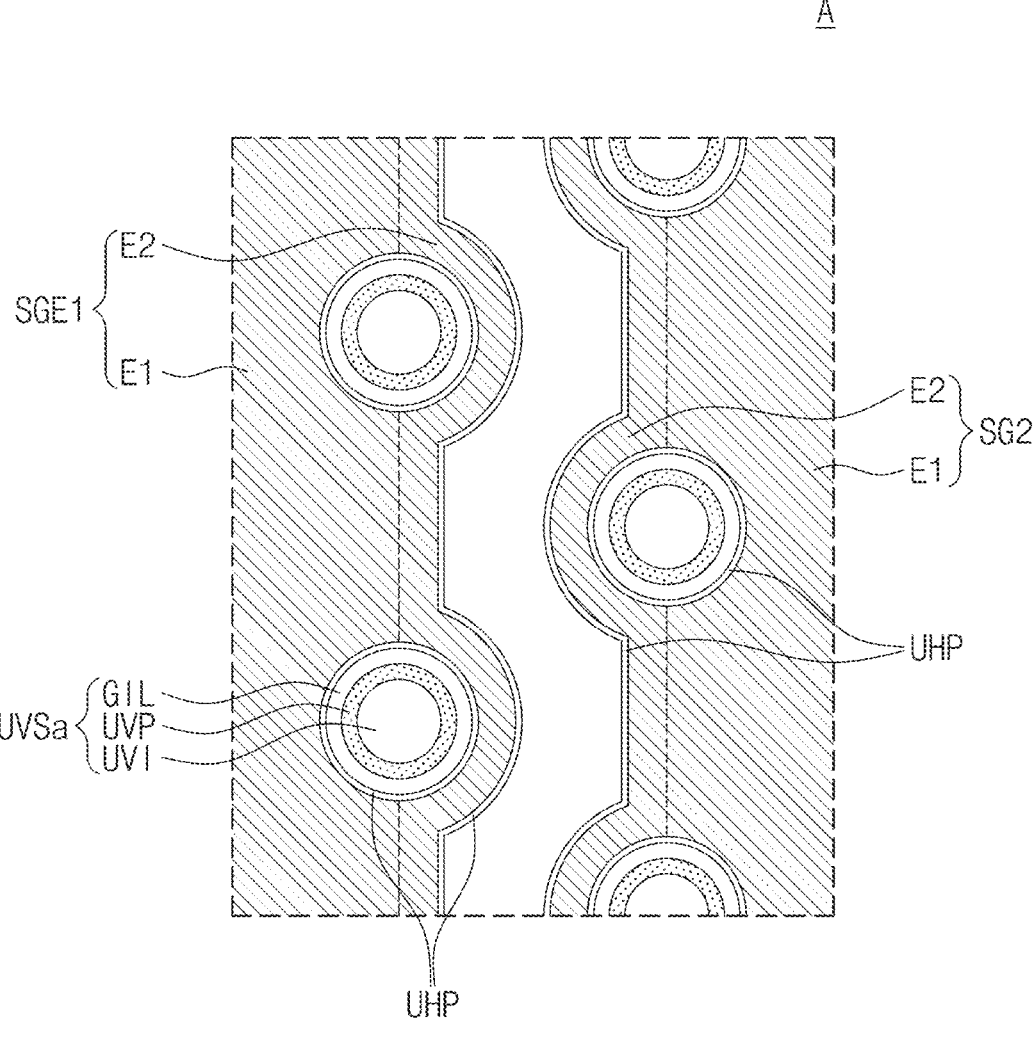
FIG. 21 illustrates an enlarged view showing section A of FIG. 5.
Figure 22:
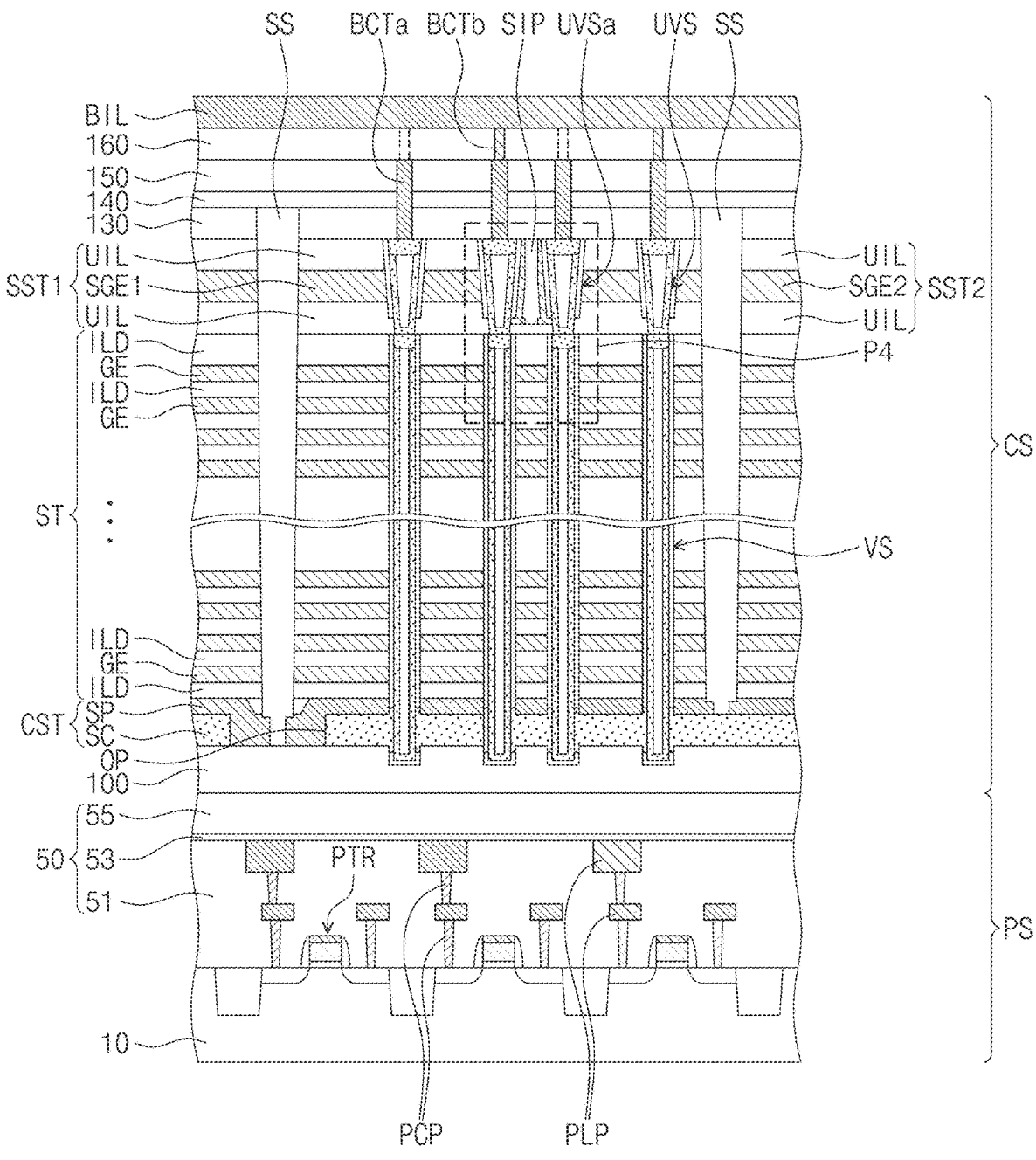
FIG. 22 illustrates a cross-sectional view taken along line A-A' of FIG. 5, showing a semiconductor device according to some embodiments of inventive concepts.
Figure 23A:
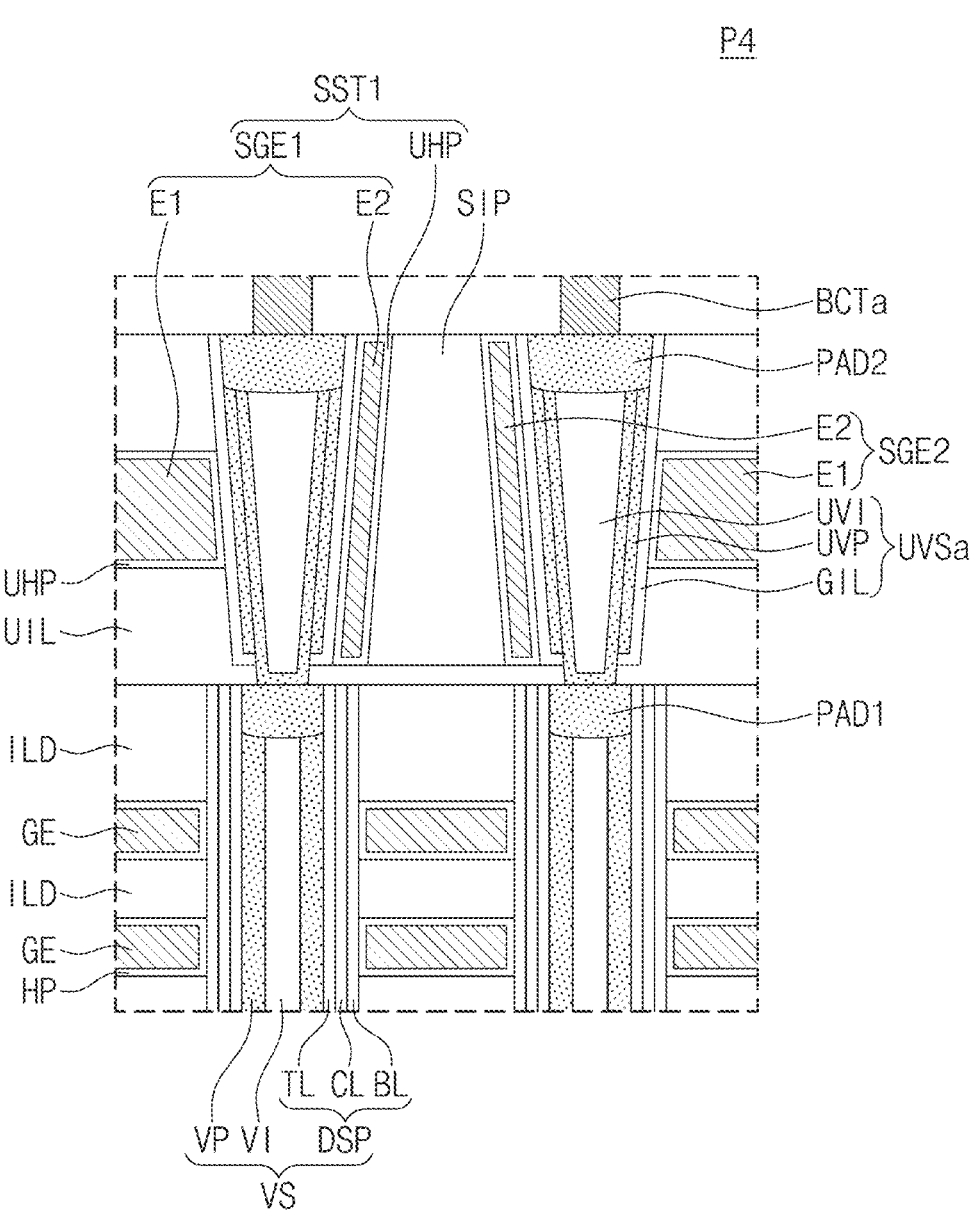
FIGS. 23A, 23B, and 23C illustrate enlarged views of section P5 depicted in FIG. 22, showing a semiconductor device according to some embodiments of inventive concepts.
Figure 23B:
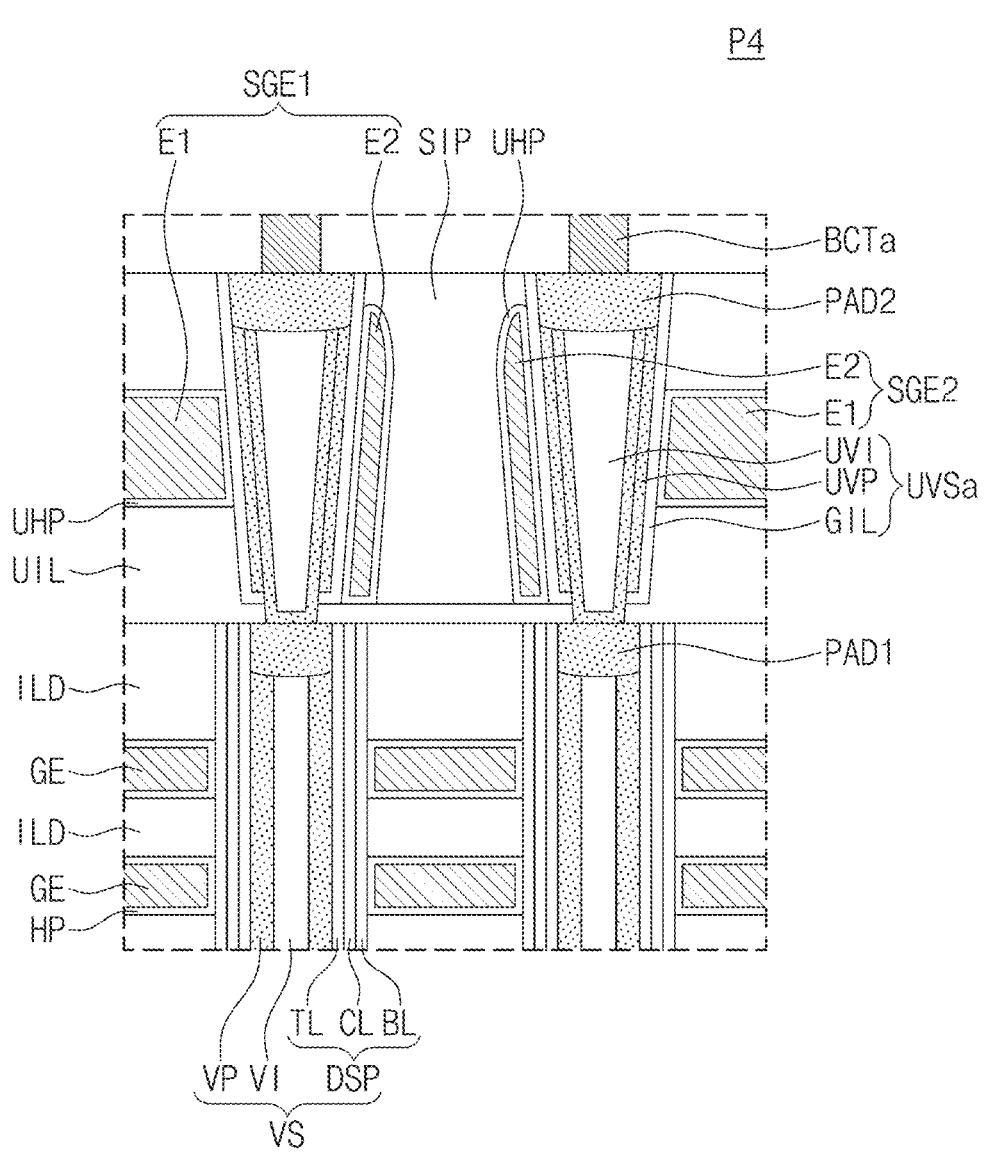
Figure 23C:
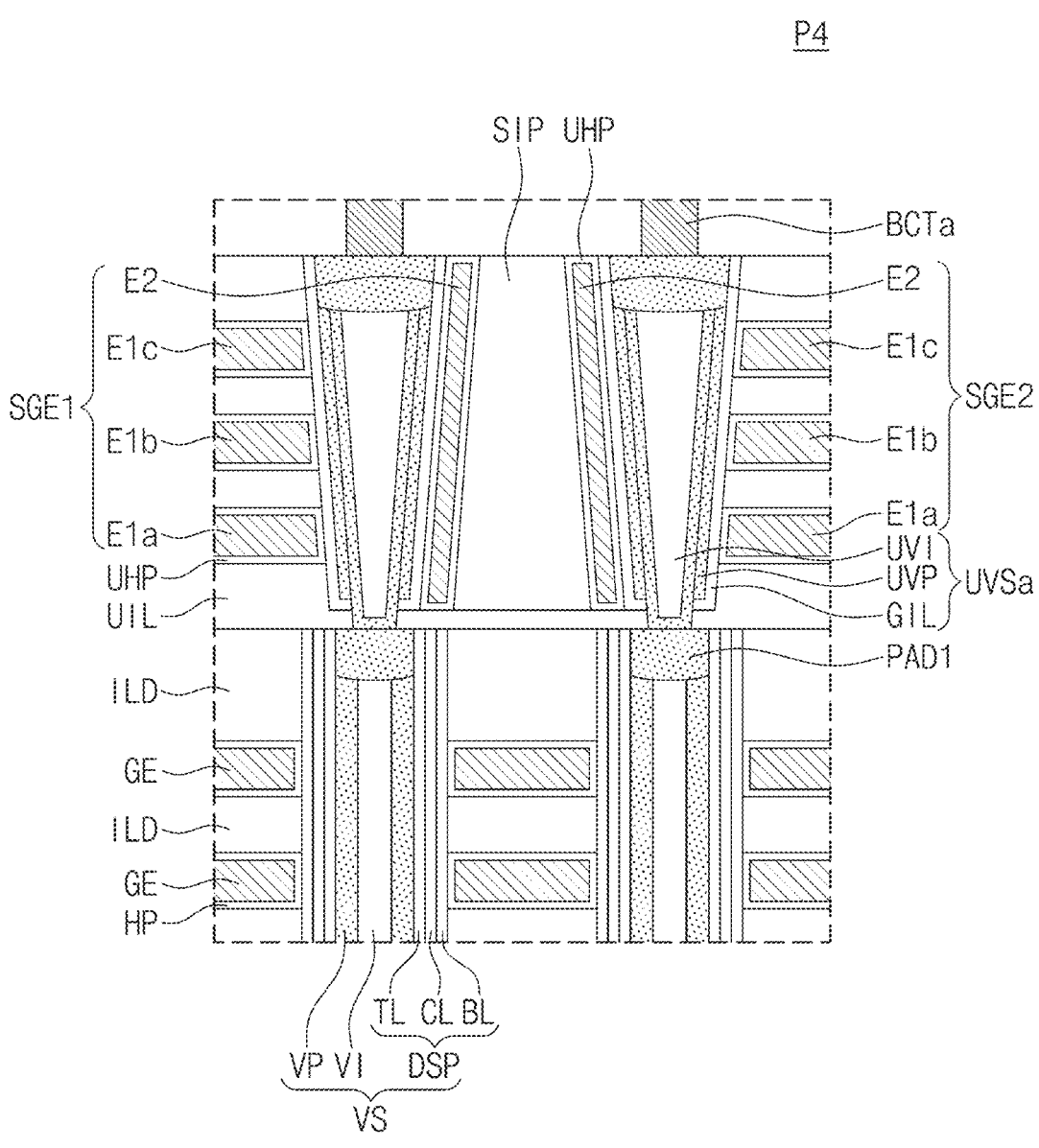

FIG. 21 illustrates an enlarged view showing section A of FIG. 5. FIG. 22 illustrates a cross-sectional view taken along line A-A' of FIG. 5, showing a semiconductor device according to some embodiments of inventive concepts. FIGS. 23A, 23B, and 23C illustrate enlarged views of section P5 depicted in FIG. 22, showing a semiconductor device according to some embodiments of inventive concepts.

For brevity of description, the same reference numerals refer to substantially the same technical features as those discussed above with reference to FIGS. 5, 6, 7, and 8A to 8E, and their explanations may be omitted.

Referring to FIGS. 5, 21, and 22, the first and second selection structures SST1 and SST2 may be disposed on the stack structure ST including the gate electrodes GE. The first and second selection structures SST1 and SST2 may respectively include first and second selection gate electrodes SGE1 and SGE2.

As discussed above, the upper vertical structures UVS may include first upper vertical structures UVSa adjacent to the upper isolation structure SIP. The first upper vertical structures UVSa may constitute a first column.

As shown in FIG. 23A, each of the first and second selection gate electrodes SGE1 and SGE2 may include a line part E1 that extends in the first direction D1, and may also include an electrode part E2 that is connected to the line part E1 and surrounds portions of sidewalls of the first upper vertical structures UVSa. For each of the first and second selection gate electrodes SGE1 and SGE2, the electrode part E2 may have a top surface located at a higher level than that of a top surface of the line part E1, and may have a bottom surface located at a lower level than that of a bottom surface of the line part E1.

In some embodiments, the electrode part E2 may have a semicircular shape around the first upper vertical structures UVSa. Each of the first upper vertical structures UVSa may be completely surrounded by the line part E1 and the electrode part E2 of one of the first and second selection gate electrodes SGE1 and SGE2. The upper vertical structures UVS arranged in second to fourth columns may be completely surrounded by the line part E1 of one of the first and second selection gate electrodes SGE1 and SGE2.

The second horizontal dielectric pattern UHP may conformally cover surfaces of the line part E1 and the electrode part E2 of one of the first and second selection gate electrodes SGE1 and SGE2. The second horizontal dielectric pattern UHP may include a first sidewall part in contact with the gate dielectric pattern GIL of the first upper vertical structure UVSa, and may also include a second sidewall part in contact with the upper isolation structure SIP.

Referring to FIG. 23B, for each of the first and second selection gate electrodes SGE1 and SGE2, the electrode part E2 may have a substantially spacer-shaped cross-section. The electrode part E2 may have a top surface located at a lower level than that of a top surface of the second conductive pad PAD2, and the upper isolation structure SIP may cover the top surface of the electrode part E2.

Referring to FIG. 23C, each of the first and second selection gate electrodes SGE1 and SGE2 may include first, second, and third line parts E1a, E1b, and E1c that are vertically stacked with the upper dielectric layers UIL therebetween, and may also include an electrode part E2 that vertically connects to each other the first, second, and third line parts E1a, E1b, and E1c. The electrode part E2 may surround a portion of the sidewall of the first upper vertical structure UVSa, and the first, second, and third line parts E1a, E1b, and E1c may surround a remaining part of the sidewall of the first upper vertical structure UVSa.

FIGS. 24 to 28 illustrate cross-sectional views taken along line A-A' of FIG. 5, showing a method of fabricating a semiconductor device according to some embodiments of inventive concepts. The same technical features as those of the fabrication methods discussed above may be omitted in the interest of brevity of description.

Figure 24:
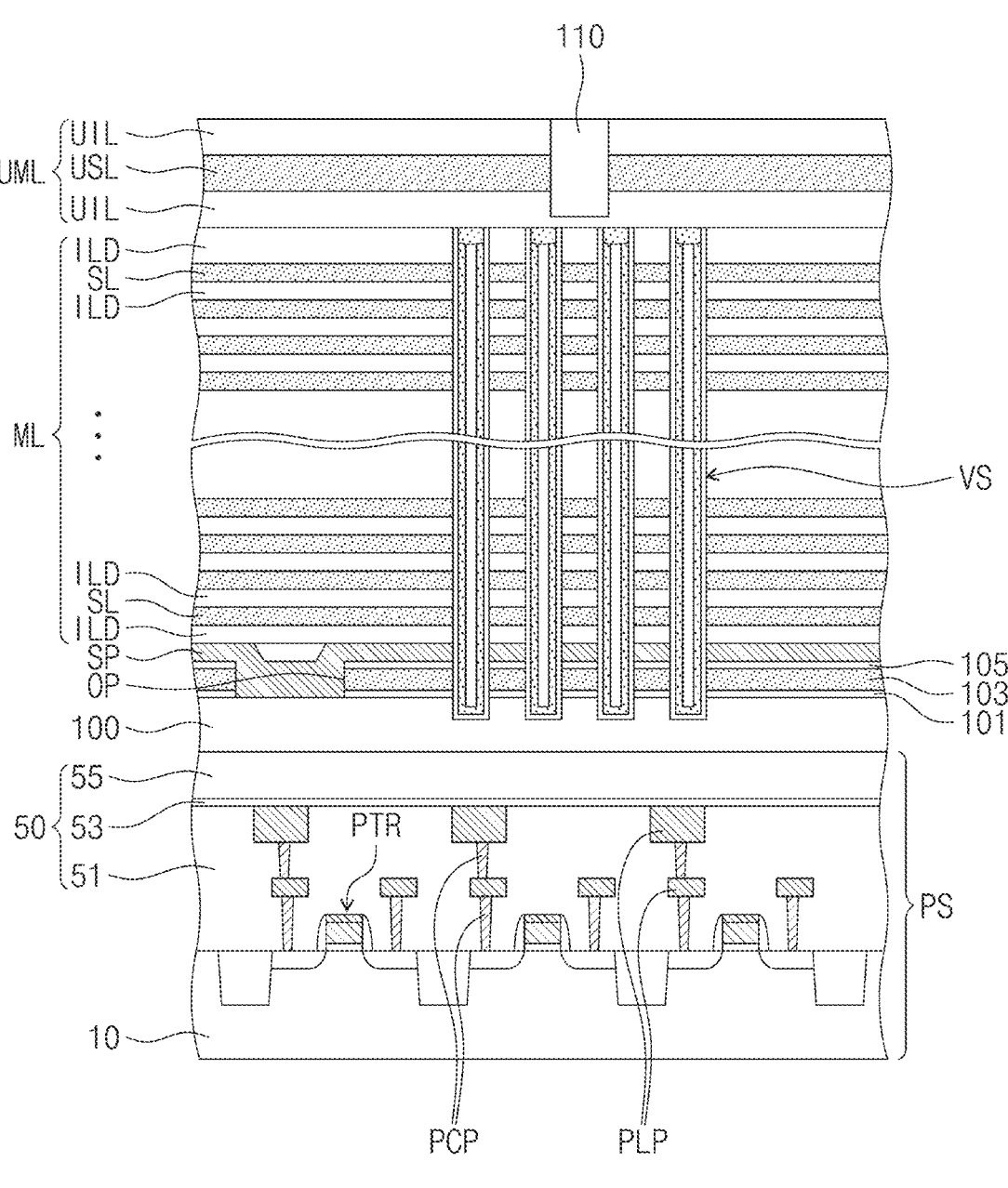
FIGS. 24 to 28 illustrate cross-sectional views taken along line A-A' of FIG. 5, showing a method of fabricating a semiconductor device according to some embodiments of inventive concepts.

Referring to FIGS. 5 and 24, as discussed with reference to FIG. 13, a mold structure ML may be formed on the peripheral circuit structure PS, and lower vertical structures VS may be formed to penetrate the mold structure ML.

An upper mold structure UML may be formed to include upper dielectric layers UIL and at least one upper sacrificial layer USL that are alternately stacked on the mold structure ML.

A line-shaped sacrificial isolation pattern 110 may be formed to extend in the first direction D1 while penetrating the upper sacrificial layer USL. The sacrificial isolation pattern 110 may be formed of a material having an etch selectivity with respect to the upper sacrificial layer USL. The sacrificial isolation pattern 110 may be disposed over two lower vertical structures VS that are adjacent to each other on a central region of the mold structure ML. The sacrificial isolation pattern 110 may have a bottom surface that is either spaced apart from or in contact with the lower vertical structures VS.

Figure 25:
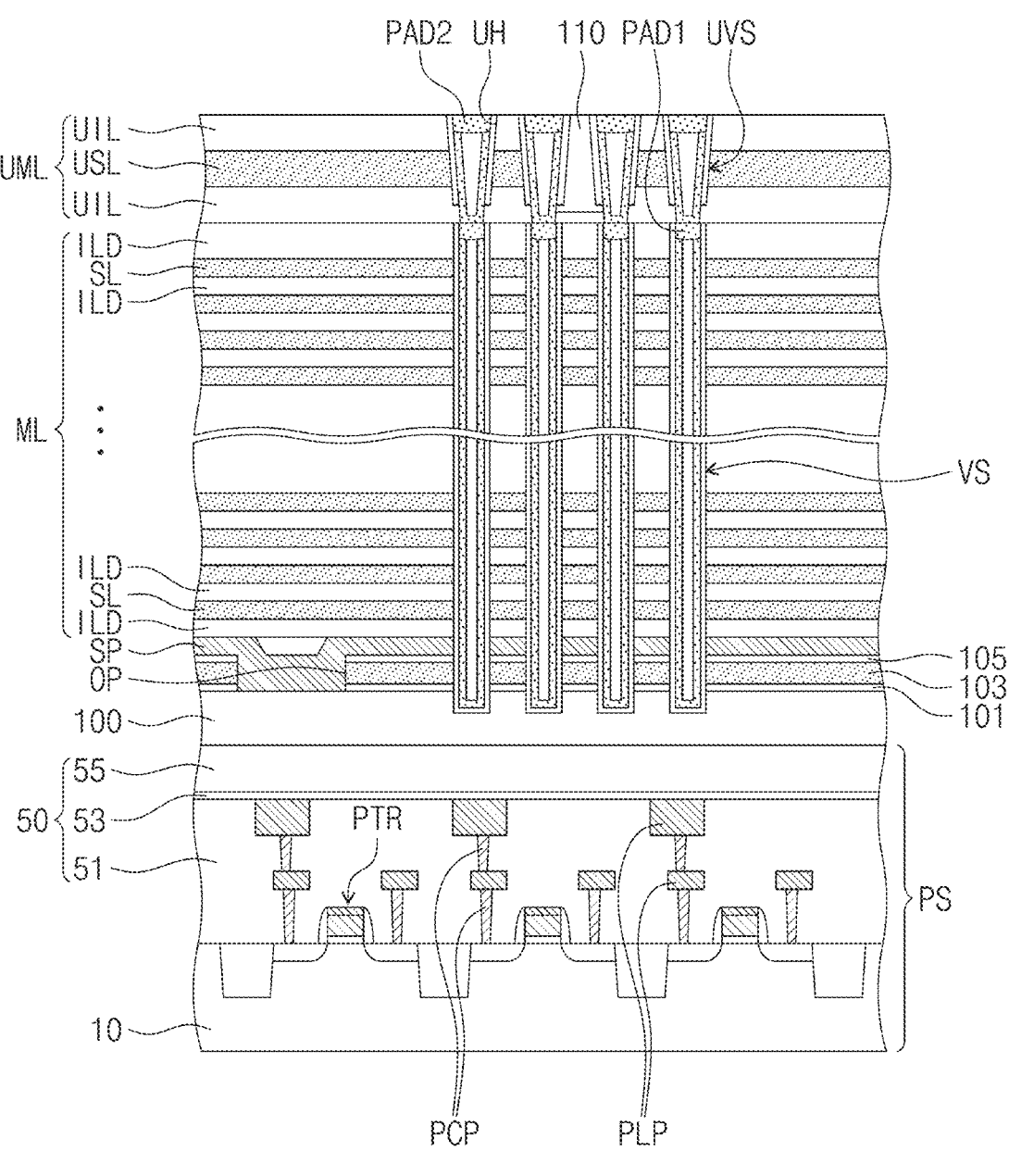

Referring to FIGS. 5 and 25, upper vertical structures UVS may be formed corresponding to the lower vertical structures VS. The formation of the upper vertical structures UVS may include, as discussed above with reference to FIG. 15, forming upper holes UH that penetrate the upper mold structure UML, forming gate dielectric patterns that surround inner walls of the upper holes UH, forming an upper channel pattern connected to the first conductive pads PAD1 in the upper holes UH in which the gate dielectric patterns are formed, and forming second conductive pads PAD2 at or on a top end of the upper channel pattern.

Figure 26:
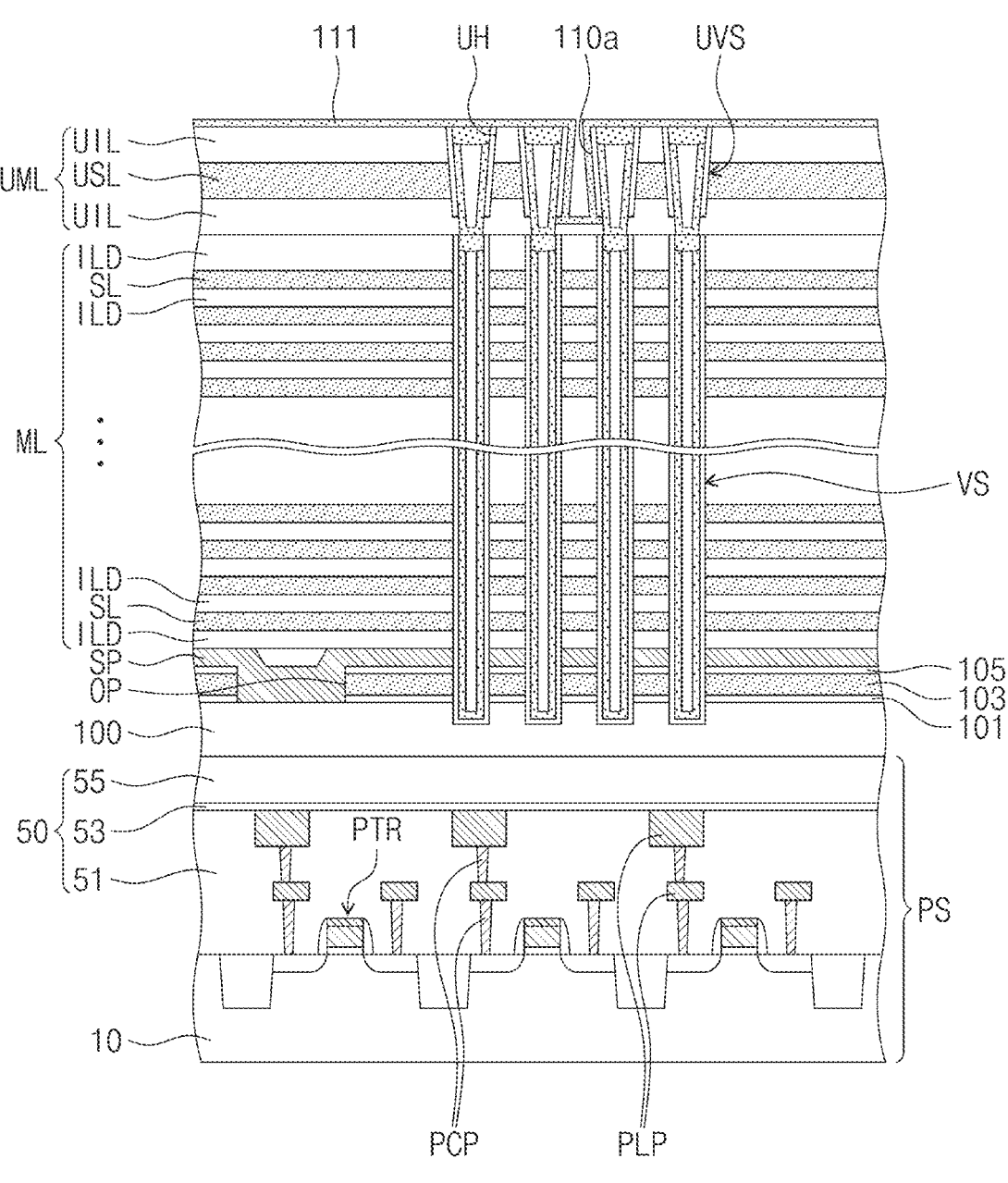

Referring to FIGS. 5 and 26, after the formation of the lower vertical structures VS, the sacrificial isolation pattern 110 may be removed to form an upper isolation trench 110a.

After the formation of the upper isolation trench 110a, a second sidewall sacrificial layer 111 may be formed to conformally cover an inner wall of the upper isolation trench 110a. The second sidewall sacrificial layer 111 may be formed of a material, such as silicon nitride, having an etch selectivity with respect to the upper dielectric layers UIL.

Figure 27:
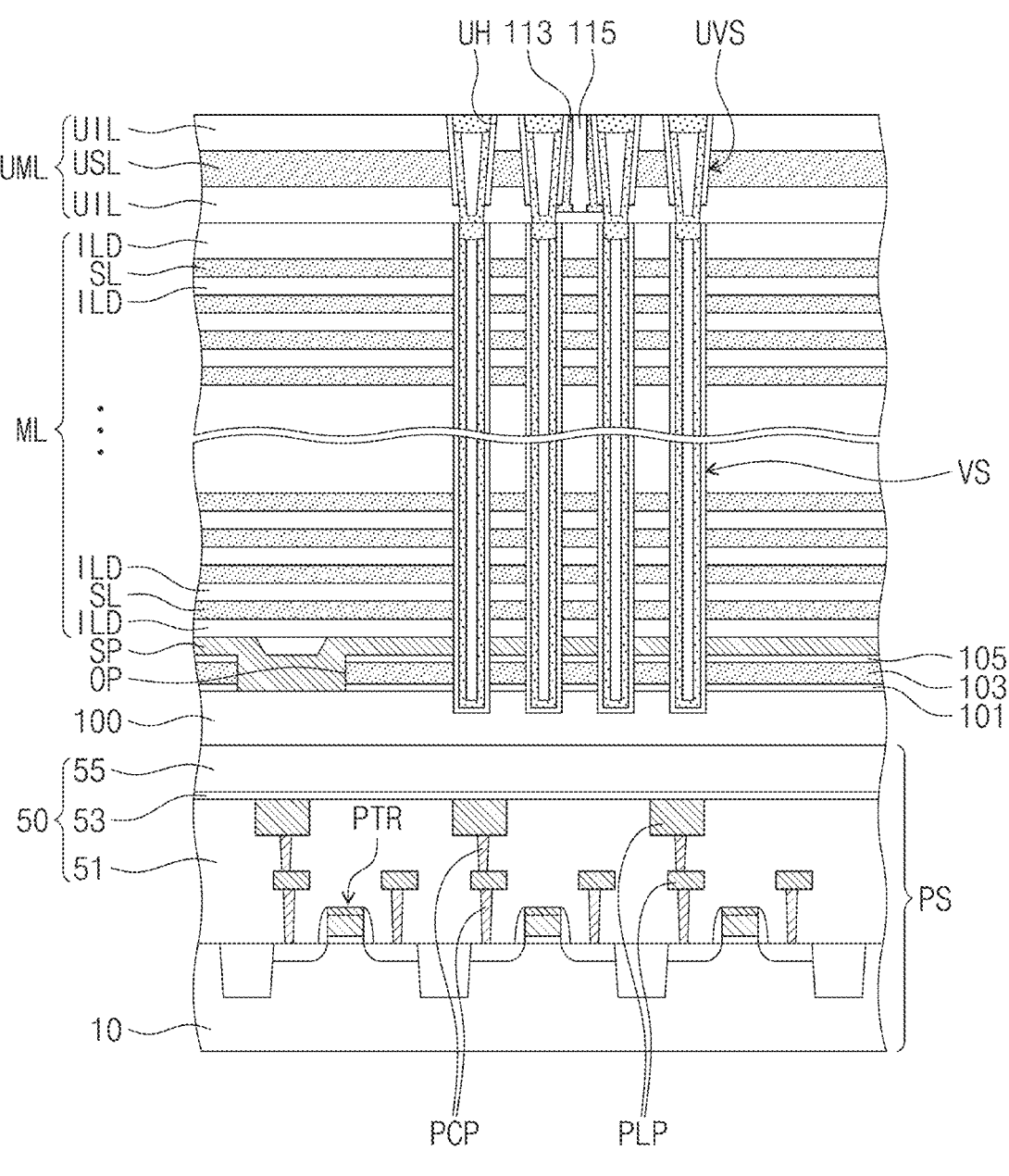

Referring to FIG. 27, the second sidewall sacrificial layer 111 may undergo an anisotropic etching process to form second sidewall sacrificial patterns 113 that cover opposite sidewalls of the upper isolation trench 110a. The second sidewall sacrificial patterns 113 may partially surround sidewalls of the upper vertical structures UVS exposed to the upper isolation trench 110a.

After the formation of the second sidewall sacrificial patterns 113, the upper isolation trench 110a may be filled with an isolation dielectric pattern 115. The isolation dielectric pattern 115 may include the same dielectric material as that of the upper dielectric layers UIL.

Figure 28:
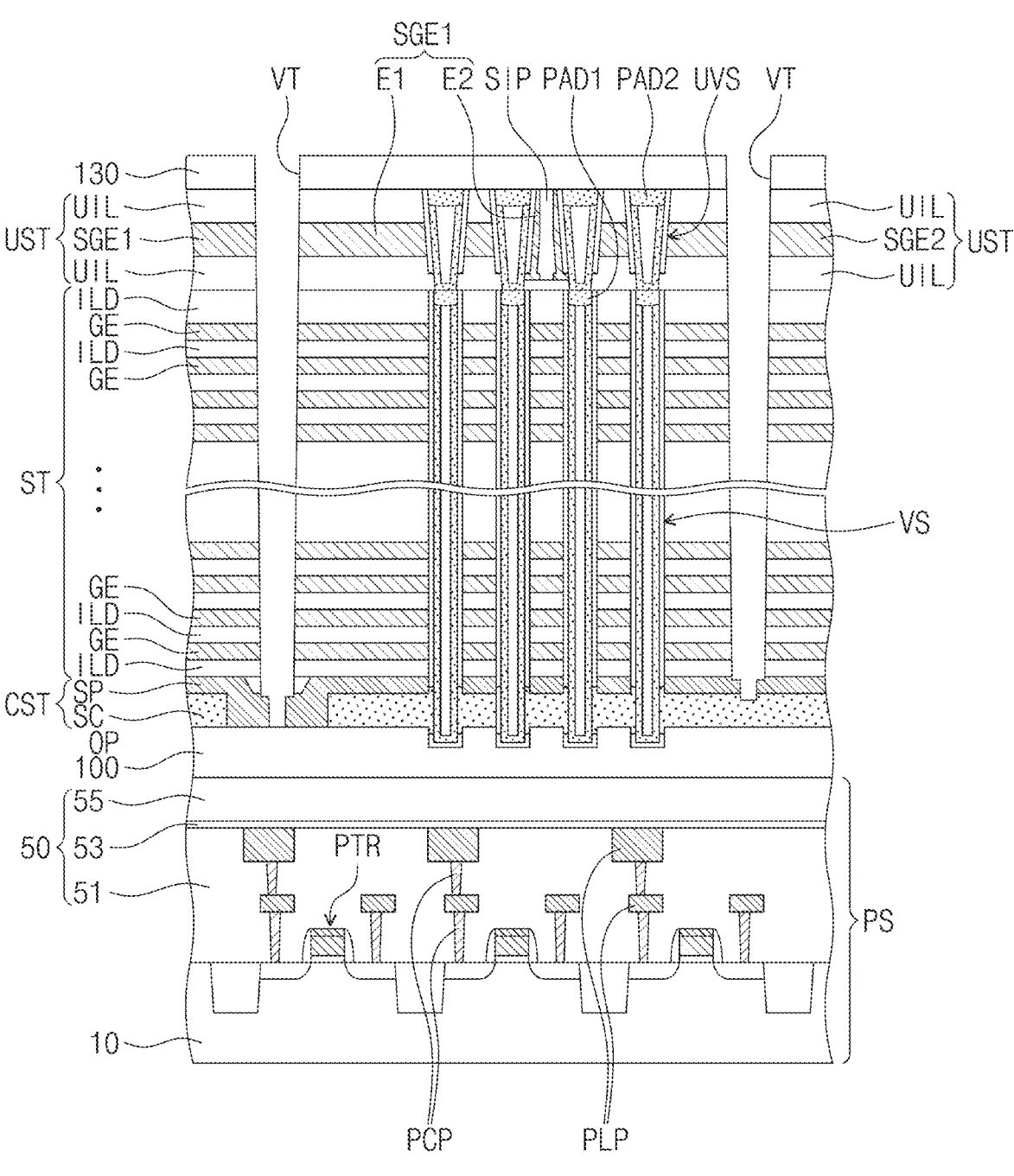

Referring to FIGS. 5 and 28, as discussed above with reference to FIG. 18, separation trenches VT may be formed to penetrate the mold structure ML and to expose the support semiconductor pattern SP, and a first replacement process may be performed to replace the first, second, and third dielectric layers 101, 103, and 105 with a source semiconductor pattern SC.

After the formation of the source semiconductor pattern SC, the sacrificial layers SL may be replaced with gate electrodes GE, and a second replacement process may be performed to replace the upper sacrificial layers USL with selection gate electrodes SGE1 and SGE2.

The second replacement process, or the formation of the selection gate electrodes SGE1 and SGE2, may include forming a selection gate region by isotropically etching the upper sacrificial layer USL and the second sidewall sacrificial patterns 113 exposed to the isolation trenches VT, and sequentially forming a horizontal dielectric layer and a gate conductive layer in the selection gate region. The selection gate regions may expose portions of a sidewall of the upper isolation structure SIP.

After the formation of the selection gate electrodes SGE1 and SGE2, as shown in FIG. 22, there may be formed interlayer dielectric layers 130 to 160, lower and upper contact plugs BCTa and BCTb, and bit lines BIL.

Figure 29:
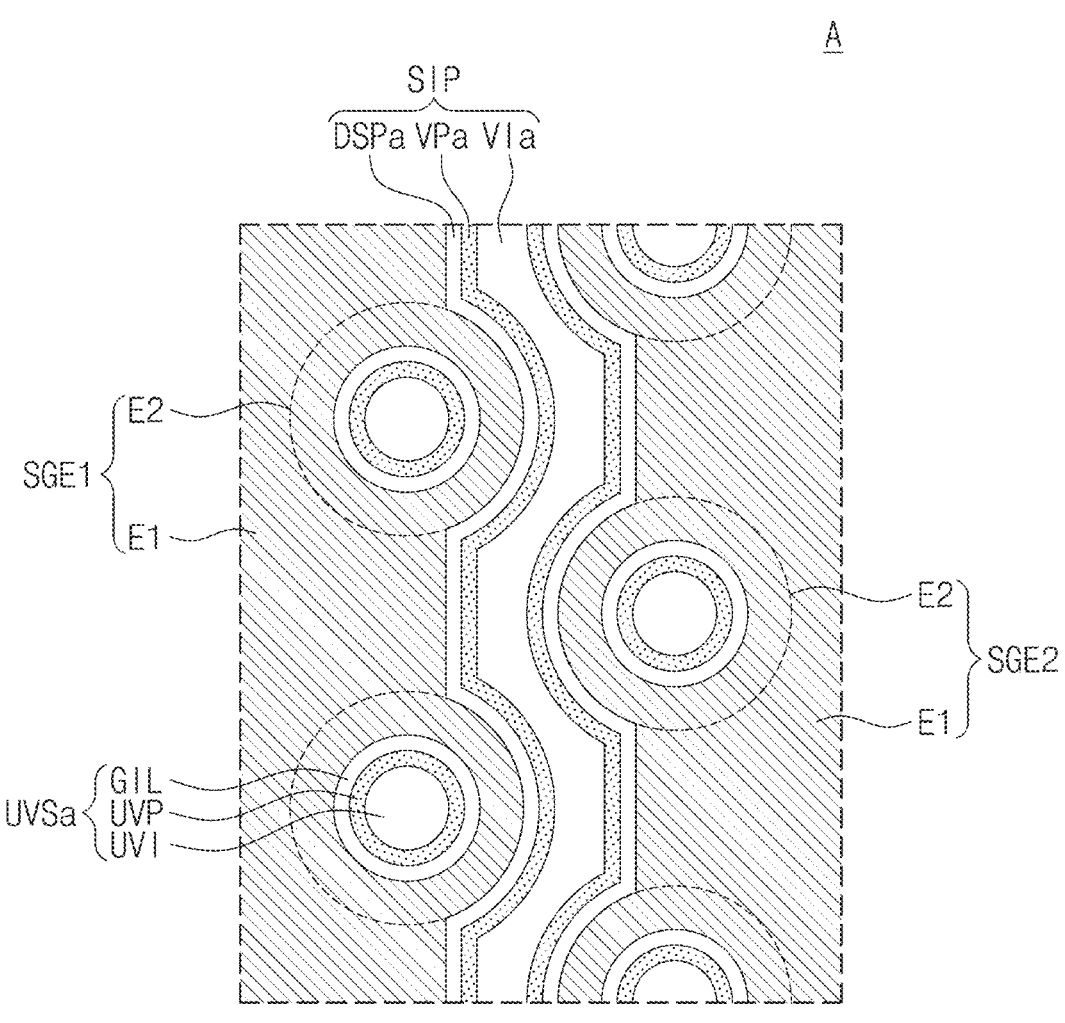
FIG. 29 illustrates an enlarged view showing section A of FIG. 5.
Figure 30:
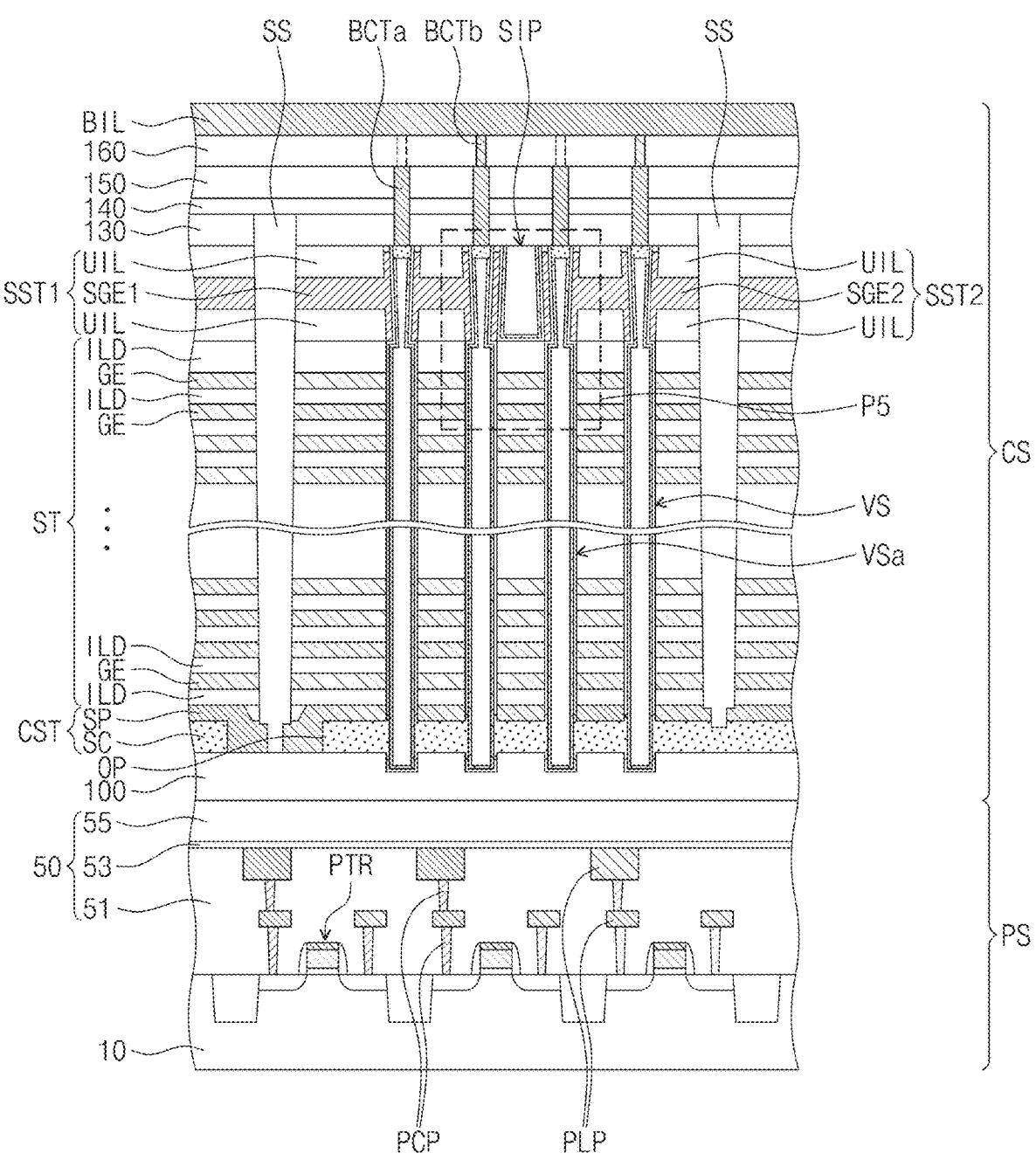
FIG. 30 illustrates a cross-sectional view taken along line A-A' of FIG. 5, showing a semiconductor device according to some embodiments of inventive concepts.

FIG. 29 illustrates an enlarged view showing section A of FIG. 5. FIG. 30 illustrates a cross-sectional view taken along line A-A' of FIG. 5, showing a semiconductor device according to some embodiments of inventive concepts. FIGS. 31A to 31E illustrate enlarged views of section P6 depicted in FIG. 30, showing a semiconductor device according to some embodiments of inventive concepts.

For brevity of description, the same reference numerals refer to substantially the same technical features as those discussed above with reference to FIGS. 5, 6, 7, and 8A to 8E, and their explanations may be omitted.

Referring to FIGS. 5, 29, and 30, the stack structure ST may be provided thereon with the selection structures SST1 and SST2 that are disposed spaced apart from each other in the second direction D2 parallel to the top surface of the semiconductor substrate 10. The selection structures SST1 and SST2 may respectively include the selection gate electrodes SGE1 and SGE2. The selection gate electrodes SGE1 and SGE2 may include a different conductive material from that of the gate electrodes GE of the stack structure ST. For example, the gate electrodes GE may include a metallic material, and the selection gate electrodes SGE1 and SGE2 may include impurity-doped polysilicon.

Figure 31A:
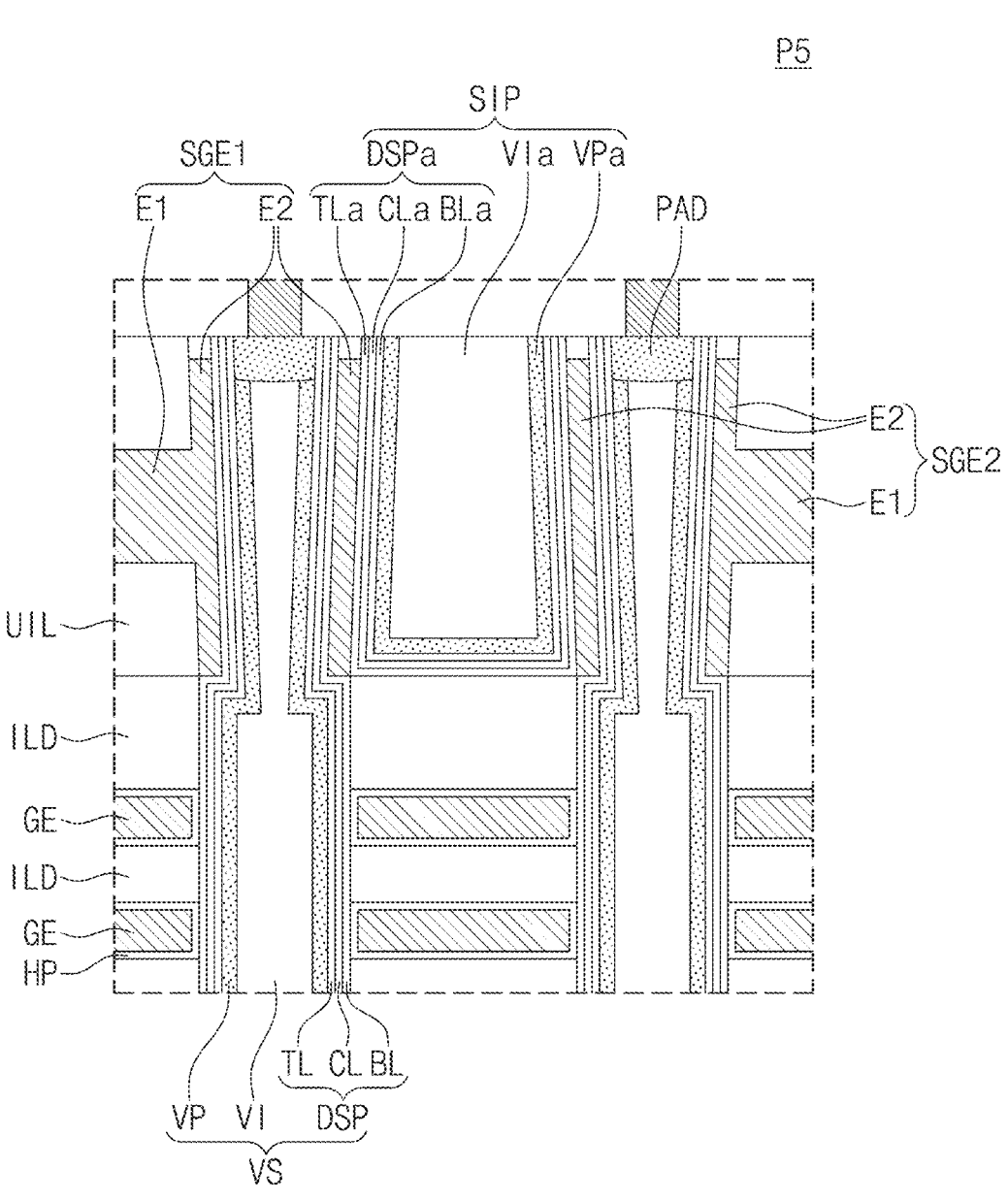
FIGS. 31A to 31E illustrate enlarged views of section P6 depicted in FIG. 30, showing a semiconductor device according to some embodiments of inventive concepts.
Figure 31B:
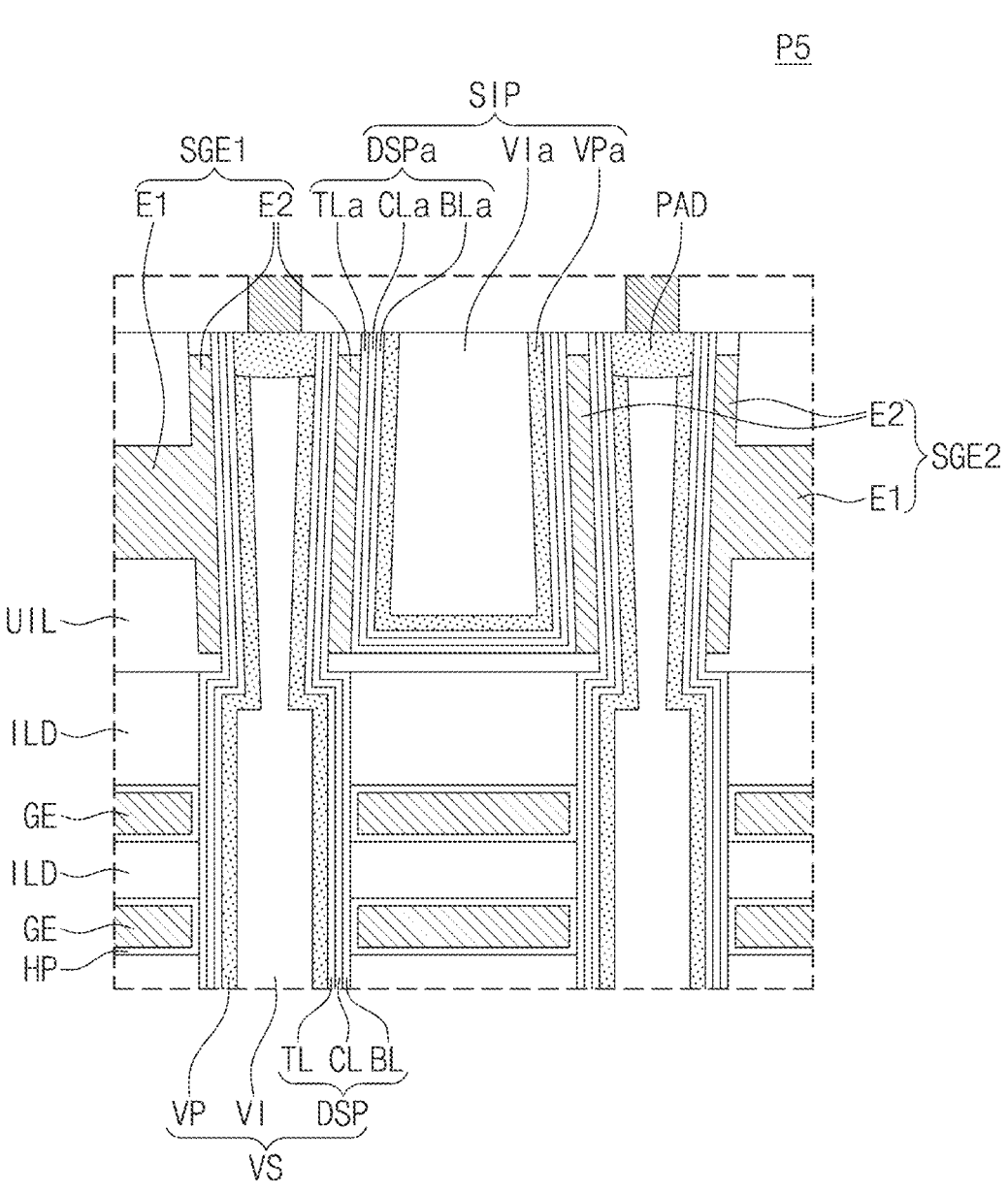

Referring to FIG. 31A, each of the first and second selection gate electrodes SGE1 and SGE2 may include a line part E1 that extends in the first direction D1, and may also include electrode parts E2 that connect with the line part E1 and surround vertical structures VS. Each electrode part E2 may completely surround an upper portion of the vertical structure VS that corresponds thereto. The electrode parts E2 may have their top surfaces located at a higher level than that of a top surface of the line part E1, and may also have bottom surfaces located at a lower level than that of a bottom surface of the line part E1. The top surfaces of the electrode parts E2 may be located at a lower level than that of a top surface of the vertical structure VS. For example, the top surfaces of the electrode parts E2 may be vertically spaced apart from the lower contact plug BCTa. As shown in FIG. 31A, the bottom surfaces of the electrode parts E2 may be located at substantially the same level as that of a top surface of an uppermost dielectric layer ILD or that of a bottom surface of an uppermost upper dielectric layer UIL. Alternatively, as shown in FIG. 31B, the bottom surfaces of the electrode parts E2 may be vertically spaced apart from the top surface of the uppermost dielectric layer ILD or from the bottom surface of the lowermost upper dielectric layer UIL.

For each of the first and second selection gate electrodes SGE1 and SGE2, the line part E1 may have top and bottom surfaces in direct contact with the upper dielectric layers UIL. In addition, each of the electrode parts E2 may be in direct contact with the data storage pattern DSP of the vertical structure VS.

According to some embodiments, the vertical structures VS may continuously penetrate the selection structures SST1 and SST2 and the stack structure ST. As shown in FIG. 31A, each of the vertical structures VS may include a channel pattern VP, a data storage pattern DSP, and a buried dielectric pattern VI.

In the present embodiment, the selection gate electrodes SGE1 and SGE2 may surround an upper portion of the channel pattern VP. A conductive pad PAD may be provided at or on a top end of the channel pattern VP. The data storage pattern DSP may continuously extend from a space between the channel pattern VP and the selection gate electrode SGE1 or SGE2 toward a space between the channel pattern VP and the gate electrodes GE.

The upper isolation structure SIP may be provided between the first and second selection structures SST1 and SST2. The upper isolation structure SIP, as discussed above, may extend along the first direction D1.

Referring back to FIG. 31A, the upper isolation structure SIP may include an upper tunnel dielectric pattern TLa, an upper charge storage pattern CLa, an upper blocking dielectric pattern BLa, an upper channel pattern VPa, and an upper buried dielectric pattern VIa. The upper tunnel dielectric pattern TLa, the upper charge storage pattern CLa, the upper blocking dielectric pattern BLa, and the upper channel pattern VPa may each have a cross-section that is substantially shaped like U.

The upper tunnel dielectric pattern TLa, the upper charge storage pattern CLa, the upper blocking dielectric pattern BLa, and the upper channel pattern VPa may be disposed between the first selection gate electrode SGE1 and the upper buried dielectric pattern VIa and between the second selection gate electrode SGE2 and the upper buried dielectric pattern VIa.

The upper tunnel dielectric pattern TLa, the upper charge storage pattern CLa, and the upper blocking dielectric pattern BLa may be patterns formed of the same material as that of the data storage pattern DSP of the vertical structure VS. The upper channel pattern VPa may be formed of the same material as that of the channel pattern VP of the vertical structure VS.

Figure 31C:
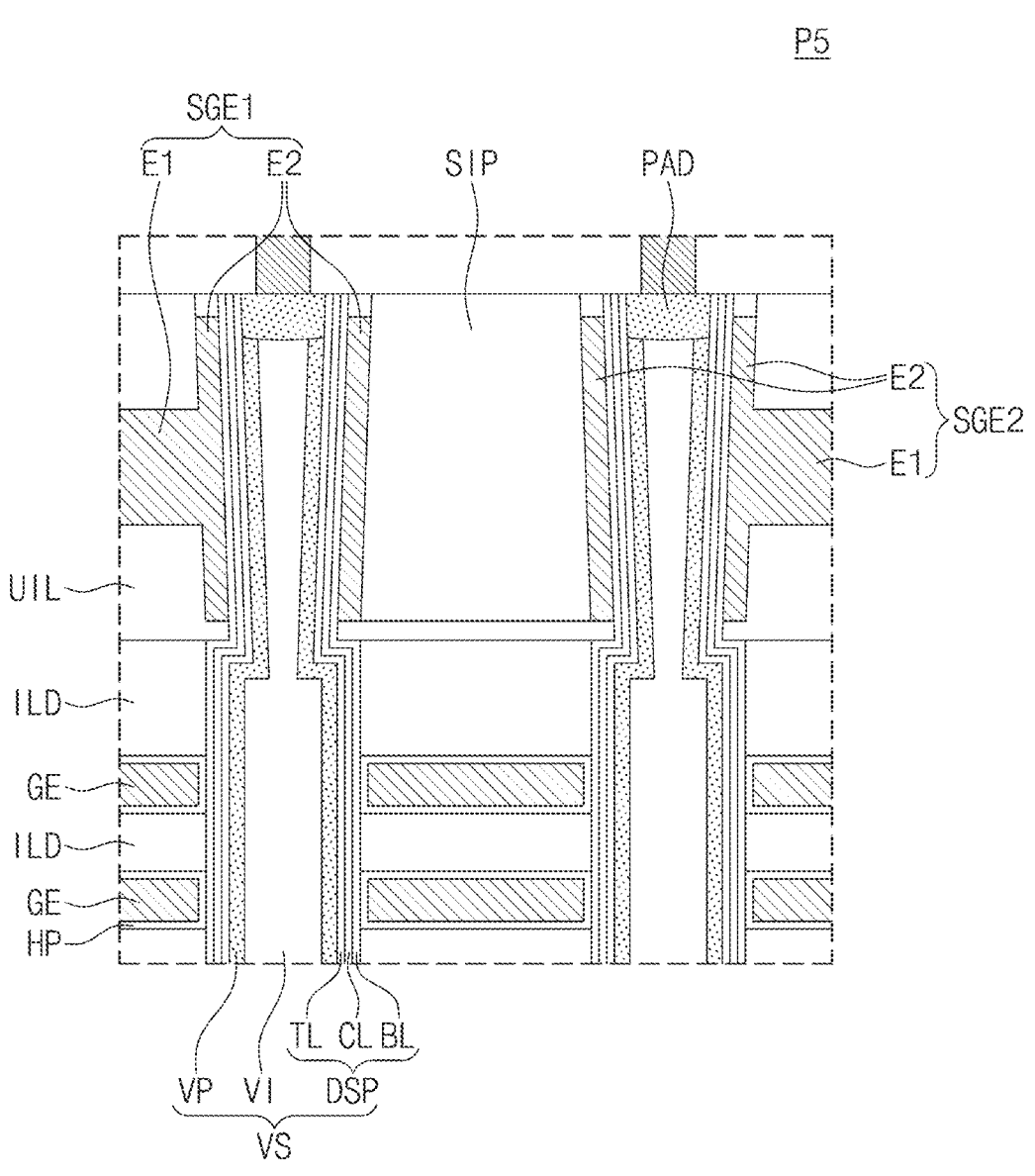

According to the embodiment shown in FIG. 31C, the upper isolation structure SIP may be formed of a single layer and may include the same dielectric material as that of the upper dielectric layers UIL.

Figure 31D:
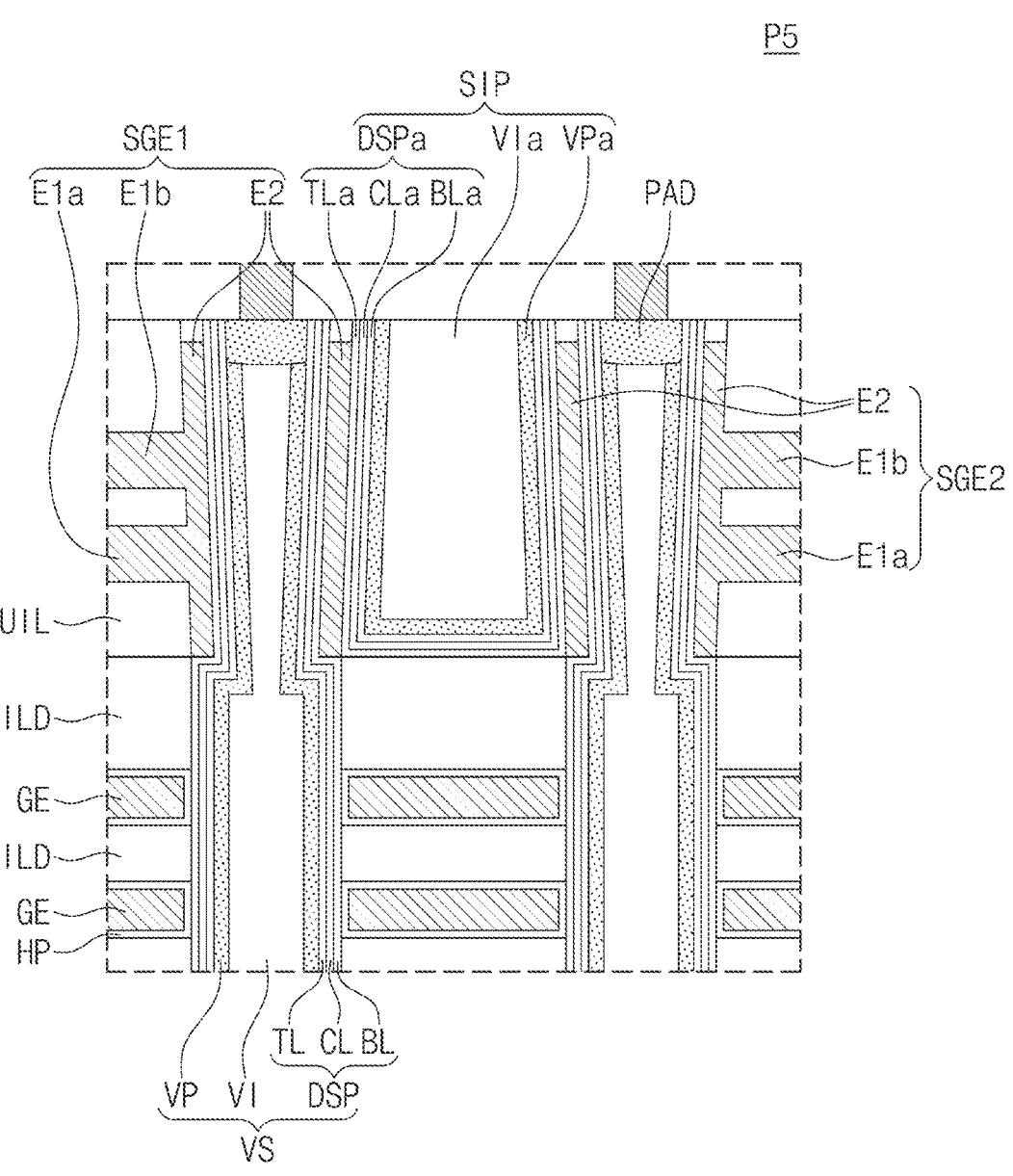
Figure 31E:
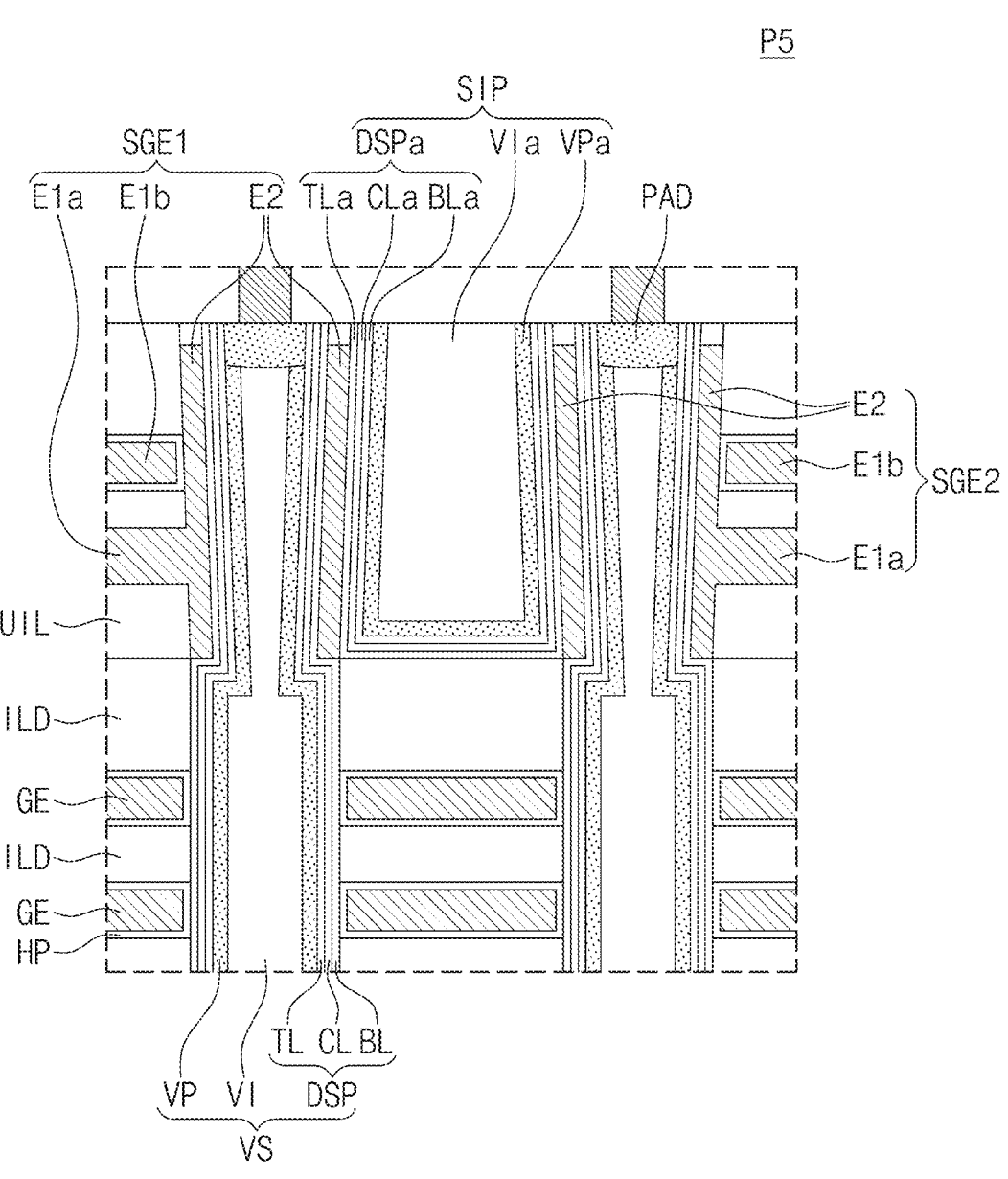

Referring to FIGS. 31D and 31E, each of the selection gate electrodes SGE1 and SGE2 may include first and second line parts E1a and E1b that are vertically stacked with the upper dielectric layers UIL therebetween, and may also include an electrode part E2 that connects the first and second line parts E1a and E1b to each other.

In the embodiment shown in FIG. 31D, the first and second line parts E1a and E1b and the electrode part E2 may be integrally formed into a single layer. Alternatively, in the embodiment shown in FIG. 31E, the first and second line parts E1a and E1b may include different conductive materials from each other. For example, the first line part E1a and the electrode part E2 may be formed of an impurity-doped polysilicon layer, and the second line part E1b may include a metallic material the same as that of the gate electrodes GE of the stack structure ST. For another example, the first line part E1a may be formed of an impurity-doped polysilicon layer, and the second line part E1b and the electrode part E2 may include a metallic material the same as that of the gate electrodes GE of the stack structure ST.

When the second line part E1b includes a metallic material, as shown in FIG. 31D, a second horizontal dielectric pattern UHP may be provided to surround the second line part E1b.

FIGS. 32 to 38 illustrate cross-sectional views taken along line A-A' of FIG. 5, showing a method of fabricating a semiconductor device according to some embodiments of inventive concepts. The same technical features as those of the fabrication methods discussed above may be omitted in the interest of brevity of description.

Figure 32:
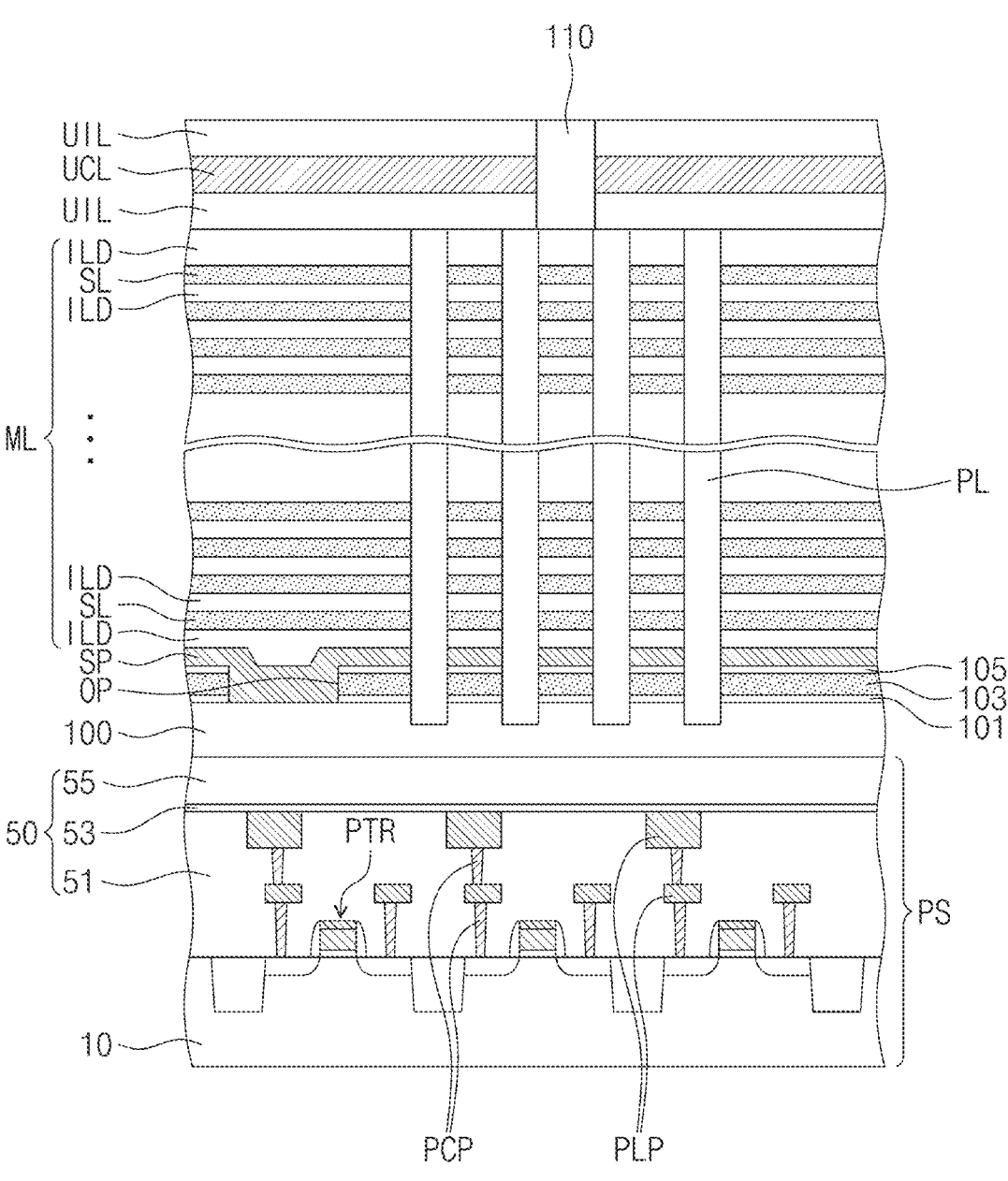
FIGS. 32 to 38 illustrate cross-sectional views taken along line A-A' of FIG. 5, showing a method of fabricating a semiconductor device according to some embodiments of inventive concepts.

Referring to FIGS. 5 and 32, as discussed with reference to FIG. 13, a mold structure ML may be formed on the peripheral circuit structure PS, and thereafter sacrificial pillars P1 may be formed to penetrate the mold structure ML.

The sacrificial pillars PL may be arranged in a zigzag shape along the first direction D1. The sacrificial pillars PL may fill channel holes that penetrate the mold structure ML. The sacrificial pillars PL may be formed of a material having an etch selectivity with respect to the sacrificial layers SL and the dielectric layers ILD. For example, the sacrificial pillars PL may be formed of a semiconductor material, such as silicon or germanium.

After the formation of the sacrificial pillars PL, upper dielectric layers UIL and at least one upper conductive layer UCL may be alternatively stacked on the mold structure ML. The upper conductive layer UCL may be, for example, an impurity-doped polysilicon layer. Alternatively, a plurality of upper conductive layers UCL may be stacked, and the upper dielectric layer UIL may be interposed between the upper conductive layers UCL.

Thereafter, a line-shaped sacrificial isolation pattern 110 may be formed to extend in the first direction D1 while penetrating the upper conductive layer UCL. The sacrificial isolation pattern 110 may be formed of a material having an etch selectivity with respect to the upper conductive layer UCL and the upper dielectric layer UIL. The sacrificial isolation pattern 110 may be formed of the same material as that of the sacrificial pillars PL. The sacrificial isolation pattern 110 may be disposed over two sacrificial pillars PL that are adjacent to each other on a central region of the mold structure ML.

Figure 33:
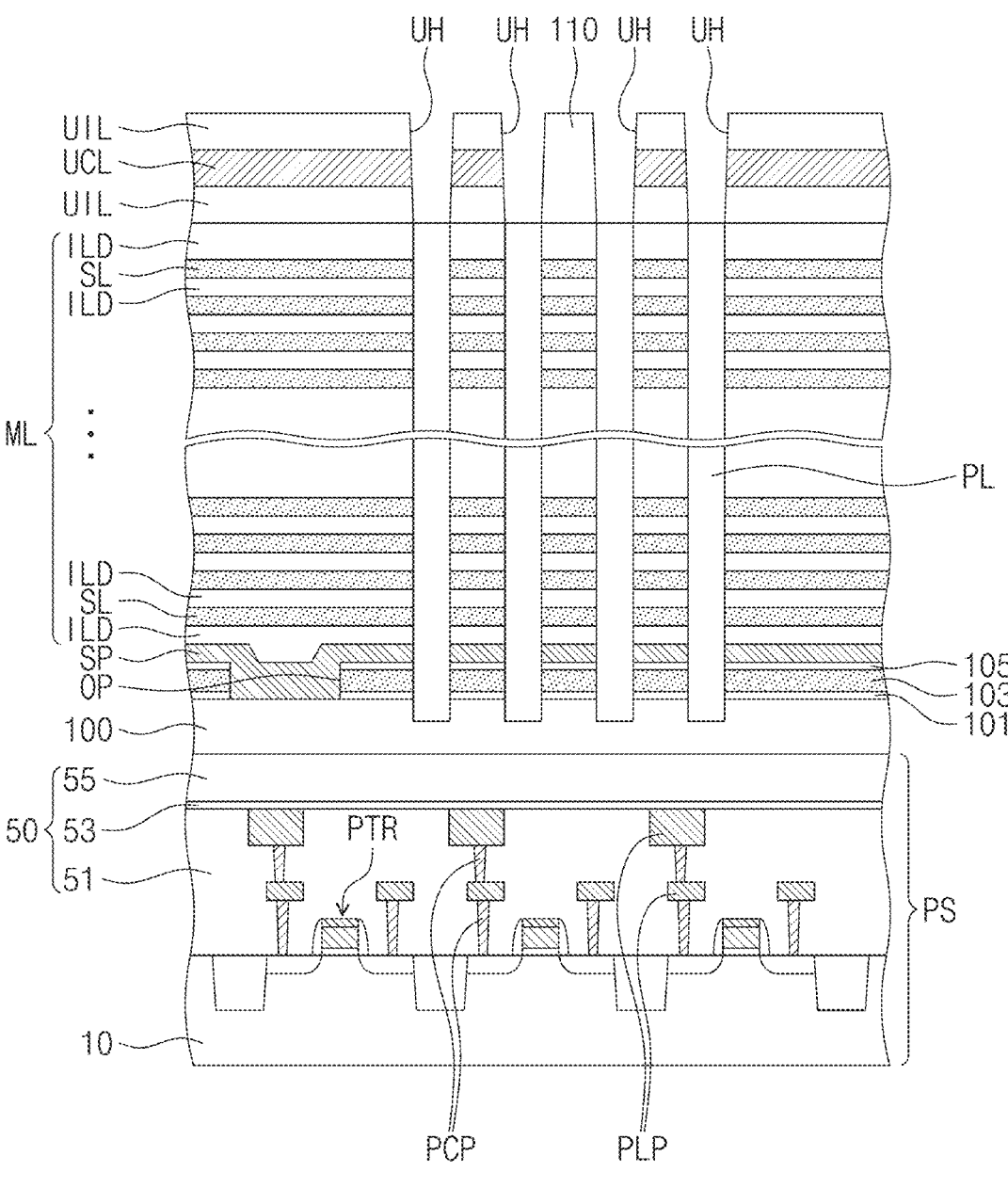

Referring to FIGS. 5 and 33, upper holes UH may be formed to penetrate the upper dielectric layers UIL and the upper conductive layer UCL. The upper holes UH may be formed corresponding to the sacrificial pillars PL. The upper holes UH may expose top surfaces of the sacrificial pillars PL. When the upper holes UH are formed, portions of the upper holes UH may penetrate a portion of the sacrificial isolation pattern 110.

Figure 34:
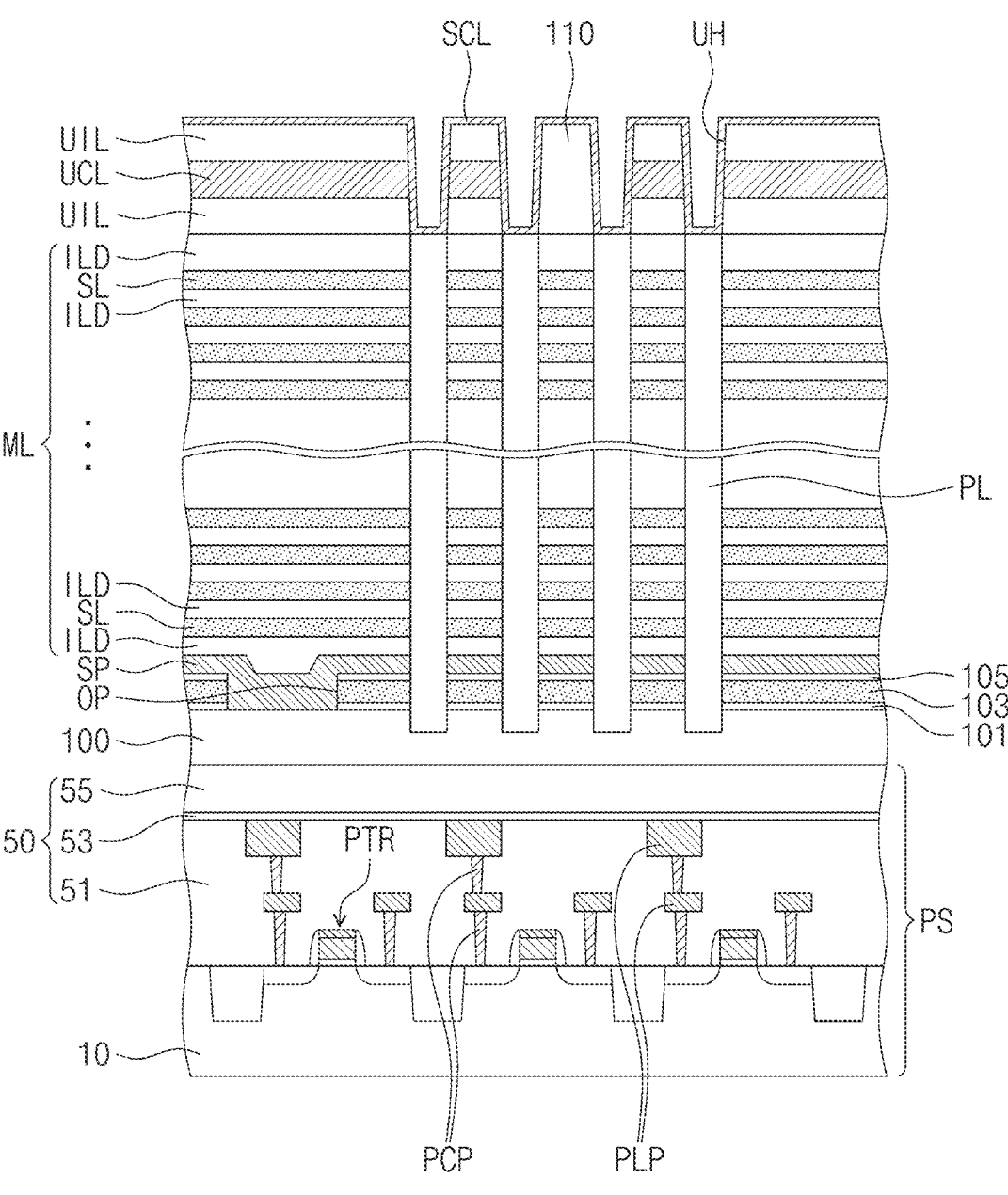

Referring to FIGS. 5 and 34, a sidewall conductive layer SCL may be formed to conformally cover inner walls of the upper holes UH. The sidewall conductive layer SCL may be formed of the same conductive material as that of the upper conductive layer UCL. The sidewall conductive layer SCL may have a regular thickness that covers sidewalls and bottom surfaces of the upper holes UH.

Figure 35:
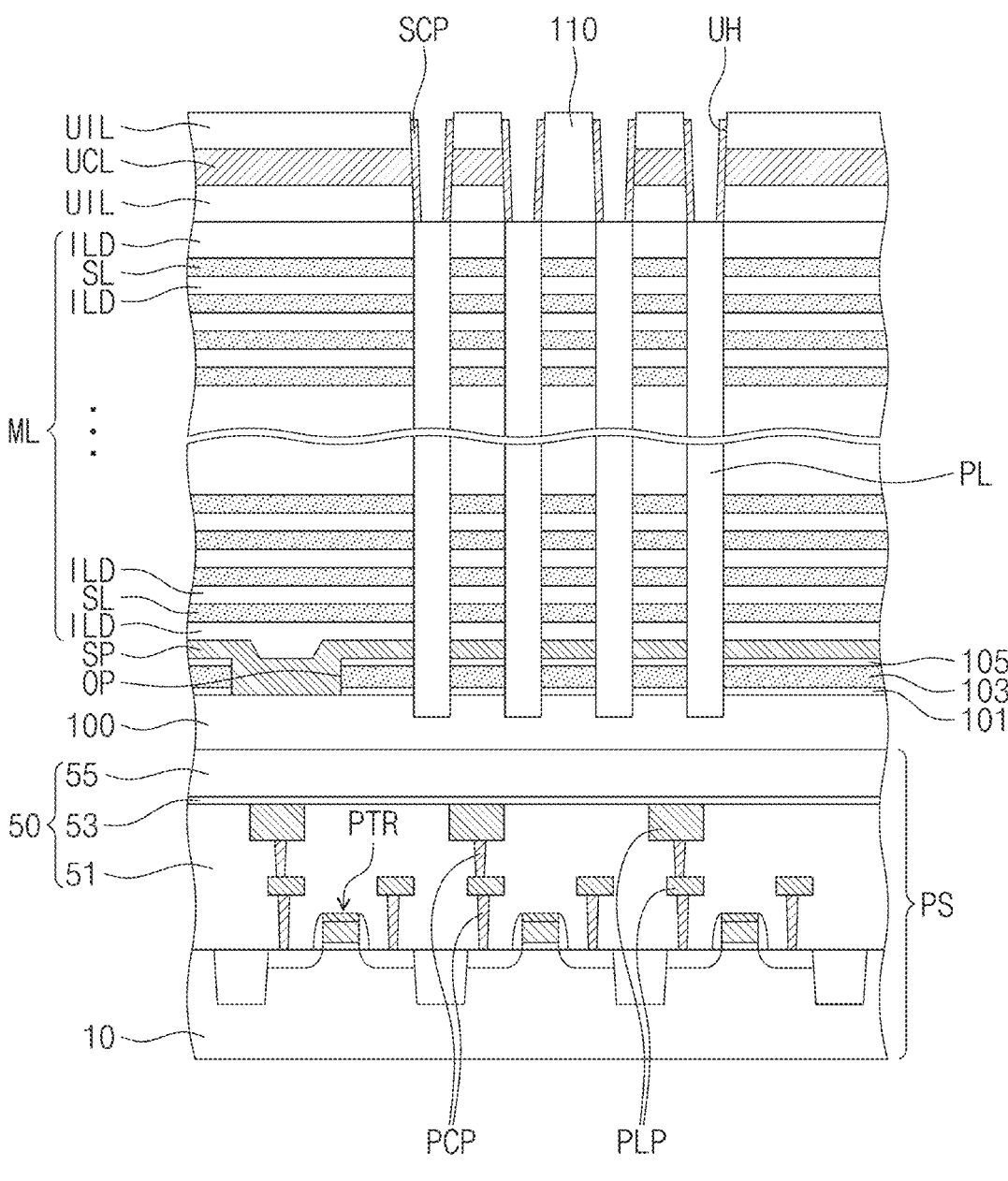

Referring to FIGS. 5 and 35, the sidewall conductive layer SCL may undergo an anisotropic etching process to form sidewall conductive patterns SCP that cover the sidewalls of the upper holes UH. The formation of the sidewall conductive patterns SCP may expose top surfaces of the sacrificial pillars PL.

Figure 36:
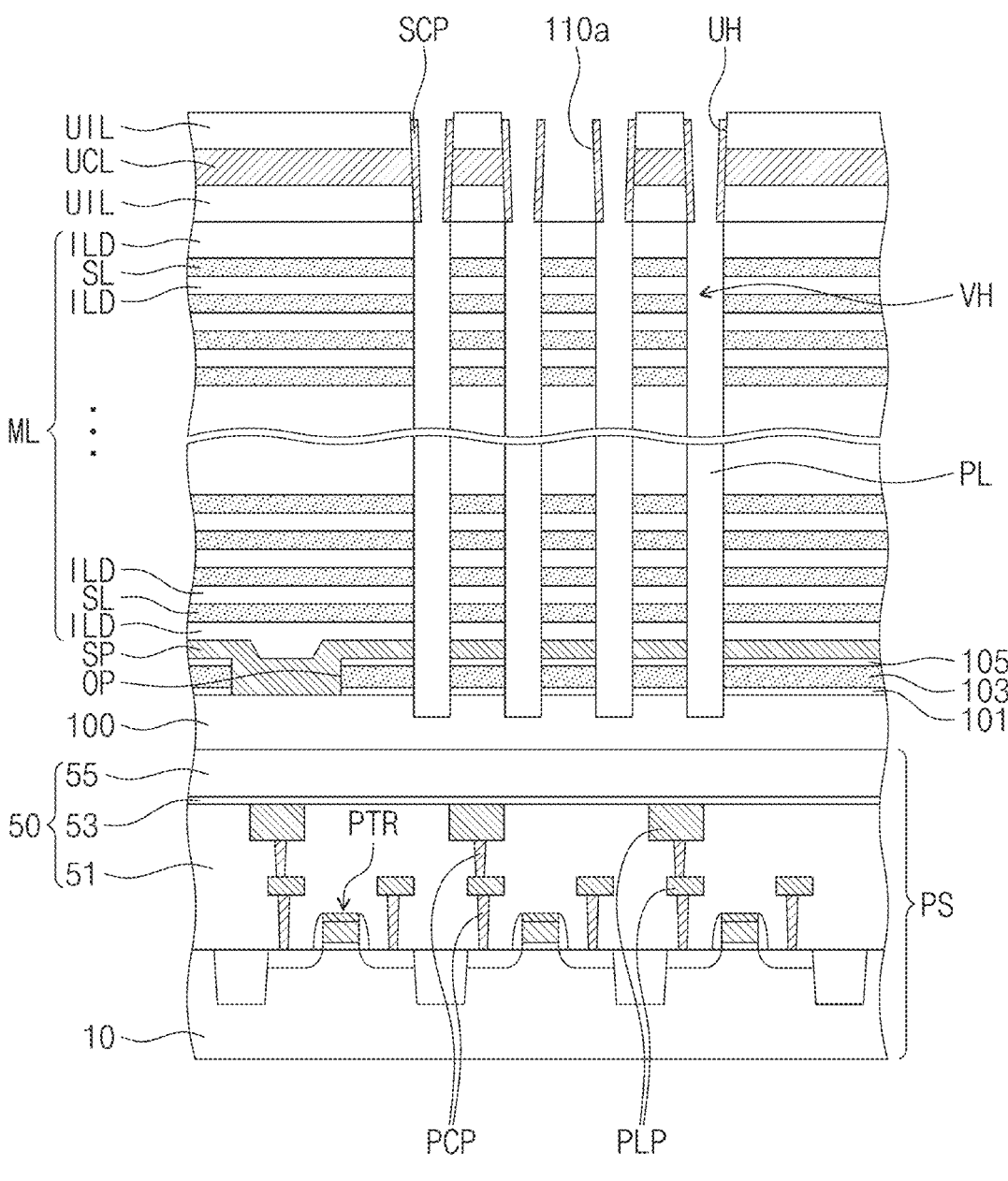

Referring to FIGS. 5 and 36, an etching process may be performed to remove the sacrificial pillars PL which are exposed by the sidewall conductive patterns SCP. Therefore, vertical holes VH may be formed which expose sidewalls of the sacrificial layers SL of the mold structure ML.

According to some embodiments, the sacrificial isolation pattern 110 may also be etched during the etching process for removing the sacrificial pillars PL. Therefore, an upper isolation trench 110a may be formed.

Figure 37:
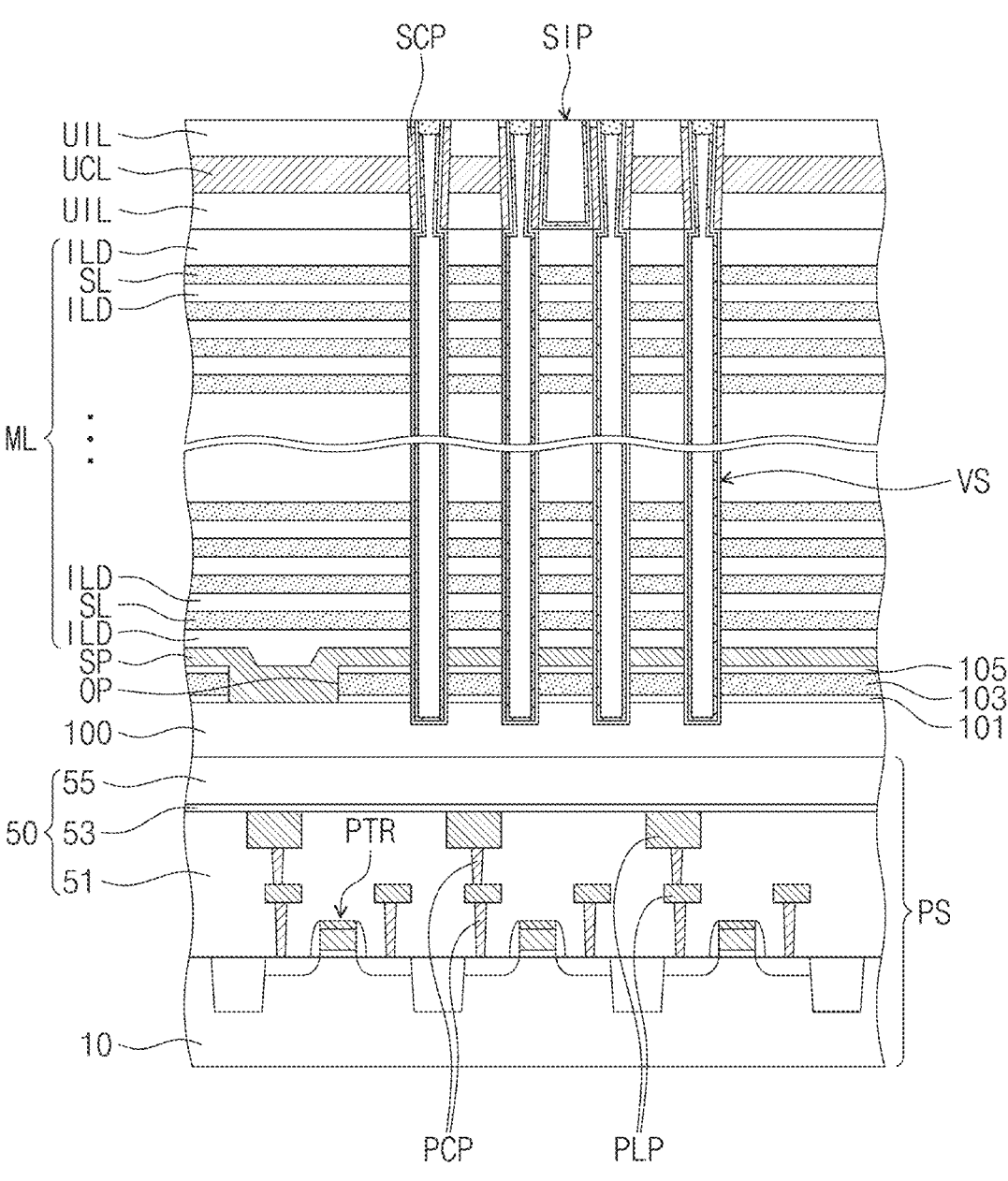

Referring to FIGS. 5 and 37, a data storage pattern (see DSP of FIG. 31A) and a channel pattern (see VP of FIG. 31A) may be sequentially formed in the vertical holes VH. In addition, bit-line conductive pads (see PAD of FIG. 31A) may be formed at or on top ends of the channel patterns VP. Therefore, vertical structures VS may be formed in the vertical holes VH.

According to some embodiments, while the vertical structures VS are formed, an upper isolation structure SIP may be formed in the upper isolation trench 110a. The upper isolation structure SIP may be formed of a portion of the data storage pattern (see DSP of FIG. 31A) and a portion of the channel pattern (see VP of FIG. 31A).

Figure 38:
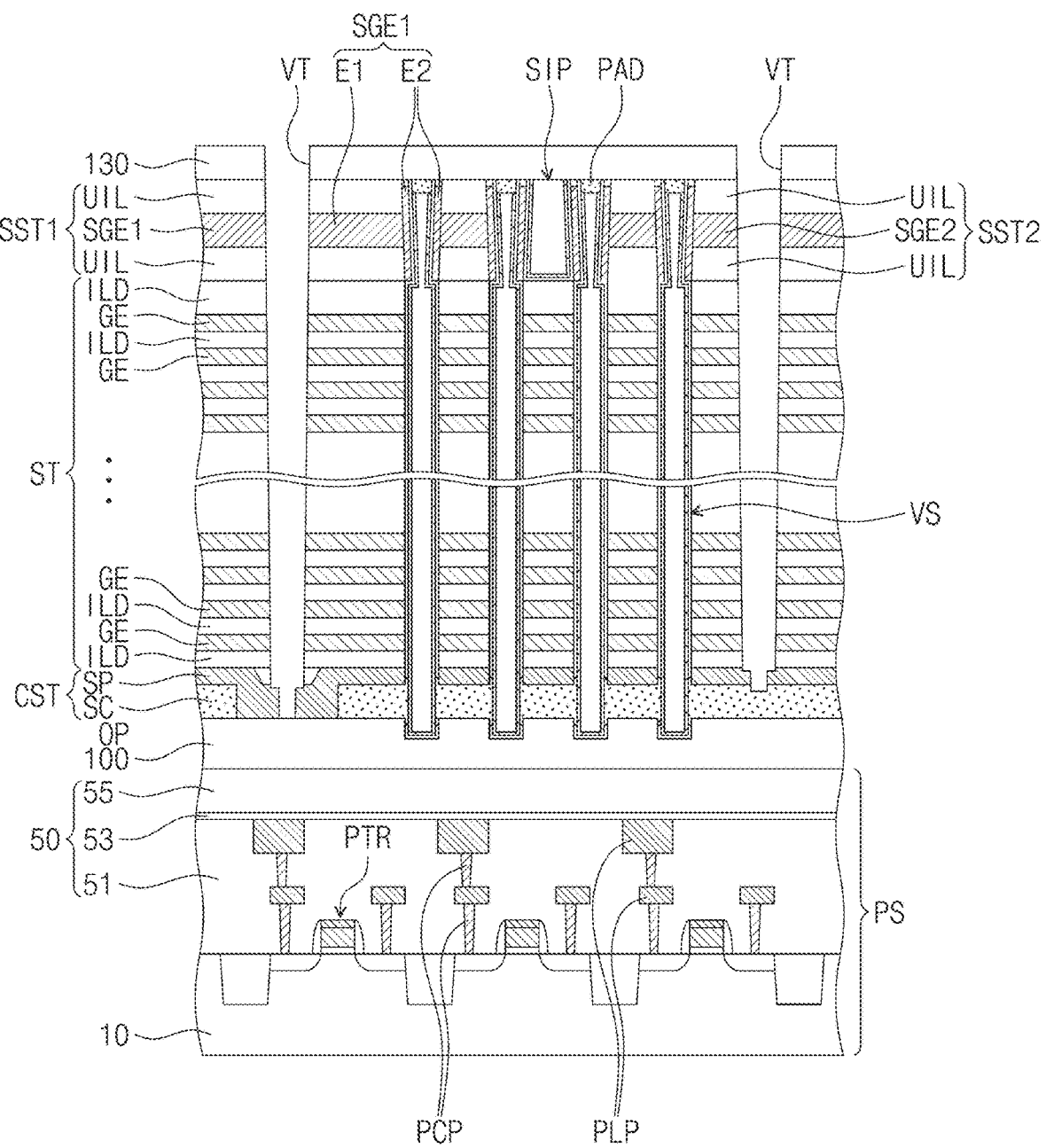

Referring to FIGS. 5 and 38, after the formation of the vertical structures VS are formed, a first interlayer dielectric layer 130 may be formed on the upper dielectric layer UIL to cover the selection structures SST1 and SST2.

Afterwards, separation trenches VT may be formed to penetrate the selection structures SST1 and SST2 and to expose the support semiconductor pattern SP. After the formation of the separation trenches VT, a first replacement process may be performed to replace the first, second, and third dielectric layers 101, 103, and 105 with a source semiconductor pattern SC, and a second replacement process may be performed to replace the sacrificial layers SL with gate electrodes GE.

And then, as shown in FIG. 30, there may be formed interlayer dielectric layers 130 to 160, lower and upper contact plugs BCTa and BCTb, and bit lines BIL.

Figure 39:
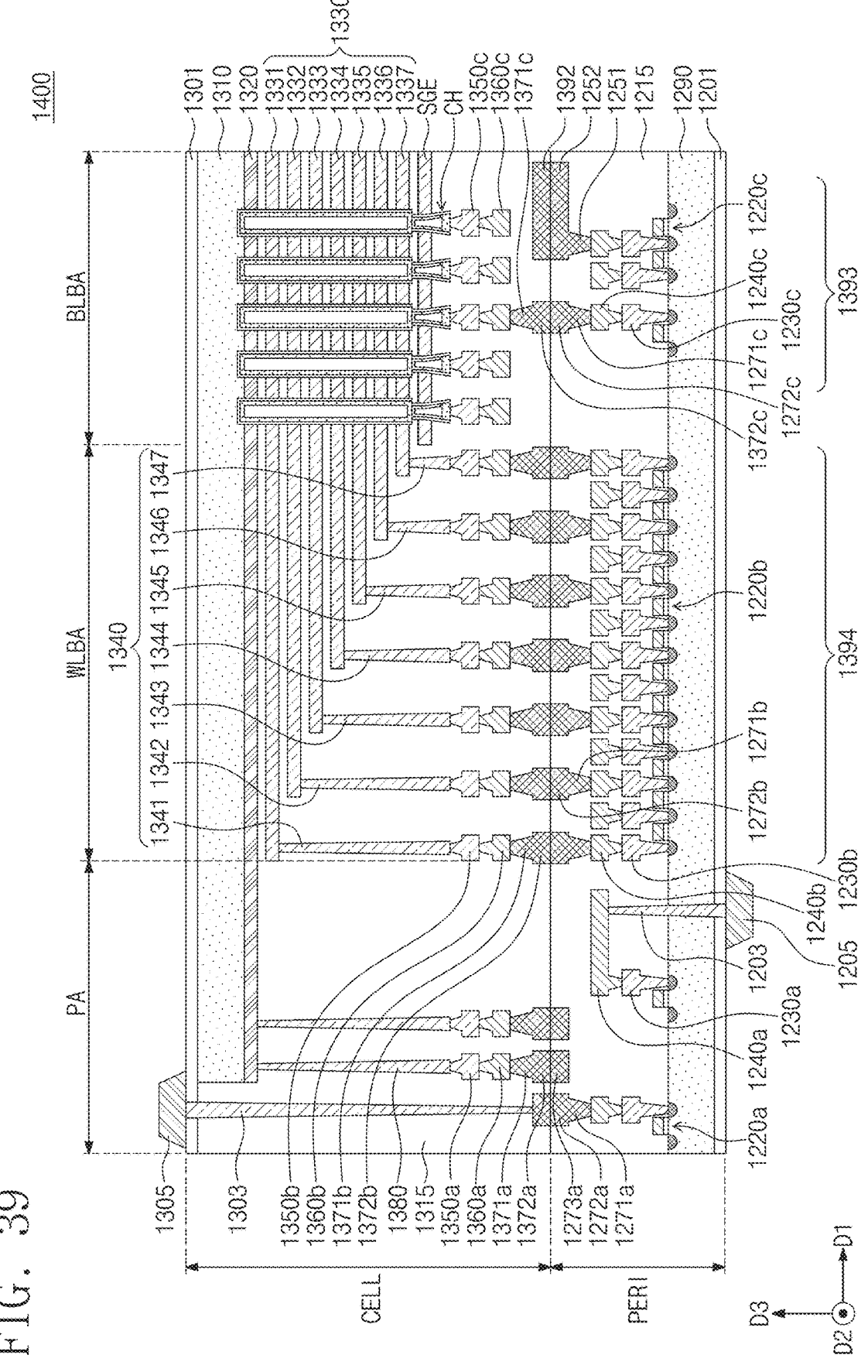
FIG. 39 illustrates a cross-sectional view showing a semiconductor device according to some embodiments of inventive concepts.

FIG. 39 illustrates a cross-sectional view showing a semiconductor device according to some embodiments of inventive concepts.

According to the embodiment of FIG. 39, differently from the embodiments discussed above, a bonding method may be used to electrically connect a peripheral circuit structure to a cell array structure.

Referring to FIG. 39, a semiconductor device 1400 may have a chip-to-chip (C2C) structure. The chip-to-chip (C2C) structure may be fabricated by forming on a first wafer an upper chip including a cell array structure CELL; forming, on a second wafer different from the first wafer, a lower chip including a peripheral circuit structure PERI; and then using a bonding method to connect the upper and lower chips to each other. For example, the bonding method may indicate a way that electrically connects a bonding metal formed an uppermost metal layer of the upper chip to a bonding metal formed on an uppermost metal layer of the lower chip. For example, when the bonding metal is formed of copper (Cu), the bonding method may be a Cu-to-Cu bonding method, and the bonding metal may be formed of aluminum (Al) or tungsten (W). Each of the peripheral circuit structure PERI and the cell array structure CELL of the semiconductor device 1400 may include an outer pad bonding area PA, a word-line bonding area WLBA, and a bit-line bonding area BLBA.

The peripheral circuit structure PERI may include a first substrate 1290, an interlayer dielectric layer 1215, a plurality of circuit elements 1220*a*, 1220*b*, and 1220*c* formed on the first substrate 1290, first metal layers 1230*a*, 1230*b*, and 1230*c* respectively connected to the plurality of circuits elements 1220*a*, 1220*b*, and 1220*c*, and second metal layers 1240*a*, 1240*b*, and 1240*c* respectively formed on the first metal layers 1230*a*, 1230*b*, and 1230*c*. In some embodiments, the first metal layers 1230*a*, 1230*b*, and 1230*c* may be formed of tungsten whose electrical resistivity is relatively higher, and the second metal layers 1240*a*, 1240*b*, and 1240*c* may be formed of copper whose electrical resistivity is relatively lower.

The first metal layers 1230*a*, 1230*b*, and 1230*c* and the second metal layers 1240*a*, 1240*b*, and 1240*c* are illustrated and explained in this description, but inventive concepts are not limited thereto, and one or more metal layers may further be formed on the second metal layers 1240*a*, 1240*b*, and 1240*c*. At least one of the metal layers formed on the second metal layers 1240*a*, 1240*b*, and 1240*c* may be formed of aluminum whose electrical resistivity is less than that of copper used for forming the second metal layers 1240*a*, 1240*b*, and 1240*c*.

The interlayer dielectric layer 1215 may be disposed on the first substrate 1290 so as to cover the plurality of circuit elements 1220*a*, 1220*b*, and 1220*c*, the first metal layers 1230*a*, 1230*b*, and 1230*c*, and the second metal layers 1240*a*, 1240*b*, and 1240*c*, and may include a dielectric material, such as silicon oxide or silicon nitride.

A lower bonding metal 1271*b* and 1272*b* may be formed on the second metal layer 1240*b* of the word-line bonding area WLBA. On the word-line bonding area WLBA, the lower bonding metal 1271*b* and 1272*b* of the peripheral circuit structure PERI may be electrically bonded and connected to an upper bonding metal 1371*b* and 1372*b* of the cell array structure CELL, and the lower bonding metal 1271*b* and 1272*b* and the upper bonding metal 1371*b* and 1372*b* may be formed of aluminum, copper, or tungsten.

The cell array structure CELL may provide at least one memory block. The cell array structure CELL may include characteristics substantially the same as those of the cell array structures in the embodiments discussed above.

The cell array structure CELL may include a second substrate 1310 and a common source line 1320, or may include the source structure of the embodiments discussed above. The second substrate 1310 may be provided thereon with a plurality of word lines 1330 (or 1331 to 1338) along a vertical direction (third direction D3) with respect to a top surface of the second substrate 1310. String selection lines and a ground selection line may be respectively located on upper and lower portions of the word lines 1330, and the plurality of word lines 1330 may be located between the string selection lines and the ground selection line.

On the bit-line bonding area BLBA, a channel structure CH may extend in the vertical direction (third direction D3) with respect to the top surface of the second substrate 1310, and may penetrate the word lines 1330, the string selection lines, and the ground selection line. The channel structure CH may have characteristics substantially the same as those of the vertical structures discussed above.

The channel structure CH may include a lower vertical structure that penetrates the word lines 1330 and an upper vertical structure that penetrates the string selection line.

The channel structure CH may be electrically connected to a first metal layer 1350*c* and a second metal layer 1360*c*. For example, the first metal layer 1350*c* may be a bit-line contact, and the second metal layer 1360*c* may be a bit line. In some embodiment, the bit line 1360*c* may extend along a first direction D1 parallel to the top surface of the second substrate 1310.

In the embodiment shown in FIG. 39, the bit-line bonding area BLBA may be defined to refer to a zone where the channel structure CH and the bit line 1360*c* are located. On the bit-line bonding area BLBA, the bit lines 1360*c* may be electrically connected to the circuit elements 1220*c* that provide a page buffer 1393 on the peripheral circuit structure PERI. For example, the bit line 1360*c* may have connection with an upper bonding metal 1371*c* and 1372*c* on the peripheral circuit structure PERI, and the upper bonding metal 1371*c* and 1372*c* may have connection with a lower bonding metal 1271*c* and 1272*c* connected to the circuit elements 1220*c* of the page buffer 1393.

On the word-line bonding area WLBA, the word lines 1330 may extend along a second direction D2 parallel to the top surface of the second substrate 1310 while being perpendicular to the first direction D1, and may be connected to a plurality of cell contact lugs 1340 (or 1341 to 1347). The word lines 1330 and the cell contact plugs 1340 may be connected at pads that are at least portions of the word lines 1330 and that extend to have different lengths along the second direction D2. The first metal layer 1350*b* and the second metal layer 1360*c* may be sequentially connected to upper portions of the cell contact plugs 1340 connected to the word lines 1330. On the word-line bonding area WLBA, the cell contact plugs 1340 may be connected to the peripheral circuit structure PERI through the upper bonding metal 1371*b* and 1372*b* of the cell array structure CELL and through the lower bonding metal 1271*b* and 1272*b* of the peripheral circuit structure PERI.

The cell contact plugs 1340 may be electrically connected to the circuit elements 1220*b* that form a row decoder 1394 on the peripheral circuit structure PERI. In some embodiments, an operating voltage of the circuit elements 1220*b* that form the row decoder 1394 may be different from that of the circuit elements 1220*c* that form the page buffer 1393. For example, the operating voltage of the circuit elements 1220*c* that form the page buffer 1393 may be greater than that of the circuit elements 1220*b* that form the row decoder 1394.

A common source line contact plug 1380 may be disposed on an outer pad bonding area PA. The common source line contact plug 1380 may be formed of a conductive material, such as metal, metal compound, or polysilicon, and may be electrically connected to the common source line 1320. A first metal layer 1350*a* and a second metal layer 1360*a* may be sequentially stacked on an upper portion of the common source line contact plug 1380. For example, the outer pad bonding area PA may be defined to refer to zone on which are disposed the common source line contact plug 1380, the first metal layer 1350*a*, and the second metal layer 1360*a*.

Input/output pads 1205 and 1305 may be disposed on the outer pad bonding area PA. As illustrated in FIG. 39, a lower dielectric layer 1201 may be formed to cover a bottom surface of the first substrate 1290, and a first input/output pad 1205 may be formed on the lower dielectric layer 1201. The first input/output pad 1205 may be connected through a first input/output contact plug 1203 to at least one of the plurality of circuit elements 1220a, 1220b, and 1220c disposed on the peripheral circuit structure PERI, and the lower dielectric layer 1201 may separate the first input/output pad 1205 from the first substrate 1290. In addition, a sidewall dielectric layer may be disposed between the first input/output contact plug 1203 and the first substrate 1290, and may electrically separate the first input/output contact plug 1203 from the first substrate 1290.

Referring to FIG. 39, an upper dielectric layer 1301 may be formed to cover the top surface of the second substrate 1310, and a second input/output pad 1305 may be disposed on the upper dielectric layer 1301. The second input/output pad 1305 may be connected through a second input/output contact plug 1303 to at least one of the plurality of circuit elements 1220a, 1220b, and 1220c disposed on the peripheral circuit structure PERI. In some embodiments, the second input/output pad 1305 may be electrically connected to the circuit element 1220a.

In some embodiments, neither the second substrate 1310 nor the common source line 1320 may be located on an area where the second input/output contact plug 1303 is disposed. In addition, the second input/output pad 1305 may not overlap in the third direction D3 with the word lines 1330. As shown in FIG. 39, when viewed in a direction perpendicular to the top surface of the second substrate 1310, the second input/output contact plug 1303 may be separated from the second substrate 1310, and may penetrate an interlayer dielectric layer 1315 of the cell array structure CELL to come into connection with the second input/output pad 1305.

In some embodiments, the first input/output pad 1205 and the second input/output pad 1305 may be selectively formed. For example, the semiconductor device 1400 may include only the first input/output pad 1205 disposed on an upper portion of the first substrate 1290, or only the second input/output pad 1305 disposed on an upper portion of the second substrate 1310. For another example, the semiconductor device 1400 may include all of the first input/output pad 1205 and the second input/output pad 1305.

On each of the outer pad bonding area PA and the bit-line bonding area BLBA that are included in each of the cell array structure CELL and the peripheral circuit structure PERI, a metal pattern at an uppermost metal layer may be present as a dummy pattern, or the uppermost metal layer may be absent.

The semiconductor device 1400 may be configured such that, on the outer pad bonding area PA, a lower metal pattern 1273a may be formed to correspond to an upper metal pattern 1372a formed at an uppermost metal layer of the cell array structures CELL, and that the lower metal pattern 1273a may have the same shape as that of the upper metal pattern 1372a. The lower metal pattern 1273a formed at the uppermost metal layer of the peripheral circuit structure PERI may not be connected to a separate contact on the peripheral circuit structure PERI. Similarly, on the outer pad bonding area PA, an upper metal pattern 1372a may be formed at an upper metal layer of the cell array structure CELL, which upper metal pattern 1372a may correspond to and have the same shape as that of the lower metal pattern 1273a formed at an uppermost metal layer of the peripheral circuit structure PERI.

A lower bonding metal 1271b and 1272b may be formed on the second metal layer 1240b of the word-line bonding area WLBA. On the word-line bonding area WLBA, the lower bonding metal 1271b and 1272b of the peripheral circuit structure PERI may be bonded to and electrically connected to the upper bonding metal 1371b and 1372b of the cell array structure CELL.

Moreover, on the bit-line bonding area BLBA, an upper metal pattern 1392 may be formed at an uppermost metal layer of the cell array structure CELL, which upper metal pattern 1392 may correspond to and have the same shape as that of a lower metal pattern 1252 formed at an uppermost metal layer of the peripheral circuit structure PERI. No contact may be formed on the upper metal pattern 1392 formed at the uppermost metal layer of the cell array structure CELL.

According to some embodiments of inventive concepts, selection gate electrodes may control all of upper vertical structures, and thus it may be possible to omit vertical structures used as dummy channels. As a result, a semiconductor device may increase in integration.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Although inventive concepts have been described in connection with some embodiments of inventive concepts illustrated in the accompanying drawings, it will be understood to those skilled in the art that various changes and modifications may be made without departing from the technical spirit and essential feature of inventive concepts. It will be apparent to those skilled in the art that various substitution, modifications, and changes may be thereto without departing from the scope and spirit of inventive concepts.

What is claimed is:

1. A semiconductor device, comprising:

a stack structure extending in a first direction and including a plurality of gate electrodes vertically stacked on a substrate;

a plurality of selection structures disposed on the stack structure and horizontally spaced apart from each other in a second direction that intersects the first direction;

an upper isolation structure extending in the first direction on the stack structure between the plurality of selection structures; and a plurality of vertical structures penetrating the stack structure and the plurality of selection structures, wherein the plurality of vertical structures include a plurality of first vertical structures penetrating portions of the upper isolation structure and arranged along the first direction, wherein each of the plurality of selection structures includes a selection gate electrode and a horizontal dielectric pattern, wherein, in each of the plurality of selection structures, the horizontal dielectric pattern surrounds a top surface of the selection gate electrode, a bottom surface of the selection gate electrode, and a sidewall surface of the selection gate electrode, the selection gate electrode includes a line part and an electrode part, the line part extends in the first direction, the electrode part that vertically protrudes from the line part and surrounds at least a portion of each of the plurality of first vertical structures, and wherein the first direction and the second direction are parallel to a top surface of the substrate.

2. The semiconductor device of claim 1, wherein each of the plurality of vertical structures includes a lower vertical structure and an upper vertical structure, the lower vertical structure penetrates the plurality of gate electrodes, and the upper vertical structure penetrates the selection gate electrode of a corresponding selection structure among the plurality of selection structures, wherein, in each of the plurality of vertical structures, the lower vertical structure includes a lower channel pattern, a data storage layer surrounding the lower channel pattern, and a lower conductive pad on the lower channel pattern, and wherein, in each of the plurality of vertical structures, the upper vertical structure includes an upper channel pattern connected to the lower conductive pad, a selection gate dielectric pattern surrounding the upper channel pattern, and an upper conductive pad on the upper channel pattern.

3. The semiconductor device of claim 2, wherein the horizontal dielectric pattern includes a first sidewall part and a second sidewall part, the first sidewall part is between the electrode part of the corresponding selection structure and the upper vertical structure, and the second sidewall part is connected to the first sidewall part, and the second sidewall part is between the upper isolation structure and the selection gate electrode of the corresponding selection structure.

4. The semiconductor device of claim 3, wherein the first sidewall part of the horizontal dielectric pattern is between the selection gate dielectric pattern of the upper vertical structure and the electrode part of the selection gate electrode of the corresponding selection structure.

5. The semiconductor device of claim 2, wherein the horizontal dielectric pattern is between the upper isolation structure and the electrode part of the selection gate electrode of the corresponding selection structure, and the horizontal dielectric pattern is between the upper isolation structure and the line part of the selection gate electrode of the corresponding selection structure.

6. The semiconductor device of claim 2, wherein in the corresponding selection structure, a bottom surface of the electrode part of the selection gate electrode is vertically spaced apart from a top surface of the lower vertical structure of a corresponding one of the vertical structures.

7. The semiconductor device of claim 2, wherein the selection gate dielectric pattern is a single layer.

8. The semiconductor device of claim 1, wherein in a corresponding selection structure among the plurality of selection structures, the electrode part of the selection gate electrode includes a first part and a second part, the first part is connected to the line part, and the second part is in contact with the upper isolation structure.

9. The semiconductor device of claim 1, wherein, in a corresponding selection structure among the plurality of selection structures, the line part of the selection gate electrode surrounds a portion of a corresponding one of the plurality of first vertical structures.

10. The semiconductor device of claim 1, wherein in a corresponding selection structure among the plurality of selection structures, the electrode part completely surrounds a corresponding one of the plurality of first vertical structures.

11. The semiconductor device of claim 1, wherein the plurality of vertical structures further include a plurality of second vertical structures spaced apart from the upper isolation structure, and in a corresponding selection structure among the plurality of selection structures, the selection gate electrode further includes a subsidiary electrode part that vertically protrudes from the line part and completely surrounds a corresponding one of the plurality of second vertical structures.

12. The semiconductor device of claim 1, wherein the plurality of vertical structures further include a plurality of second vertical structures spaced apart from the upper isolation structure, and in a corresponding selection structure among the plurality of selection structures, the line part of each of the selection gate electrode completely surrounds a corresponding one of the plurality of second vertical structures.

13. The semiconductor device of claim 1, wherein in a corresponding selection structure among the plurality of selection structures, an uppermost surface of the electrode part of the selection gate electrode is at a level lower than a level of an uppermost surface of the upper isolation structure.

14. The semiconductor device of claim 1, wherein in a corresponding selection structure among the plurality of selection structures, the line part of the selection gate electrode includes a first line part and a second line part vertically spaced apart from each other, and the electrode part of the selection gate electrode connects the first line part and the second line part to each other.

15. The semiconductor device of claim 1, wherein in a corresponding selection structure among the plurality of selection structures, a top surface of the electrode part is at a level higher than a level of a top surface of the line part, and a bottom surface of the electrode part is at a level lower than a level of a bottom surface of the line part.

16. The semiconductor device of claim 1, wherein the selection gate electrode in each of the plurality of selection structures provide a plurality of selection gate electrodes, and the plurality of selection gate electrode are formed of a same metallic material as the plurality of gate electrodes of the stack structure.

17. The semiconductor device of claim 1, wherein in a corresponding selection structure among the plurality of selection structures, the selection gate electrode includes a first selection gate electrode and a second selection gate electrode spaced apart from each other across the upper isolation structure, and a line part of the first selection gate electrode faces an electrode part of the second selection gate electrode.

18. The semiconductor device of claim 1, wherein the plurality of vertical structures are in a first column, a second column, a third column, and a fourth column arranged along a second direction that intersects the first direction, the plurality of vertical structures in the first column, the second column, the third column, and the fourth column penetrate a corresponding selection structure among the plurality of selection structures, and among the plurality of vertical structures, the plurality of first vertical structures are in the first column and adjacent to the upper isolation structure.

19. A semiconductor device, comprising:

a peripheral circuit structure including a plurality of peripheral circuits integrated on a semiconductor substrate;

a semiconductor layer on the peripheral circuit structure;

a stack structure extending in a first direction and including a plurality of gate electrodes vertically stacked on the semiconductor layer;

a plurality of lower vertical structures penetrating the stack structure;

a plurality of selection structures disposed on the stack structure and horizontally spaced apart from each other in a second direction that intersects the first direction;

an upper isolation structure extending in the first direction on the stack structure between the plurality of selection structures; and a plurality of upper vertical structures penetrating the plurality of selection structures and connecting with the plurality of lower vertical structures, wherein the plurality of upper vertical structures include a plurality of first upper vertical structures that penetrate portions of the upper isolation structure and are arranged along the first direction, wherein each of the plurality of selection structures includes a selection gate electrode and a horizontal dielectric pattern, wherein, in each of the plurality of selection structures, the horizontal dielectric pattern surrounds a top surface of the selection gate electrode, a bottom surface of the selection gate electrode, and sidewall surfaces of the selection gate electrode, the horizontal dielectric pattern includes a first sidewall part and a second sidewall part, the first sidewall part is between the upper isolation structure and an electrode part of the selection gate electrode, and the second sidewall part is between the upper isolation structure and a line part of the selection gate electrode, the line part extends in the first direction, the electrode part vertically protrudes from the line part and surrounds at least a portion of each of the plurality of first upper vertical structures, wherein the first direction and the second direction are parallel to a top surface of the semiconductor substrate.

20. An electronic system, comprising:

a semiconductor device that includes a cell array and an input/output pad electrically connected to a peripheral circuit around the cell array; and a controller electrically connected through the input/output pad to the semiconductor device, the controller configured to control the semiconductor device, wherein the cell array includes, a stack structure extending in a first direction and including a plurality of gate electrodes vertically stacked on a substrate, a plurality of selection structures disposed on the stack structure and horizontally spaced apart from each other in a second direction that intersects the first direction, an upper isolation structure extending in the first direction on the stack structure between the plurality of selection structures, and a plurality of vertical structures penetrating the stack structure and the plurality of selection structures, wherein the plurality of vertical structures include a plurality of first vertical structures penetrating portions of the upper isolation structure, wherein each of the plurality of selection structures includes a selection gate electrode and a horizontal dielectric pattern, and wherein, in each of the plurality of selection structures, the horizontal dielectric pattern surrounds a top surface, a bottom surface, and a sidewall surface of the selection gate electrode, the selection gate electrode includes a line part and an electrode part, the line part extends in the first direction, the electrode part vertically protrudes from the line part and surrounds at least a portion of each of the plurality of first vertical structures, wherein the first direction and the second direction are parallel to a top surface of the substrate.

* * * * *